US007185293B1

(12) United States Patent
Ofer

(10) Patent No.: US 7,185,293 B1
(45) Date of Patent: Feb. 27, 2007

(54) UNIVERSAL HARDWARE DEVICE AND METHOD AND TOOLS FOR USE THEREWITH

(75) Inventor: Meged Ofer, Netanya (IL)

(73) Assignee: Cellot, Inc., Wilmington, DE (US)

( * ) Notice: Subject to any disclaimer, the term of this patent is extended or adjusted under 35 U.S.C. 154(b) by 544 days.

(21) Appl. No.: 10/148,458

(22) PCT Filed: Nov. 28, 2000

(86) PCT No.: PCT/IL00/00797

§ 371 (c)(1),
(2), (4) Date: May 29, 2002

(87) PCT Pub. No.: WO01/39249

PCT Pub. Date: May 31, 2001

Related U.S. Application Data

(60) Provisional application No. 60/167,684, filed on Nov. 29, 1999.

(51) Int. Cl.
*G06F 17/50* (2006.01)
(52) U.S. Cl. .............................. 716/1; 716/16; 716/17
(58) Field of Classification Search .................... 716/1, 716/2, 7, 16, 17
See application file for complete search history.

(56) References Cited

U.S. PATENT DOCUMENTS

| 4,984,192 | A |   | 1/1991  | Flynn ......................... 711/104 |
|-----------|---|---|---------|-----------------------------------------|
| 5,359,536 | A | * | 10/1994 | Agrawal et al. ............... 716/16   |
| 5,457,410 | A | * | 10/1995 | Ting ............................. 326/41 |
| 5,477,475 | A |   | 12/1995 | Sample et al. ................ 716/17   |
| 5,526,278 | A |   | 6/1996  | Powell ......................... 716/16  |
| 5,543,640 | A |   | 8/1996  | Sutherland et al. ......... 257/203     |
| 5,621,650 | A | * | 4/1997  | Agrawal et al. ............... 716/16   |
| 5,778,439 | A |   | 7/1998  | Trimberger et al. ........ 711/117      |
| 5,815,715 | A |   | 9/1998  | Kucukcakar ................. 717/100    |
| 5,815,726 | A |   | 9/1998  | Cliff ............................. 712/1 |

(Continued)

FOREIGN PATENT DOCUMENTS

GB      2315 583 A      2/1998

(Continued)

OTHER PUBLICATIONS

Mahapatra, N.R., et al, *Hardware-Efficient and Highley-Reconfigurable 4- and 2-Track Fault-Tolerant Designs for Mesh-Connected Multicomputers*, Proceedings of the 26th International Symposium on Fault-Tolerant Computing. Sendai, JP., Jun. 25-27, 1996, Proceedings of the International Symposium on Fault-Tolerant Computing, Los Alamitos, IEEE Comp. Soc. Press, Us, vol. Conf. 26, Jun. 25, 1996, pp. 272-281, XP000679291, ISBN: 0-8186-7261-7.

(Continued)

*Primary Examiner*—Sun James Lin
(74) *Attorney, Agent, or Firm*—Knobbe, Martens, Olson & Bear, LLP

(57) ABSTRACT

A universal hardware device including at least one plurality of cells for storing data; and at least one programmable matrix coupled to the at least one plurality of cells, whereby a plurality of hardware applications may be implemented by selectively storing data in the cells and selectively programming the matrix to connect at least one of the cells to at least one of the cells.

54 Claims, 32 Drawing Sheets

U.S. PATENT DOCUMENTS

| | | | |
|---|---|---|---|
| 5,821,773 A | 10/1998 | Norman et al. | 326/16 |
| 5,894,228 A | 4/1999 | Reddy et al. | 326/41 |
| 5,909,450 A | 6/1999 | Wright | 714/724 |
| 5,911,059 A | 6/1999 | Profit, Jr. | 703/20 |
| 5,991,907 A | 11/1999 | Stroud et al. | 716/16 |
| 6,018,490 A | 1/2000 | Cliff et al. | 365/189.02 |
| 6,020,759 A | 2/2000 | Heile | 326/37 |
| 6,026,230 A | 2/2000 | Lin et al. | 703/13 |
| 6,028,809 A | 2/2000 | Schleicher et al. | 365/230.08 |
| 6,031,391 A | 2/2000 | Couts-Martin et al. | 326/40 |
| 6,034,536 A | 3/2000 | McClintock et al. | 326/38 |
| 6,058,452 A | 5/2000 | Rangasayee et al. | 365/49 |
| 6,058,492 A | 5/2000 | Sample et al. | 716/5 |
| 6,069,489 A | 5/2000 | Iwanczuk et al. | 326/38 |
| 6,078,736 A | 6/2000 | Guccione | 716/17 |
| 6,085,317 A | 7/2000 | Smith | 713/100 |
| 6,091,258 A | 7/2000 | McClintock et al. | 326/38 |
| 6,097,211 A | 8/2000 | Couts-Martin et al. | 326/46 |

FOREIGN PATENT DOCUMENTS

| | | |
|---|---|---|
| GB | 2321 989 A | 8/1998 |
| WO | WO 99/52049 | 10/1999 |

OTHER PUBLICATIONS http://www.ti.com/sc/docs/asic/cad/cad.htm.
http://www.versity.com/html/specbased.html.
http://www.wsdmag.com/library/penton/archives/wsd/January1998/261.html.
http://www.cstp.umkc.edu/personal/cjweber/spiral.html.
U. Tietze, CH. Schenk, "Halbleiter-Schaltungstechnik", 5$^{th}$ edition, Springer-Verlag Berlin, Heidelberg, New York, 1980, pp. 491, 492.
International Preliminary Examination Report for corresponding PCT Application No. PCT/IL00/00797.

\* cited by examiner

UNIVERSAL HARDWARE DEVICE AND METHOD AND TOOLS FOR USE THEREWITH

RELATED APPLICATIONS

This application claims the benefit of the U.S. provisional application No. 60/167,684 filed Nov. 29, 1999 and the international application PCT/IL00/00797 filed Nov. 28, 2000.

FIELD OF THE INVENTION

This invention relates to circuit design and testing and device architecture.

BACKGROUND OF THE INVENTION

Known design and manufacturing processes of integrated circuits (ICs) and modules containing ICs including implementation using DSPs or Application Specific Integrated Circuits (ASIC) require lengthy development cycles and are expensive. In particular, the time required to market integrated circuits is long owing to the length of the development period requiring protracted design, verification and testing of the application. During verification and testing of the product, failures in the design may be detected requiring debugging and repair, this greatly adds to the development cost and time, particularly when design failures are detected at the end of the process, for example after product delivery.

Hardware products are expensive since the time to market influences engineering costs, market loss, and so on. Costs must also bear the overhead of testing equipment used during development, the expense of testing equipment used during manufacturing, inventory size and the costs relating to employment of professional engineers.

Simulation accuracy is poor. One simulation is required to simulate the desired functionality of the application, while another is required to simulate the run-time operation of the implementation. If simulation of high-resolution delays is required, simulation becomes cumbersome. Moreover, simulations are very slow, often hundreds of thousands times slower than real-time.

Yet another drawback of known design and development processes is that the size of prototypes and non-ASIC electronic cards may exceed practical dimensions. The ability to test high-end System on a Chip products is limited owing to the very high density of integrated circuits, making it very difficult to probe points of interest in the circuit. It is likewise difficult to test finished products containing high-density integrated circuits, and to verify the complete functionality of complex circuits.

The adaptation of already designed products to advanced chip production technologies so as to ensure the compatibility of applications to newer technologies, is poor. This impacts not only on the application developer but also makes it difficult for the chip manufacturer to employ new geometries whilst enabling developers to use their existing applications.

ASICs are used to implement an application using a smaller area, where the application will be sold in sufficient quantity to justify customization. Typically, the application is first developed using conventional design methods and, after establishing the integrity of the design, it is converted to an ASIC. This is a time-consuming and expensive process.

Typically, application speed is enhanced by implementing the application in hardware at then expense of functional flexibility since most hardware implementations are dedicated to a specific application and are not amenable to extension or changes.

Yet another drawback associated with the industry is the relative scarcity of qualified personnel and the difficulty in breaking down the design and development so as to be amenable to sharing amongst several engineers in order that the development cycle may be reduced.

All these limitations combine to increase both the length and the cost of the development and manufacturing cycle. In order to demonstrate the complexity and effort associated with conventional design and manufacturing processes for implementing logic integrated circuits or modules including them, various implementation methods will now be described.

FIG. 1 is a flow diagram showing the conventional process for hardware implementation of Integrated Circuit (IC) chips on electronic cards. During the card development process 7 a card is developed for performing a needed application. After this process, the card is ready for the production activities. The idea and concept relating to the application are defined during the application definition 10, after which there follows the interface definition 12. Sometimes the interface is determined by the system environment; for example in a PC application card. Sometimes the firm that made the card can choose the interface; for example in a rack full of cards, most of the cards will have the same interface. Sometimes the interface is unique and has to be designed in the same process as the rest of the card.

Technology selection 16 is influenced by real-time needs, flexibility, size and the number of tasks. Hardware implementation is selected for an application owing to its superior real-time performance. Hardware implementation is the fastest (real-time) solution, but it can do only a limited number of tasks, is not flexible and is large. Time to market is lengthy. The process from development to manufacturing may take months to more than a year, nine months being considered a very good result. The development and manufacturing processes are expensive.

The space available for the application is an important parameter for the technology selection process. Normally, the smaller the better. If size is critical, the card can be converted into an ASIC in which case the development period is extended by several months owing to the need for ASIC conversion. Nine months is a normal extension time. In practice, ASIC conversion suffers from all the problems mentioned above.

In most cases, particularly for complex high speed, digital hardware design, simulation 18 of the application is required. Sometimes the simulation is considered part of the application definition process, and is not counted as part of the hardware development process time. The simulation process period may last from days to a few months, depending on the complexity of the application. The purpose of the simulation is to verify that the idea and the implementation considered are feasible. For example: if there is an idea to compress voice over communication links, the compression algorithm will be made using a high level language such as "C++" and other software tools such as "Matlab" (of Mathworks, Natick, Mass.). There is no simple association between the simulation and the implementation. Sometimes, more than one simulation is made and workstations may be needed to increase the simulation speed.

The interface must then be designed 20. If the interface is standard, for example a PCI interface in a PC card, in most cases there is no need to redesign it and an "off the shelf" ready-made chip set may be used in the implementation. If the interface is proprietary, the hardware developer might prefer to separate the development of the interface from the development of the application so as to be able to use the interface for other applications as well, such as the interface for a few cards in the same rack. In such a case, the time to market would not be influenced by the time needed to develop and implement the interface. Only when the interface is unique, does it become part of overall implementation development.

Electronic design 22 is the procedure that converts the solution into a set of electronic Integrated Circuit devices. The developer keeps in mind a library of such devices, which can perform certain functions and chooses the needed ICs to be connected together in order to implement the application. The electronic design process is complicated, as the engineer has to remember a lot of different components and the way to use them. As the technology improves, new components with complicated functions are added. Sometimes the electronics engineer is left behind. High-Level Design languages have been implemented, but still most of the designing has to be done in modular fashion. The more complicated the application, the more time is needed for the design.

Drawings are the interface between the application engineer and the computerized tools used to manufacture the card. This is the "language" the engineer uses to "write" his implementation ideas. The drawing process 24 converts the design into schematic drawings. The more complicated the application, the more time is needed for the drawings. If a programmable device is used, High-level Design Language (HDL) may be used to replace part of drawings.

When implementation is not trivial, simulation 25 of the design is done and timing is checked. The designer tries to correlate between the result of the application simulation 18 and the current simulation. If any mistake is found, the design is modified, requiring steps 22 and 24 to be repeated.

After the design has been finished, the components 26 are obtained. It sometimes takes quite a long time to purchase a specific device, thereby delaying prototype production. The more complex the application, the more components are used, the longer is the time to production and the bigger is the inventory of components.

Layout 28 is the process that converts the drawn design into a manufactured package. The more complex the application, the more components are used and the longer the layout time.

The board is manufactured 30. For each application a different board must be manufactured thus increasing the amount of human resources invested and the need for expensive equipment for card verification and manufacture.

The components are installed on to the manufactured card. Faults in the layout can cause problems in the installation. For example, the tools for installing the prototypes are normally different from those used for manufacturing. Specifically, installation in the development phase uses less automation and the probability of a faulty card is greater. To shorten the installation period, special purpose, expensive equipment is used, for example high pitch chip insertion equipment.

Test and debug 34 are the longest periods in the overall development process. Fifty to seventy-five percent of the time spent on a complex design goes into verification. Verification is quickly becoming the biggest technology barrier.

Errors can be made in each one of the above tasks. For example, narrow spacing between tracks of a printed circuit can cause a short circuit. It is worse if this kind of mistake is not discovered in the debugging process, because it may be found later when it is more expensive to repair. Errors can be made also in card definition, and so on. That means repetitive processes occur. It is normal to have three versions of the prototype before the first batch of production. Expensive test equipment is needed to test the electronic card, for example: signal generators, noise generators logic analyzers, scopes, dB meters, adders, line simulators and others.

In the R&D to production process 36, the documentation with all the details needed to manufacture the card is created. Although this process can start before the last version of the prototype is ready, the process extends the time to market. Automatic tools for card verification (such as bed of nails), and function verification are created. Automatic component insertion machinery is programmed, and so on.

The above process causes the development and manufacturing cycle to be long. The later an error is found the harder and the more expensive is the repair. Therefore, if an ASIC is needed, considerable effort is made to assure error-free results. It is normal to manufacture a few batches before converting the electronics into an ASIC.

Once the card documentation is ready, all the components have been procured, chip insertion machines have been programmed, and so on, the card production process 37 can commence. There then follows production card verification 38 wherein the card is tested with or without its electronics. Function verification 40 is the process of testing the card for the designed application. It is quite complicated and time consuming to create automatic equipment for testing each function of the application. When the result is satisfactory, the card delivery 42 to the client may be performed.

If an error is found or an enhancement is needed at the end of the process, repairs and enhancements 44 are very difficult, expensive and time consuming. In the worst case, most of the process has to be repeated.

As mentioned above, real-time needs, flexibility, size and number of tasks influence the choice of technology. A circuit may be implemented as a Digital Signal Processor when flexibility is needed and/or a large number of tasks are to be performed, but not at the same time. This solution is slower in real-time than an equivalent hardware implementation. The DSP implementation is about the same size as the hardware implementation, but generally DSP implementations do not allow the option of conversion into ASIC.

Although the above-described hardware development process must also be implemented for the DSP card, it rarely influences the time to market period for several reasons. First, the hardware implementation is simple, as the DSP vendors propose solutions for the hardware design. Only a non-standard interface needs to be designed. Second, once a card is ready and the interface is fixed, a ready-made card can be used for the new application. Normally the process of developing the programming code takes more time than the process of developing the DSP card. Nevertheless, the card has to be developed at least once. Different problems than those relating to hardware implementation must also be addressed, such as which kind of DSP to choose, whether the DSP is going to satisfy the needs of next-generation applications and so on.

As the industry adheres to Gordon Moore's Law, doubling the number of transistors in a die every 18 months by shrinking the feature size (transistors and interconnects), products are becoming obsolete with each new semiconductor generation. Therefore new DSP/CPU development is needed frequently. Very commonly vendors do their best to enable software compatibility, but in practice conversion time is needed. This conversion process influences the cost as well as the time to market.

DSP implementation has advantages over hardware implementation in the simulation stage as both the simulation and the implementation can be written in a high level language such as "C". In practice, there is no efficient means of conversion from the simulation to the DSP code. In other words, the simulation does not simulate the exact implementation, especially if assembly language is used in the DSP coding. Also, the cost of R&D is high. The cost calculation has to consider the development of the card and the development of the software. The market is short of DSP experts so the wages expense is high.

In production, automatic function verification is still hard to implement, but if an error or enhancement is discovered after delivery, it still can be fixed by changing the software at the customer's premises, although in practice this is far from trivial. The easy part is loading the revised code into the implementation.

Sometimes a combined implementation is preferred. For example, if a filter is needed in a DSP implementation, the filter may be implemented in hardware and the rest of the application will be implemented in the DSP. The advantages and disadvantages of each part remain.

Programmable Logic Devices (PLDs) allow for flexible implementation but are limited in the application capability for a given chip area. A simulation language has been converted into a High-level Design Language (HDL/VHDL) to enable the designer create implementations. Nevertheless, these software languages enable the user to create the hardware in modular form: so they are far behind languages like C++. Simulation is not accurate, debugging is complicated and the product is expensive. When size is critical, it is most common to implement the application using a few high-end PLDs as a "fast prototype" and then to convert the application into ASIC. In this case, it is common to have a few iterations for the ASIC development, which increases price and time to market.

The ASIC development process is described, for example, by Texas Instruments Incorporated, (Dallas, Tex. USA, 75380-9066) whose WEB address: is http://www.ti.com/sc/docs/asic/cad/cad.htm.

Reference is also made to http://www.verisity.com/html/spechased.html belonging to Verisity Design, Inc. Mountain View, Calif. USA. Likewise, further information relating to Electronic Design Automation may be found by reference to http://www.wsdmag.com/library/penton/archives/wsd/January1998/261.htm which acknowledges that electronic-design-automation (EDA) technology has lagged behind the rate of progress of semiconductor fabrication.

Some of the drawbacks associated with the design, manufacturing and verification process have been addressed in the patent literature. U.S. Pat. No. 5,815,726 (Cliff; Richard G.) entitled "Coarse-grained look-up table architecture" published Sep. 29, 1998 and assigned to Altera Corporation discloses a programmable logic device architecture. For interconnecting signals to and from the logic array blocks, the global interconnection resources include switch boxes, long lines, double lines, single lines, and half- and partially populated multiplexer regions. The logic array block includes two levels of function blocks. In a first level, there are eight four-input function blocks. In a second level, there are two four-input function blocks and four secondary two-input function blocks. In one embodiment, these function blocks are implemented using look-up tables (LUTs). The logic array block has combinatorial and registered outputs and also contains storage blocks for implementing sequential or registered logic functions. The logic array block has a carry chain for implementing logic functions requiring carry bits and may also be configured to implement a random access memory.

U.S. Pat. No. 5,909,450 (Wright; Adam) entitled "Tool to reconfigure pin connections between a DUT and a tester" published Jun. 1, 1999 and assigned to Altera Corporation discloses a method of simulating the testing of integrated circuits is provided. A database of desired connections between a tester unit and a device under test (DUT) for different downbonds is accessed by a multiplexer which sets up the desired connections. The system automatically makes the correct connection for each downbond without manual intervention from the user as was required in traditional simulator systems.

U.S. Pat. No. 5,821,773 (Norman; Kevin A. et al.) entitled "Look-up table based logic element with complete permutability of the inputs to the secondary signals" published Oct. 13, 1998 and assigned to Altera Corporation discloses a logic element for a programmable logic device. The logic element includes a look-up table for implementing logical functions, a programmable delay block, a storage block configurable as a latch or a flip-flop, and a diagnostic shadow latch. A plurality of inputs to the logic element and complements of these inputs are available to control the secondary functions of the storage block.

U.S. Pat. No. 6,018,490 (Cliff; Richard G. et al.) entitled "Programmable logic array integrated circuits" published Jan. 25, 2000 and assigned to Altera Corporation discloses programmable logic array integrated circuit having a number of programmable logic modules which are grouped together in a plurality of logic array blocks. The logic array blocks are arranged on the circuit in a two dimensional array. A conductor network is provided for interconnecting any logic module with any other logic module. In addition, adjacent or nearby logic modules are connectable to one another for such special purposes as providing a carry chain between logic modules and/or for connecting two or more modules together to provide more complex logic functions without having to make use of the general interconnection network. Another network of so-called fast or universal conductors is provided for distributing widely used logic signals such as clock and clear signals throughout the circuit. Multiplexers can be used in various ways to reduce the number of programmable interconnections required between signal conductors.

U.S. Pat. No. 6,058,492 (Sample; Stephen P. et al.) entitled "Method and apparatus for design verification using emulation and simulation" published May 2, 2000 and assigned to Quickturn Design Systems, Inc. discloses a method and apparatus for combining emulation and simulation of a logic design. The method and apparatus can be used with a logic design that includes gate-level descriptions, behavioral representations, structural representations, or a combination thereof. The emulation and simulation portions are combined in a manner that minimizes the time for transferring data between the two portions. Simulation is performed by one or more microprocessors while emulation is performed in reconfigurable hardware such as field programmable gate arrays. When multiple microprocessors are employed, independent portions of the logic design are selected to be executed on the multiple synchronized microprocessors. Reconfigurable hardware also performs event detecting and scheduling operations to aid the simulation, and to reduce processing time.

U.S. Pat. No. 5,815,715 (Ku.cedilla.uk et al.) entitled "Method for designing a product having hardware and software components and product therefor" published Sep. 29, 1998 and assigned to Motorola, Inc. discloses a computing system and a method for designing the computing system using hardware and software components. The computing system includes programmable coprocessors having the same architectural style. Each coprocessor includes a sequencer and a programmable interconnect network and a varying number of functional units and storage elements. The computing system is designed by using a compiler to generate a host microprocessor code from a portion of an application software code and a coprocessor code from the portion of the application software code. The compiler uses the host microprocessor code to determine the execution speed of the host microprocessor and the coprocessor code to determine the execution speed of the coprocessor and selects one of the host microprocessor or the coprocessor for execution of the portion of the application software code. Then the compiler creates a code that serves as the software program.

U.S. Pat. No. 6,058,452 (Rangasayee; Krishna) entitled "Memory cells configurable as CAM or RAM in programmable logic devices" published May 2, 2000 and assigned to Altera Corporation discloses a programmable logic device having content addressable memory. The programmable logic device may include reconfigurable dual mode memory suitable for operating as a content addressable memory in a first mode and a random access memory in a second mode. Mode control switch circuitry may be provided to selectively enable a user to configure the dual mode memory as either content addressable memory or random access memory.

U.S. Pat. No. 6,078,736 (Guccione; Steven A.) entitled "Method of designing FPGAs for dynamically reconfigurable computing" published Jun. 20, 2000 and assigned to Xilinx, Inc. discloses a method of designing FPGAs for reconfigurable computing comprising a software environment for reconfigurable coprocessor applications. This environment comprises a standard high-level language compiler (i.e. Java) and a set of libraries. The FPGA is configured directly from a host processor, configuration, reconfiguration and host run-time operation being supported in a single piece of code. Design compile times on the order of seconds and built-in support for parameterized cells are significant features of the inventive method.

U.S. Pat. Nos. 6,031,391 and 6,097,211 (Couts-Martin; Chris et al.) both entitled "Configuration memory integrated circuit" published Feb. 29, 2000 and Aug. 1, 2000 respectively and assigned to Altera Corporation disclose a configuration memory for storing information that is in-system programmable. The programming of the configuration memory may be performed using JTAG (IEEE Standard 1149.1) instructions. Furthermore, the configuration of a programmable logic device using the configuration data in the configuration memory may be initiated with a JTAG instruction. Pull-up resistors are incorporated within the configuration memory package.

U.S. Pat. No. 5,894,228 (Reddy; Srinivas et al.) entitled "Tristate structures for programmable logic devices" published Apr. 13, 1999 and assigned to Altera Corporation discloses a programmable logic device architecture including tristate structures. The programmable logic device architecture provides tristate structures which may be logically or programmably controlled, or both. Through these tristate structures, the logic elements may be coupled to the programmable interconnect, where they may be coupled with other logic elements of the programmable logic device. Using these tristate structures, the signal pathways of the architecture may be dynamically reconfigured.

U.S. Pat. No. 6,026,230 (Lin; Sharon Sheau-Pyng et al.) entitled "Memory simulation system and method" published Feb. 15, 2000 and assigned to Axis Systems, Inc. discloses a system having four modes of operation: (1) Software Simulation, (2) Simulation via Hardware Acceleration, (3) In-Circuit Emulation (ICE), and (4) Post-Simulation Analysis. At a high level, the system may be embodied in each of the above four modes or various combinations of these modes. At the core of these modes is a software kernel that controls the overall operation of this system. The main control loop of the kernel executes the following steps: initialize system, evaluate active test-bench processes/components, evaluate clock components, detect clock edge, update registers and memories, propagate combinational components, advance simulation time, and continue the loop as long as active test-bench processes are present. The Memory Mapping aspect of the invention provides a structure and scheme where the numerous memory blocks associated with the user's design is mapped into the SRAM memory devices in the Simulation system instead of inside the logic devices, which are used to configure and model the user's design. The Memory Mapping or Memory Simulation system includes a memory state machine, an evaluation state machine, and their associated logic to control and interface with: (1) the main computing system and its associated memory system, (2) the SRAM memory devices coupled to the FPGA buses in the Simulation system, and (3) the FPGA logic devices which contain the configured and programmed user design that is being debugged.

U.S. Pat. No. 6,020,759 (Heile; Francis B.) entitled "Programmable logic array device with random access memory configurable as product terms" published Feb. 1, 2000 and assigned to Altera Corporation discloses a look-up-table-based programmable logic device is provided with memory circuitry which can be operated either as random access memory ("RAM") or to perform product term ("p-term") logic. Each individual row of the memory is separately addressable for writing data to the memory or, in RAM mode, for reading data from the memory. Alternatively, multiple rows of the memory are addressable in parallel to read p-terms from the memory. The memory circuitry of the invention is particularly useful as an addition to look-up-table-type programmable logic devices because the p-term capability of the memory circuitry provides an efficient way to perform wide fan-in logic functions which would otherwise require trees of multiple look-up tables.

U.S. Pat. No. 6,028,809 (Schleicher; James.) entitled "Programmable logic device incorporating a tri-stateable logic array block" published Feb. 22, 2000 and assigned to Altera Corporation discloses a programmable logic that incorporates a multi-function block having a plurality of integrally connected function units where at least one of the function units within the multi-function block is a tristate logic unit. The programmable logic device also includes a tristate bus operatively connected to the tristate logic unit that can supply tristate logic signals to the tristate bus as well as receive tristate logic signals from the tristate bus. The tristate bus carries tristate data signals and address select signals that operate to select a desired one of the tristate logic units within the programmable logic device.

U.S. Pat. No. 6,085,317 (Smith; Stephen J.) entitled "Reconfigurable computer architecture using programmable logic devices" published Jul. 4, 2000 and assigned to Altera Corporation discloses a method and system for computing using reconfigurable computer architecture utilizing logic devices. The computing may be accomplished by configuring a first programmable logic unit as a system controller. The system controller directs the implementation of an algorithm in a second one of the programmable logic units concurrently with reconfiguring a third one of the programmable logic units. In another aspect, the computing system may include a pair of independent, bi-directional busses each of which is arranged to electrically interconnect the system controller and the plurality of programmable logic devices. With this arrangement, a first bus may be used to reconfigure a selected one of the programmable logic devices as directed by the system controller while the second bus is used by an operational one of the programmable logic devices.

U.S. Pat. Nos. 6,034,536 and 6,091,258 (McClintock; Cameron et al.) both entitled "Redundancy circuitry for logic circuits" published Mar. 7, 2000 and Jul. 18, 2000 respectively and assigned to Altera Corporation disclose redundant circuitry for a logic circuit such as a programmable logic device. The redundant circuitry allows the logic circuit to be repaired by replacing a defective logic area on the circuit with a redundant logic circuit. Rows and columns of logic areas may be logically remapped by row and column swapping. The logic circuit contains dynamic control circuitry for directing programming data to various logic areas on the circuit in an order defined by redundancy configuration data. Redundancy may be implemented using either fully or partially redundant logic areas. Logic areas may be swapped to re-map a partially redundant logic area on to a logic area containing a defect. The defect may then be repaired using row or column swapping or shifting. A logic circuit containing folded rows of logic areas may be repaired by replacing a defective half-row with a redundant half-row.

U.S. Pat. No. 6,069,489 (Iwanczuk; Roman et al.) entitled "FPGA having fast configuration memory data readback" published May 30, 2000 and assigned to Xilinx, Inc. discloses An FPGA configuration memory is divided into columnar frames each having a unique address. Configuration data is loaded into a configuration register, which transfers configuration data frame by frame in parallel. In a preferred embodiment, an input register, a shadow input register and a multiplexer array permit efficient configuration data transfer using a larger number of input bits than conventional FPGAs. A flexible external interface enables connection with bus sizes varying from a predetermined maximum width down to a selected fraction thereof. Configuration data transfer is made more efficient by using shadow registers to drive such data into memory cells on a frame-by-frame basis with a minimum of delay, and by employing a multiplexer array to exploit a wider configuration data transfer bus. The speed of configuration readback is made substantially equal to the rate of configuration data input by employing configuration register logic that supports bidirectional data transfer. Using the proposed FPGA configuration memory, a bit stream designed for an old device can be used for a new device having additional configuration memory cells.

U.S. Pat. No. 5,477,475 (Sample; Stephen P.) entitled "Method for emulating a circuit design using an electrically reconfigurable hardware emulation apparatus" published Dec. 19, 1995 and assigned to Quickturn Design Systems, Inc. discloses a system for physical emulation of electronic circuits or systems including a data entry workstation where a user may input data representing the circuit or system configuration. This data is converted to a form suitable for programming an array of programmable gate elements provided with a richly interconnected architecture. Provision is made for externally connecting VLSI devices or other portions of a user's circuit or system. A network of internal probing interconnections is made available by utilization of unused circuit paths in the programmable gate arrays.

SUMMARY OF THE INVENTION

It is an object of the invention to provide an improved device architecture particularly suited for the design of digital circuits that allows high flexibility and reduces the time from design to finished product.

To this end, there is provided in accordance with a broad aspect of the invention a universal hardware device consisting essentially of:

at least one plurality of cells for storing data; and at least one programmable matrix coupled to said at least one plurality of cells, whereby a plurality of hardware applications may be implemented by selectively storing data in said cells and selectively programming said matrix to connect at least one of said cells to at least one of said cells.

Such device architecture allows cells to be combined so as to form larger cells, which can themselves be combined to form larger cells, this process being repeated as required; and to configure the combined cell as a hardware application by downloading data to the constituent cells. Preferably, the cells are configurable as Look-Up Tables having addressable memory locations, in which the stored data defines a function implemented by the Look-Up Table. The function can itself be programmed using a high level programming language and may be formatted together with code for implementing a desired connectivity of the cells. The formatted data is then downloaded to the cells in the device. Once downloaded, the device carries out the pre-programmed functionality in a manner that is no longer dependent on the high-level program code used to implement the desired function. As a result, operation of the device is independent of the efficiency of the high-level program code. Identical code may be used to simulate the device thus greatly facilitating design and simulation of the device and greatly reducing the time from design to marketing.

The invention also provides tools for designing, simulating and debugging the hardware device. These tools can also assist in converting all or part of the device to an ASIC after establishing that the finished device operates as required, although the value of such conversion diminishes as the life expectancy of the product falls.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

Figure 2:
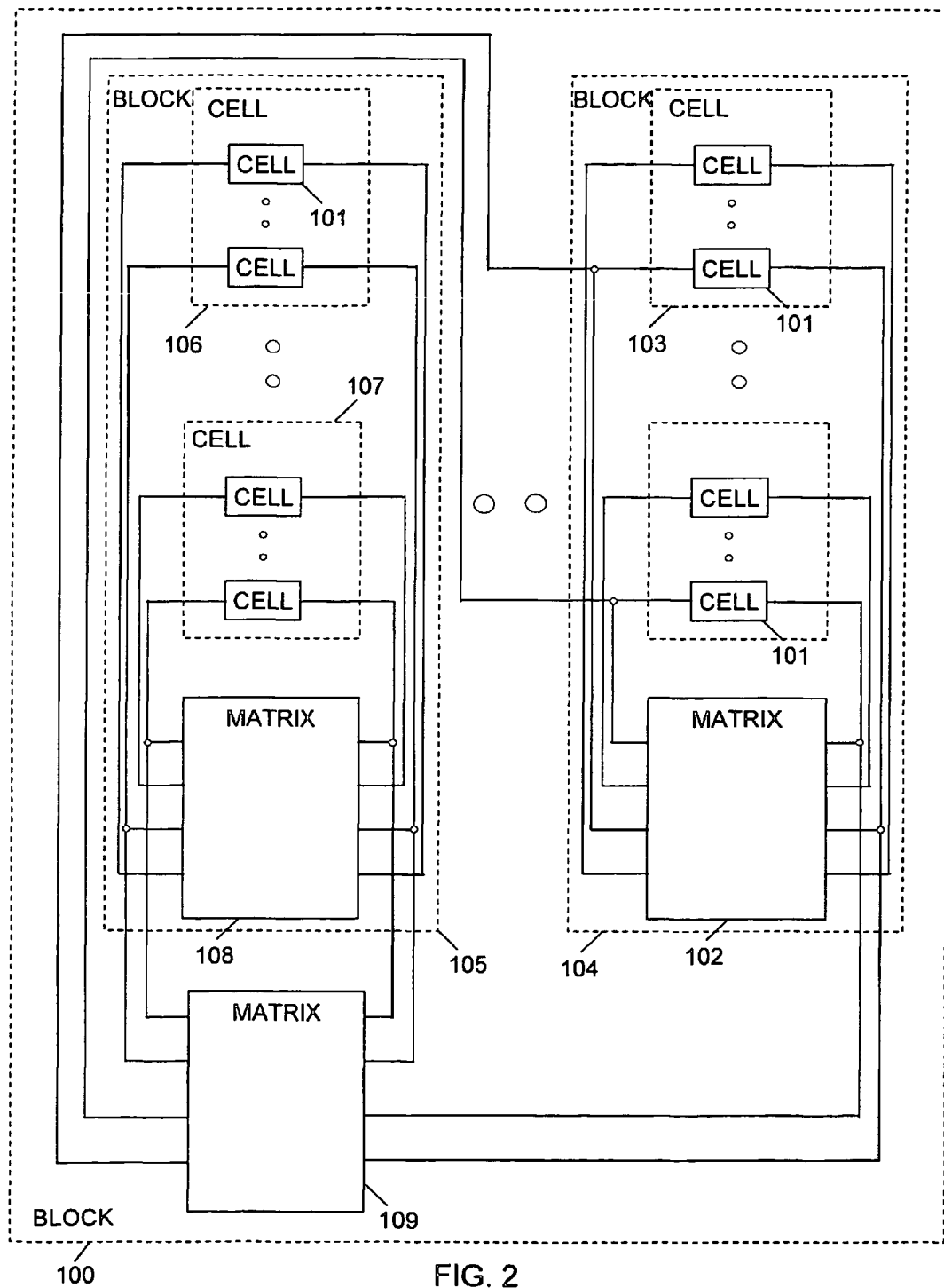
FIG. 2 shows schematically the device architecture according to the invention.

FIG. 2 shows schematically the basic architecture of a device 100 according to the invention. The device architecture is a collection of cells 101 interconnected via at least one programmable matrix 102. A cell 103 may be built out of smaller cells 101. Likewise, each of the cells 101 or 103 together with the associated matrix 102 may form part of a block such as 104 and 105. Any block has the same architecture as the whole device 100. Any block can be configured as a single cell. Although any connection can be made between the output of one block and the input of the same or another block, a particular interconnection between the internal cells of two blocks may not always be possible. This allows a block to be associated with a "level" being the number of blocks containing the block. Thus, for example, a block of level 0 is the device itself; blocks of level 1 form the device; and blocks of level 2 forms blocks of level 1. In saying this, it should be noted that FIG. 2 is schematic and whether the programmable matrix 102 is shown within or outside the boundary of the block is immaterial, since in either case all cells within a block must be connected to at least one programmable matrix. The connections of a cell that is internal to a block and enable connection to outside the block, are defined as the port of the block.

It is further to be noted that a block could form a cell or few cells. Likewise, the device 100 is itself a block containing multiple cells interconnected by a programmable matrix and any block thus has a similar architecture of the device 100 and may indeed be regarded as a device. The device 100 thus contains multiple like devices and may be regarded as a cell formed of multiple like cells.

The name "block" allows distinction to be made between the complete device 100 and a component thereof having similar architecture: even though this distinction pertains only to the description for ease of clarity. So far as the claims are concerned, no distinction is made between the complete device and any component thereof having similar architecture. Indeed, an essential feature of the invention resides in the fact that the architecture of a component of the device may be similar to the architecture of the device as a whole. By the same token, since a block is itself a device it can be realized in different ways and thus a device can contain two or more blocks having different structures.

It should be noted that the matrix 102 does not have to be a single entity but can be split into sections. Likewise, it will be seen that the block 105 contains multiple groups of cells of which two are identified as 106 and 107, each containing a possibly different number of cells 101 and both being served by a single matrix 108. The block 105 together with its constituent cells, and any other constituent elements, is also served by a second matrix 109 shown external to the block 105. Each of the matrices 108 and 109 is typically of identical structure to the matrix 102 and whether it is shown inside the block or external thereto is merely a matter of convenience. Thus, the manner in which the matrix is depicted in the figures is schematic for illustration only. It should also be noted that part of the connections available in one matrix might be duplicated in another matrix. Any such duplication will be removed in the implementation. In practice, as will be explained below with reference to FIG. 8, the matrix is simply a collection of switches (such as CMOS switches) each controlled by a Flip-Flop, such that by writing logic "1" or "0" to the corresponding Flip-Flop, the switch may be closed or opened thereby allowing the cells to be connected according to any required topology. The Flip-Flops relating to all the switches of the matrix are arranged in groups and are associated with auxiliary circuitry enabling any one of the Flip-Flops to be selected for the purpose writing data thereto. Thus, the Flip-Flops and associated auxiliary circuitry may be realized by a RAM and will be referred to as "Matrix Control Memory". Optionally, data in the Matrix Control Memory can also be read.

The device architecture shown in may bring to mind "fractal" structures used in mathematics to describe any of a class of complex geometric shapes that exhibit the property of self-similarity.

The input pins and the output pins of the device are connected to the programmable matrix: the input pins to the matrix input; the output pins from the matrix output. In order to access a lower level directly from the input or from the output, the port of the block should be used.

Figure 3:
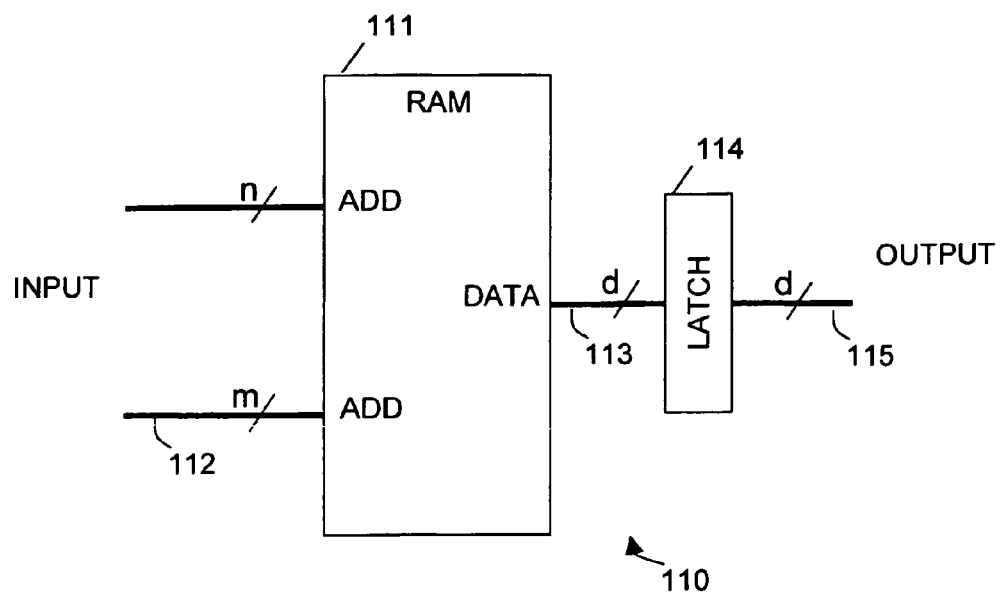
FIGS. 3 and 4 shows schematically alternative configurations of cells for use in the device shown in FIG. 2.

FIG. 3 shows schematically a cell 110 according to a first embodiment. The cell 110 comprises a random access memory (RAM) 111 having (n+m) address lines 112, which are shown as two separate buses although they function a single address bus whose minimum number of address bits (m+n) can be one. A data bus 113 allows data stored in addressable memory locations of the RAM 111 to be read out and accommodates a number of data bits d whose minimum number is also one. Data appearing on the data bus is latched by a latch 114 whose output 115 constitutes an output of the cell 110. The RAM 111 can be loaded with the desired data.

Figure 4:
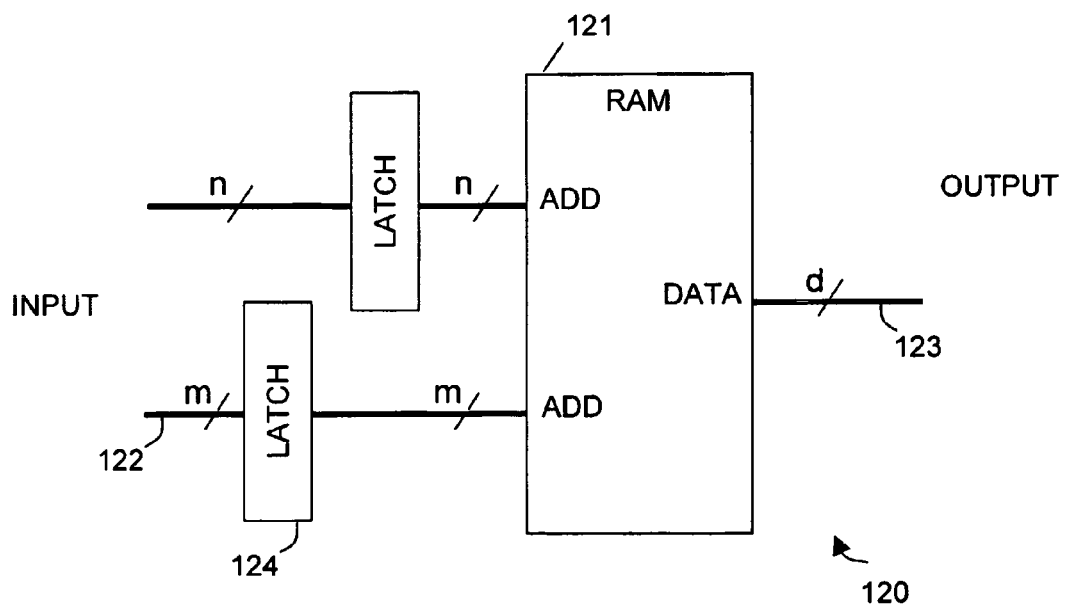

FIG. 4 shows schematically a cell 120 according to a second embodiment. The cell 120 comprises a RAM 121 having (n+m) address lines 122, which are again shown as two separate buses although they function a single address bus whose minimum number of address bits (m+n) can be one. A data bus 123 allows data stored in addressable memory locations of the RAM 121 to be read out and accommodates a number of data bits d whose minimum number is also one. In this case, the data appearing on the data bus 123 constitutes an output of the cell 120. The address appearing on the address buses 122 is latched by a respective latch 124. The RAM 121 can be loaded with the desired data in a manner described below. Although two latches 124 are shown at the input of the RAM 121, they are referred to as "the latch" of the cell 120, no distinction being made to the actual number of latches used to latch the address.

The RAMs 111 and 121 as well as the latches 114 and 124 shown in FIG. 3 and FIG. 4 are part of the device 100 shown in FIG. 2. In a particular embodiment reduced to practice, the RAM was modeled on IDT6116 of Integrated Device Technology, Santa Clara, Calif., USA 95054, and the latch was modeled on SN74HC374 of Texas Instruments Incorporated, Dallas, Tex. USA, 75380-9066. In both configurations of the cell, the values of n, m and d may be assigned as required according to an application to be implemented using the device.

Figure 5:
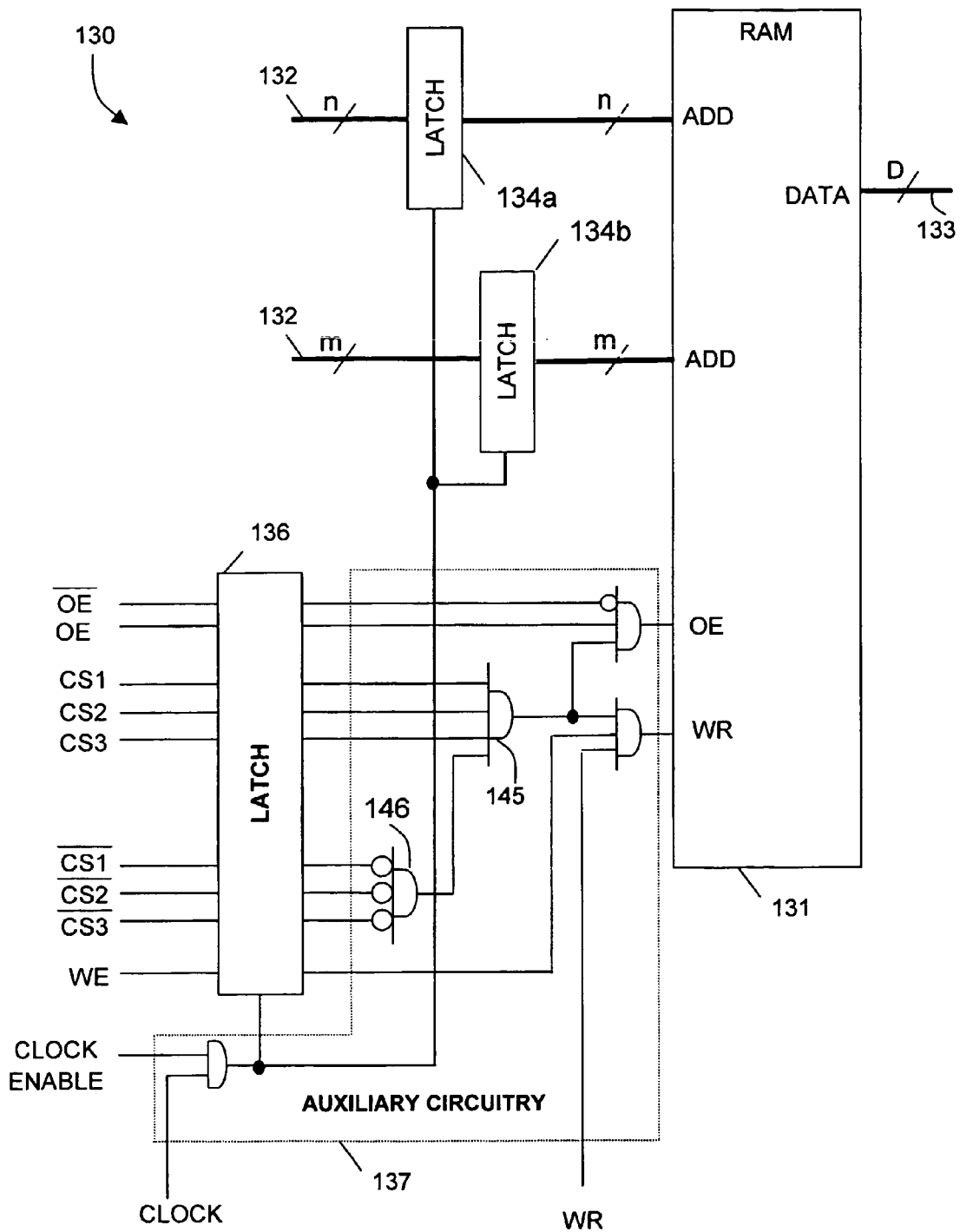
FIG. 5 shows schematically a detail of the cell shown in FIG. 4 including auxiliary circuitry.

FIG. 5 shows schematically the logical cell of FIG. 4 in more detail. The figure shows a cell 130 comprising a RAM 131 having (m+n)-bit address bus 132 and a d-bit data bus 133. A latch 134a and 134b is used to latch the address on the address bus 132. Again, it is to be noted that the address bus and the latch 134 are shown split by way of illustration only. Functionally, there is only a single address bus and the latches may be considered as a single latch. Logic signals OE and $\overline{OE}$ are latched by a latch 136 which also can be considered as part of, or extension, to the latch 134 and fed via auxiliary circuitry 137 to the output enable (OE) of the RAM 131 and may cause the RAM to be in a tri-state condition. Logic signals CS and $\overline{CS}$ are also latched by the latch 136 and fed via the auxiliary circuitry 137 so as to allow the RAM 131 to be selected or deselected. The number of pairs of the CS and $\overline{CS}$ signals is such to enable mapping the whole block (or device) into a single cell. A clock is routed to the latches 134 and 136 and can be enabled or disabled by a clock enable signal (CE) that may also be routed via a matrix. The signals OE, $\overline{OE}$, CS1, $\overline{CS1}$, CS2, $\overline{CS2}$, CS3, $\overline{CS3}$, CS4, $\overline{CS4}$ and so on, and CE are such that when not connected, are set to default values, such that an active low signal is set to LOW and an active high signal is set to HIGH, i.e. to their enabled states. As against this, the default value of WE when not connected is set to its disabled state. When the RAM is not selected (chip select is not active), it is both in tri-state condition and write disabled.

There will now be described a possible timing implementation for the device based on the cell of FIG. 5.

(a) A single "master clock" is used for all the cells;
(b) There is no "Write" signal as the master clock is the "write" signal. The write is active or not—depending on the "Write Enable" signal;
(c) As the "Output Enable" signals and the "Write Enable" signal are also latched by the master clock, therefore is no timing race or conflict between the "Write" signal and any other signal.
(d) There is no conflict between the latch operation and the write operation as the beginning of the latch operation is the end of the write operation. This notwithstanding, it may be desirable to decrease the pulse width of the write signal slightly in order to increase the safety margin whilst maintaining the same cycle, which is equivalent to the time between two continuous clock pulses to the latches.
(e) When a write occurs, data can be routed to the required cell via the matrix from the input of the device or from other cells. In the latter case, the respective data buses of the two cells are interconnected. The output enable of the RAM to which data is being written is in the output disable state (tri-state), and the output enable of the RAM from which data is being written is active.
(f) OE and chip select signals are provided as described above with reference to FIG. 5. The OE signal may be used for write operation, multiplexing between the cells, and so on; and the chip select signals may be used for the creation of bigger cells as is described below with reference to FIG. 6.

For devices suited for applications where no write operation is needed at all, the clock cycle can be shorter to create faster (real-time) applications and the master clock low-tohigh transition can occur when the cell output is ready. This will become clearer from the description of a RAM-Server combinations shown in FIG. 15 and FIG. 17 and the timing diagrams shown in FIG. 16 and FIG. 18.

Figure 6:
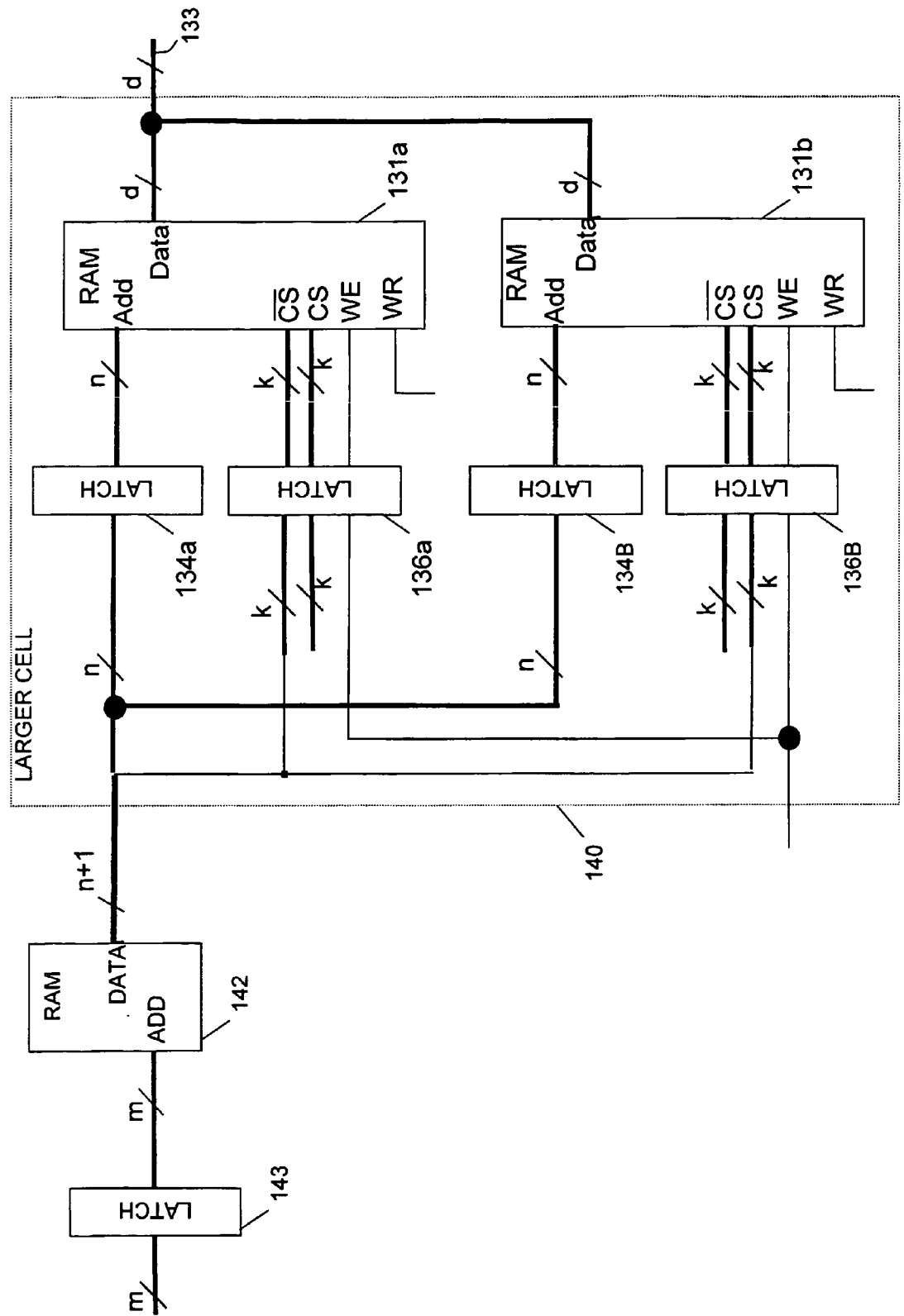
FIG. 6 shows schematically the connectivity required to create a cell formed from two cells so as to have a larger address bus.

FIG. 6 shows an example for connecting two cells each having an n-bit address so as form a composite cell 140 having double the size, i.e. twice the number of addressable locations addressed by an (n+1)-bit address bus. To the extent that the components of each constituent cell are identical to those described above with reference to FIG. 5, similar reference numerals are used in FIG. 6. Thus, the composite cell 140 contains two RAMs identified as 131a and 131b both having an n-bit address bus 132a and 132b, respectively. Thus, the n least significant bits of the combined address are fed via respective latches 134a and 134b to the corresponding RAMs 131a and 131b. By way of illustration, the (n+1)-bit address fed to the combined cell is derived from a RAM 142 having an m-bit address bus and an (n+1)-bit data bus, an m-bit address being fed thereto via an m-bit latch 143. The data buses 133 of the two RAMs 131a and 131b are connected via the matrix, each data output being tri-state so that only the data on a selected one of the RAMs is output. The MSB of the (n+1)-bit address bus is used to control which of the two RAMs 131a and 131b feeds data to the data bus 133. To this end, it is connected to the $\overline{CS1}$ input of the latch 136a controlling the RAM 131a and to the CS1 input of the latch 136b controlling the RAM 131b.

Operation of the circuit is as follows. If the MSB of the data of RAM 142 that is routed to the MSB of the combined (n+1)-bit address is 0, then the RAM 131a is enabled and the RAM 131b is disabled. Conversely, if the MSB of the data of RAM 142 that is routed to the MSB of the combined (n+1)-bit address is 1, then the RAM 131a is disabled and the RAM 131b is enabled. Referring back to the auxiliary circuitry 137 shown in FIG. 5, the CS1 input is fed to a first logical AND-gate 145 whose output is ACTIVE only if all its inputs are enabled. As noted above, any inputs not connected by the matrix are automatically enabled so that the output of the logical AND-gate 145 is ACTIVE if CS1 is enabled and is INACTIVE if CS1 is disabled. Likewise, the $\overline{CS1}$ input is fed to a second logical active Low AND-gate 146 whose output is ACTIVE only if all its inputs are enabled (active LOW). Again, since any inputs not connected by the matrix are automatically enabled, the output of the logical AND-gate 146 is ACTIVE if $\overline{CS1}$ is enabled and is INACTIVE if $\overline{CS1}$ is disabled. Thus, if the MSB is LOW, then $\overline{CS1}$ of the RAM 131a is enabled and the RAM 131a is operative and if the MSB is HIGH, then CS1 of the RAM 131b is enabled and the RAM 131b is operative. So when the RAM 131a is ACTIVE, the RAM 131b is INACTIVE and conversely when the RAM 131a is INACTIVE, the RAM 131b is ACTIVE.

In exactly the same way, two RAMs 140 can be combined, in which case the CS2 and $\overline{CS2}$ signals are also used for accommodating the two most significant bits of the address. Such extension can be repeated at will to produce a RAM having as many addressable memory locations as required by a specific application. It should also be noted that the two RAMs 131a and 131b are shown in FIG. 6 as having address buses of equal size. However, this need not be the case and an application may, and not uncommonly will, dictate a topology where RAMs having different size address buses are combined.

The "Clock Enable" signal may be considered as an input to the cell, although it is used mainly during design for debugging purposes.

Figure 7:
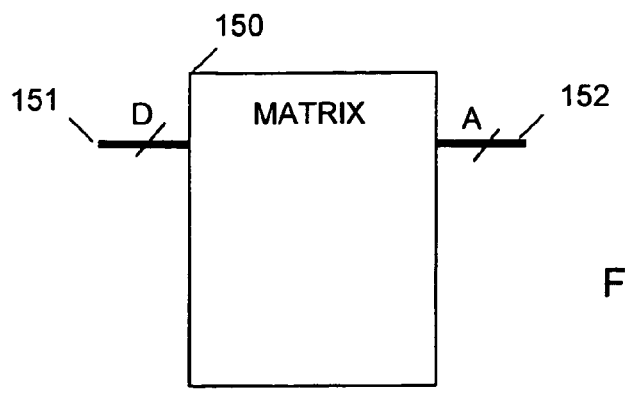
FIG. 7 shows schematically a matrix connecting D cell outputs to A cell inputs.

FIG. 7 shows schematically a matrix 150 connecting D cell outputs 151 to A cell inputs 152.

Figure 8:
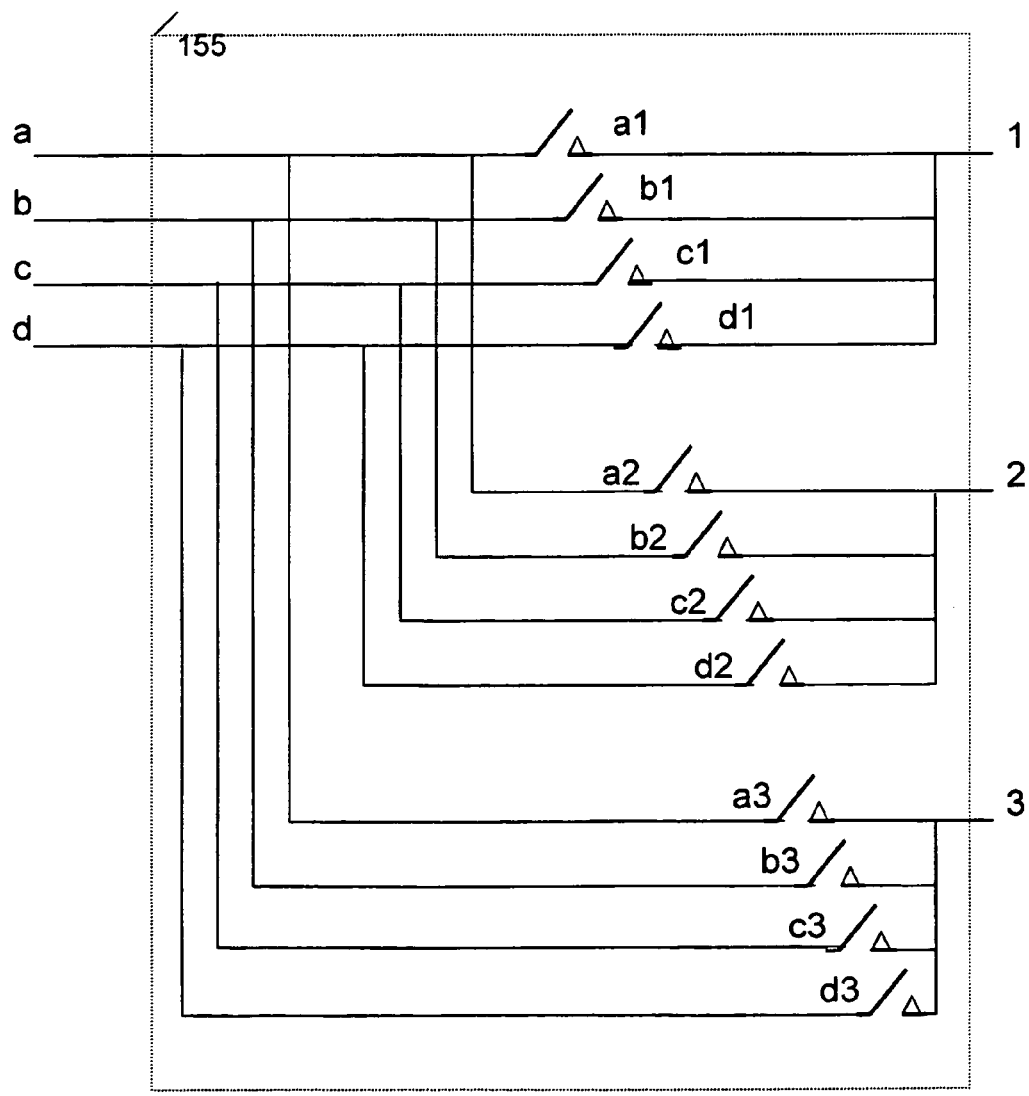
FIG. 8 shows schematically a saturated matrix that may be used in the circuit of FIG. 8.
Figure 9:
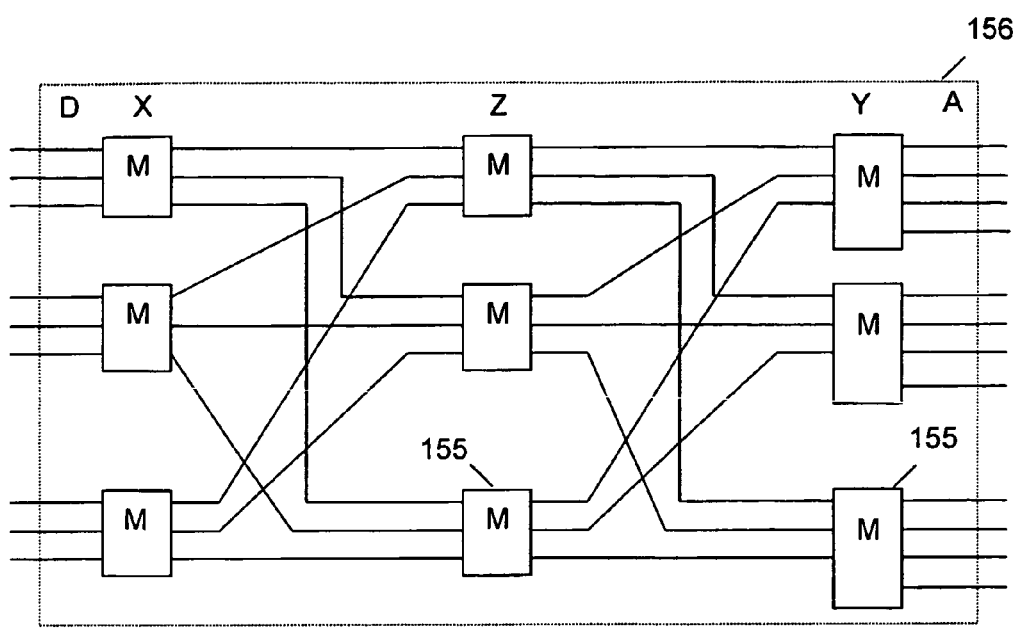
FIG. 9 shows schematically a non-saturated matrix that may be used in the circuit of FIG. 7.

FIG. 8 shows schematically a saturated matrix 155 having four input lines and three output lines that may be used in the circuit of FIG. 7. The matrix 155 has to be able to connect each of the cell output lines 151 to each of the cells input lines 152 in the block. Each cell output 151 is connected to a respective input of the matrix input 155 designated by alphabetic characters a, b, c, d. The matrix 155 serves to allow connection of each cell output 151 to one or more cell input 152 designated by numeric characters 1, 2, 3. There is in practice no reason to have the ability to connect each cell output 151 to all the possible cell inputs 152, thus permitting use of a matrix that is not saturated as shown in FIG. 9. However, it makes the automation simpler to use the saturated matrix 155 as in FIG. 8, and operation is faster in real-time. Although the cell could be made out of smaller cells, and in some applications, the bigger cell would not be constructed, the output and the input of the bigger cell are pre-determined.

Operation of the saturated matrix 155 is as follows. Each of the inputs a, b, C, d is connected to each of the outputs 1, 2, 3 via corresponding switches. Thus, the inputs a, b, c, d are connected to the output 1 via switches a1, b1, c1, d1. Likewise, the inputs a, b, c, d are connected to the output 2 via switches a2, b2, c2, d2; and they are connected the output 3 via switches a3, b3, c3, d3. In order to connect input a to output 1, the switch a1 is closed. In order to connect c to 3, the switch c3 is closed. In order to connect b to both 1 and 3, the switches b1 and b3 are both closed. In order to connect both b and d to both 2 and 3 the switches b2, b3, d2, and d3 are closed, and so on.

Each switch has a control line (not shown) that sets the switch to "closed" or "open" and is connected to a 1-bit memory that stores the state of the switch. As in practice there are great many switches, all the bits that store each switch state are arranged in a memory structure. In other words, there is a memory unit that stores the switches' states. Each bit in the memory is connected to one control line, there being the same number of bits in the memory as the number of switches in the matrix. By such means, the memory functions as a Matrix Control Memory for controlling whether the state of each switch is closed or open. In the above example, the matrix 155 connects a 4-bit data bus to a 3-bit address bus. However, it will be appreciated that the matrix 155 can equally well be connected with the lines a, b, c, d forming the output and the lines 1, 2, 3 forming the input so as to connect a 3-bit data bus to a 4-bit address bus.

FIG. 9 shows schematically an example of a non-saturated matrix 156 comprising a plurality of interconnected saturated matrices 155 as shown in FIG. 8, each having its own memory to control each switch thereof. All the memories are organized as one big memory that functions as the Matrix Control Memory. Programming the matrix is achieved by loading the matrix control memory with the appropriate data, as described below, and sets the desired topology of the device.

Such a matrix 156 constructed so as to have a limited but sufficient number of connections is preferred over an equivalent saturated matrix having the same number of switching connections as it save die space, though the code for choosing the links (routings) is slightly more complicated. Thus, assuming that each matrix 155 is saturated and denoting:

D=the number of input lines to the matrix,
A=the number of the output lines of the matrix,
X=the number of the input matrices 155, Y=the number of the output matrixes 155, and Z=the number of the middle column matrixes 155, X, Y and Z are calculated as follows:

$$X = \text{ceiling}\left(\sqrt{\frac{(D^2 + D \cdot A)}{A}}\right) \quad Y = \text{ceiling}\left(\frac{A \cdot X}{D}\right) \quad Z \geq \frac{D}{X}$$

where "ceiling" denotes that a non-integer number is rounded up to the next highest integer.

Each of the input matrices is connected to each of the middle column matrices. Each of the output matrices is connected to each of the middle column matrices. To prevent cross connects limitations, it is possible to increase Z. Even so, the number of switches and the associated memory will be a lot smaller than the number of switches and the associated memory in a saturated matrix with the same number of input pins and output pins. This is particularly important when a single matrix is used to connect all the cells in all levels. It will be noted that the likelihood that the end-user will connect two cells in the same block is greater than the likelihood that he will connect two cells in different blocks, owing to the tendency to attempt to combine cells to form larger cells. Therefore, when such a single matrix is used, it is advisable to take into account during design of the device to which input and output matrices, pins of the cells are connected, since from these cells the end-user may choose to form larger cells. It should also be noted that if, instead, separate matrices are provided within each block, the cumulative delay for some connections is likely to be greater than if a single matrix were used. Account must also be taken of the need to provide connections in the matrix to the input and output of the device in addition to the interconnections between the outputs of the cells to the inputs of the cells.

In order to understand how the device may be used to implement different hardware applications merely by selecting a required topology and downloading data into the storage elements of each of the cells, various examples will now be described. For ease of explanation, some examples are based on the cell 110 shown in FIG. 3, although the device works in the same manner using the cell 120 of FIG. 4. In the following examples, components that are common to the cell shown in FIG. 3 and the matrix shown in FIG. 8 will be referred to by identical reference numerals.

EXAMPLE 1

Counter

Figure 10:
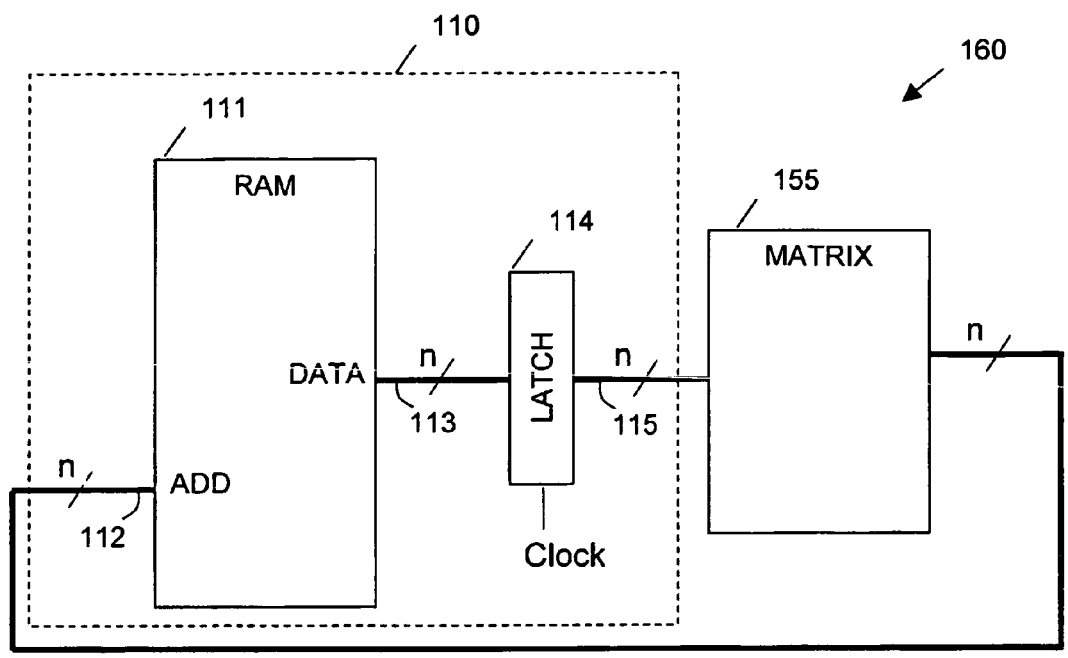
FIG. 10 shows schematically a counter using one cell as shown in FIG. 3.

FIG. 10 shows schematically a counter 160 using one cell 110 comprising a RAM 111 having an n-bit data output bus 113 fed to an n-input latch 114, whose output 115, constituting the cell's output, is connected to the input of the matrix 155. Each of the cell's n output lines is connected via the matrix 155 to a respective address line of the RAM's address bus 112. The RAM is loaded with the following data:

| Address | Data |
|---------|------|
| 0 | 1 |
| 1 | 2 |
| 2 | 3 |
| . | |
| . | |
| . | |
| K-1 | K |
| K | 0 |

In steady state, there is a "number" at the output 115 of the latch 114 that defines the "address" of the RAM 111. Therefore, the "data" of the RAM—the input of the latch—is set by the table. For all addresses apart from the last, the data in any addressable location of the RAM is equal to one more than the address thereof and this becomes the new address on the next clock pulse. Thus, each time the RAM is clocked, the latch 114 latches the address of the next addressable location whose data is equal to the current data plus 1. After a delay time, the RAM is ready for a new clock and the cycle repeats and the output is successively incremented.

EXAMPLE 2

Up-Down Counter

Figure 11:
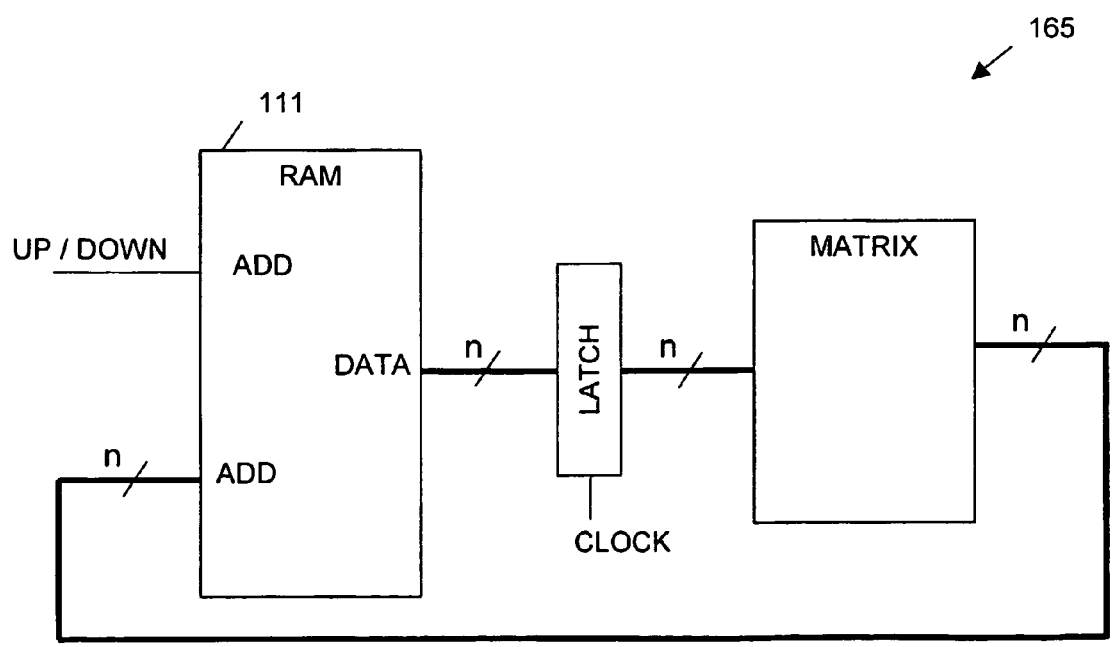
FIG. 11 shows schematically an Up-Down counter using one cell as shown in FIG. 3.

FIG. 11 shows schematically an Up-Down counter 165 substantially identical to the counter shown in FIG. 10, except that the RAM 111 is constructed to store two tables in respective addressable locations thereof. This, of course, requires that the RAM be twice as large as that used in the counter of FIG. 10, or that the range of the counter be half. In either case, one bit of the address is used to set a new area in the RAM for storing data that, when fed to the remaining bits of the address bus, will point to a new address the value of whose data is one less than the address. The new area in the RAM is loaded with the following data:

| Address | Data |
|---------|------|
| 0 | K |
| 1 | 0 |
| 2 | 1 |
| 3 | 2 |
| . | |
| . | |
| . | |
| K-1 | K-2 |
| K | K-1 |

The Up/Down signal is also routed from the matrix 155, as are all the inputs of the cells.

EXAMPLE 3

Delay

In order to achieve delay, the RAM is redundant. Therefore, the RAM 111 can be coded simply to transfer the address to the data e.g. at address "0" the data is "0", at address "1" the data is "1" and so on. On each clock signal, the data at the input of the cell is latched and routed out directly via the RAM, a delay of one clock is achieved. The connectivity of such a delay is also used in the Shift Register described below in Example 4 and shown in FIG. 13.

EXAMPLE 4

Shift Register

Figure 12:
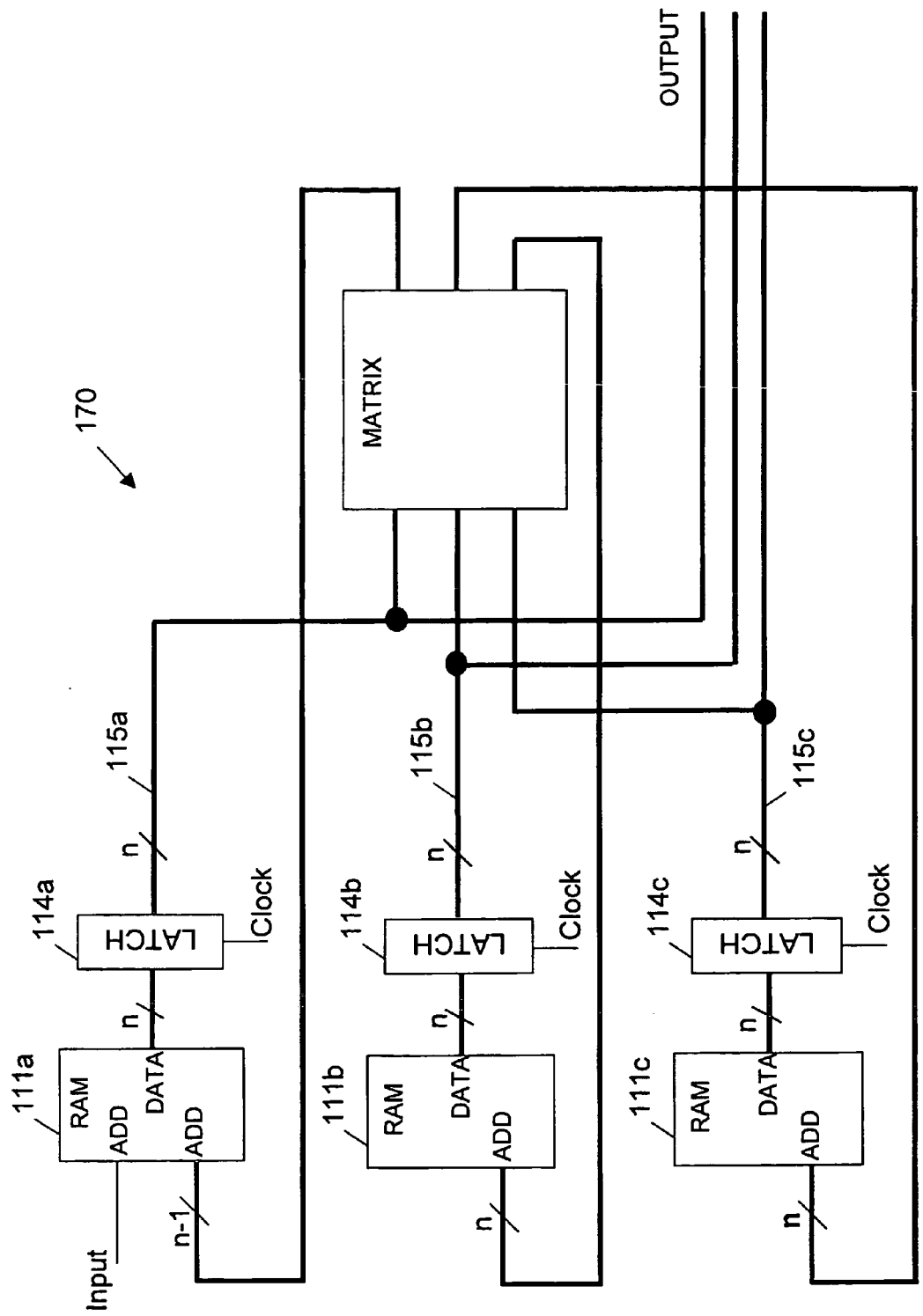
FIG. 12 shows schematically a shift register using three interconnected cells as shown in FIG. 3.

FIG. 12 shows schematically a shift register 170 using three cells in a block and comprising respective RAMs 111a, 111b and 111c each having an n-bit data output bus fed to a respective n-input latch 114a, 114b and 114c, whose respective outputs 115a, 115b and 115c combine to form a 3n-bit output data bus 115, constituting the cell's output. The matrix 155 is programmed to connect the (n−1) LSBs of each of the output data buses 115a, 115b and 115c to respective address bits of the corresponding RAMs 111a, 111b and 111c. Likewise, the MSB of each of the output data buses 115a, 115b and 115c to fed by the matrix 155 to the LSB of the next RAM except for the MSB of the data bus 115c, which is simply discarded by the shift register although it may be used by the application. The data in each RAM is coded so as simply to transfer the address to the data e.g. at address "0" the data is "0", at address "1" the data is "1" and so on, as is done in the delay described in Example 3 above. The topology of the shift register is designed to produce the required shift and the matrix 155 is programmed to achieve the necessary connectivity.

It will be understood that the connectivity of the matrix 155 is not shown in FIG. 12 for the sake of clarity. However, in order that operation of the shift register 170 be clear, the connectivity and operation of only the RAM 111a will now be explained with reference to FIG. 13 where identical reference numerals are used to denote those components in FIG. 12.

Figure 13:
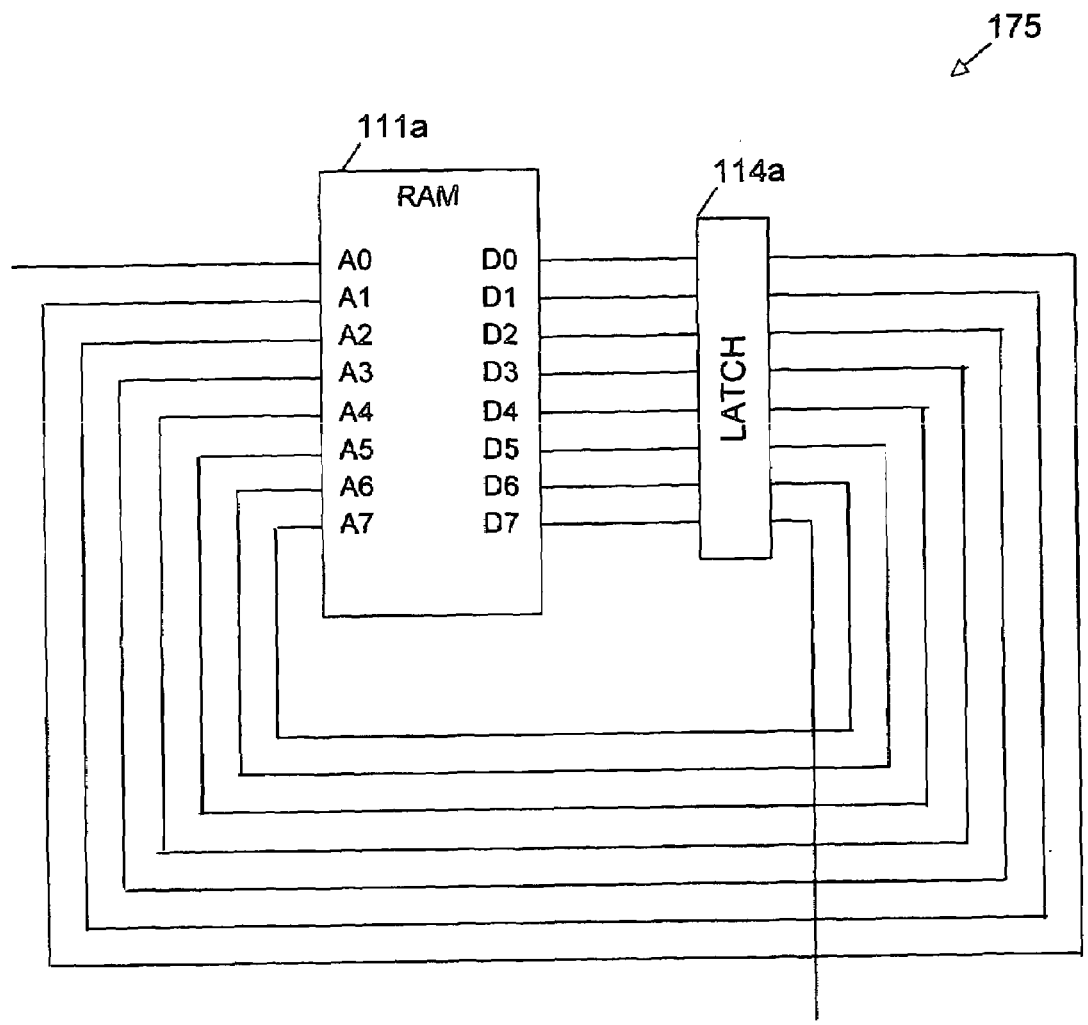
FIG. 13 shows schematically a possible topology of a one-cell shift register used in the shift register shown in FIG. 12.

FIG. 13 shows a one-cell shift register 175 including a RAM 111a having an 8-bit address bus (i.e. n=8), and each of whose data bits is latched by a latch 114a and connected by the matrix (not shown) to the next more significant bit of the RAM's address bus. Thus, denoting the address bits by $A_0, A_1, A_2, \ldots A_7$ where $A_0$ is the LSB and $A_7$ is the MSB and the data bits by $D_0, D_1, D_2, \ldots D_7$, the least significant data bit $D_0$ is connected to the address bit $A_1$, data bit $D_1$ is connected to the address bit $A_2$ and so on. The most significant data bit $D_7$ is discarded or fed to the next stage of the shift register if several one-cell shift registers are to be connected in cascade as in FIG. 12.

As noted above, the data in the RAM 111a is coded simply to transfer each address bit to the corresponding data bit e.g. at address "0" the data is "0", at address "1" the data is "1" and so on. By such means the data on each address line is simply output by the RAM 111a and latched by the latch 114a. On the next clock pulse, each data bit is now fed by the matrix to the next address line whereby on successive clock pulses, data fed to the LSB address bit $a_0$ ripples through the shift register.

An alternative approach that may be used to implement a one-cell shift register is to program the matrix to transfer the lines directly, such that $D_1$ is connected to the address bit $A_1$, data bit $D_2$ is connected to the address bit $A_2$ and so on. In this case, the shift is done by loading the RAM with the following data:

| Address | Data |
|---------|------|
| 0 | 0 |
| 1 | 2 |
| 2 | 4 |
| 3 | 6 |
| 4 | 8 |
| 5 | $A_H$ | and so on. If a reverse shift is required then the RAM is loaded with the following data:

| Address | Data |
|---------|------|
| 0 | 0 |
| 1 | 0 |
| 2 | 1 |
| 3 | 1 |
| 4 | 2 |
| 5 | 2 | and so on.

It will be understood that in both the 3-cell shift register of FIG. 12 and the one-cell shift register of FIG. 13, the least significant address line is also connected to the matrix. However, it is shown "detached" in both figures in order to emphasize the shift operation.

The following points should also be noted. The maximum rate of this shift register is determined by the clock whose frequency must take into account the delay of one cell only plus the delay of the matrix. Also, with reference to the previous discussion relating to "levels", the input pins and the output pins of the device are connected to the "level 1" programmable matrix: the input pins to the matrix input; the output pins from the matrix output. If the application is implemented in "level 1", the input pin carrying the LSB of the shift register can be routed from one of the input pins of the device, and the output pins 115 can be routed to the output pins of the device. If the application is implemented in other "level" than "1", only the pins from the port of the block in that level can be routed to the I/O pins of the device.

EXAMPLE 5

Noise Generator

A noise generator may be constructed based on the shift register illustrated in FIG. 12. As is known to those skilled in the art, a noise generator may be formed by XNOR-ing some of the outputs of the shift register and feeding the output of the XNOR back to the input address LSB so as to ripple through the shift register. The address-data relation in the RAMs is programmed to achieve the XNOR operation. In the simple case where two data bits of the same RAM are to be XNOR-ed, it is straightforward to program the data in the RAM according to the desired truth table of the device. However, if XNOR has to be performed between data bits of two separate RAMs, then one of those data bits must be connected by the matrix to form an input to the other RAM too. Consider, for example, that in the shift register 170 shown in FIG. 12, one of the data bits of the RAM 111a is to be XNOR-ed with one of the bits of the RAM 111b. The matrix 155 should connect the required data bit in the output 115b of the RAM 111b to input 112a of the RAM 111a and the XNOR result must be passed to one of the data output bits 115a of the RAM 111a. As a result, the RAM 111a has fewer remaining bits to perform the shift function.

EXAMPLE 6

Pattern Generator

A pattern generator/signal generator is another simple application and typically uses one cell as a counter that is routed to a second cell, whose data is programmed to generate the required pattern according to the state of the counter. Thus, considering any function $f(t)$ that can be calculated or plotted, the counter outputs successive values of t, whilst the second cell stores for each value of t fed to its address bus the value of the function $f(t)$. The second cell can be configured for storing in different sections of RAM data relating to different functions, these being selecting as required by a selection code fed to other free address bits of the cell. The counter cell, being programmable, can set different cycles for the different signals (patterns). If the amount of data bits in the cell is less than the number of bits needed, another cell can be used to generate the other part of the signal: one generating the MSB part of the signal and the other generating the LSB part.

Various examples will now be presented using the cell 120 illustrated in FIG. 4.

EXAMPLE 7

Tri-state ability of the cell

Figure 14:
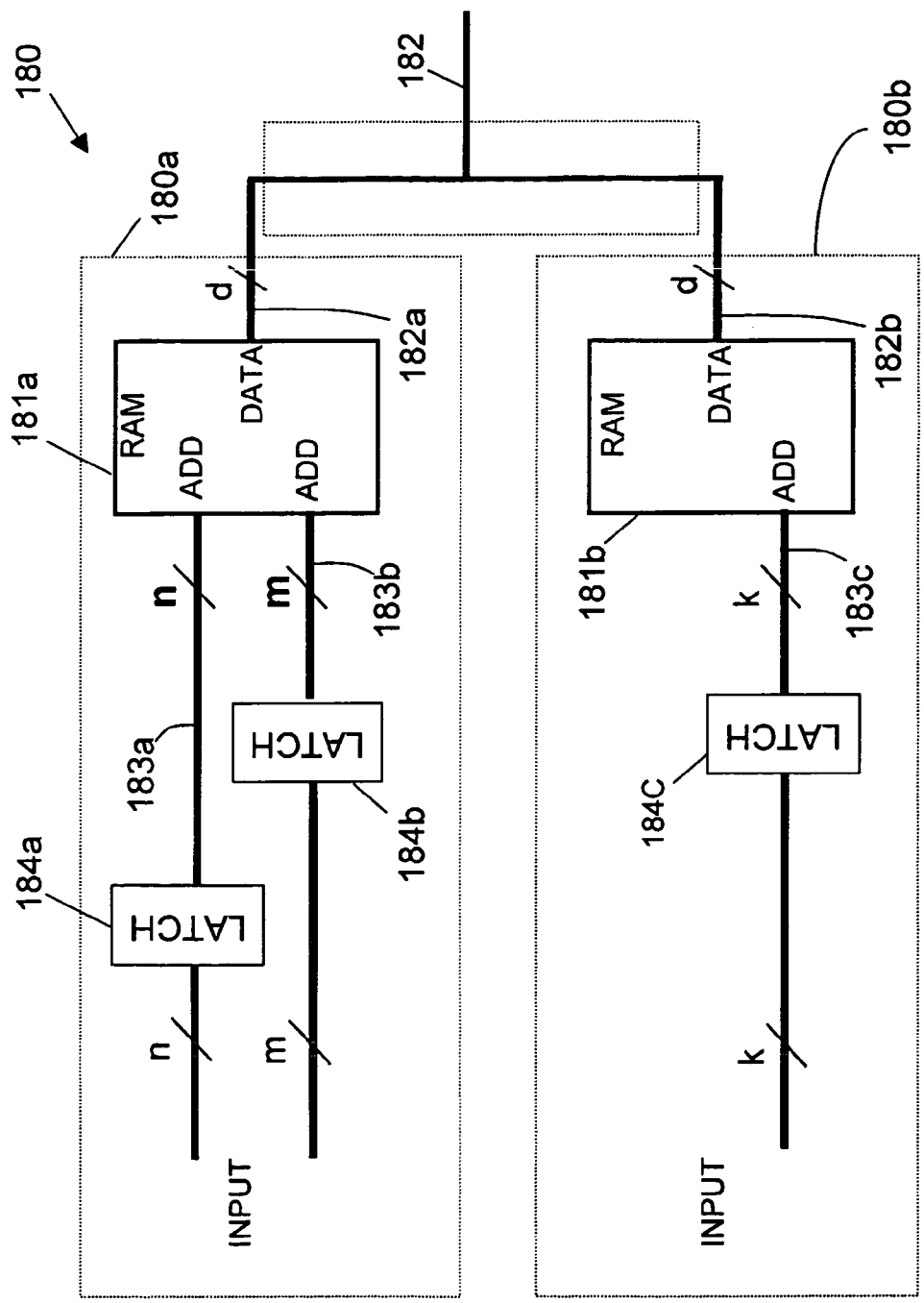
FIG. 14 shows schematically how two cells of the kind shown in FIG. 5 may be connected in tri-state.

FIG. 14 shows schematically a pair of cells 180*a* and 180*b* comprising two RAMs 181*a* and 181*b* having respective data output buses 182*a* and 182*b* both can be driven into tri-state. It is advisable to use the tri-state ability of the cell when multiplexers are needed. In a multiplexer implementation, the outputs of the cells that are to be connected are routed via the matrix to the same point. The RAM 181*a* has an (n+m) address bus 183*a* and 183*b* whose respective address lines are latched by a pair of latches 184*a* and 184*b*, whilst the RAM 181*b* has a k-bit address bus 183*c* whose respective address lines are latched by a latch 184*c*. It should be noted the apparent difference between the latch configurations of the two RAMs exists only on paper since k may be equal to m+n and the latches 184*a* and 184*b* would then operate as single k-bit latch analogous to the latch 184*c*. The output enable signals applied to the two RAMs 181*a* and 181*b* select which one is active. The output enable signals are routed via the matrix as well.

With reference to FIG. 9, the number Z of the matrices 155 in the middle column is the critical number to prevent cross-connection limitations. However, when the output of some cells are to be connected to the same point, lines may be freed in this middle column. Thus, the cells 180*a* and 180*b* can be connected via a matrix in the first column to a common output thereof, allowing the common output of this matrix to be connected to an output of the matrix 156 via only a single matrix in the second column and thus using fewer lines thereof. This is preferable to connecting each of the cells 180*a* and 180*b* to respective lines in the middle matrix and then effecting the cross-connection.

As the matrix can connect the output of any cell, e.g. the cell 180*a*, to the data of any other RAM in the block e.g. the RAM in the cell 180*b* (the data of any RAM is also the output of its cell), if the other cell 180*b* is in tri-state while the first cell 180*a* is active, a write operation can be made to the RAM 181*b* in the cell 180*b*. The write pulse may be activated each cycle, but the write enable routed from the matrix enables or disables the actual write.

EXAMPLE 8

RAM-"Server" Combination

Figure 15:
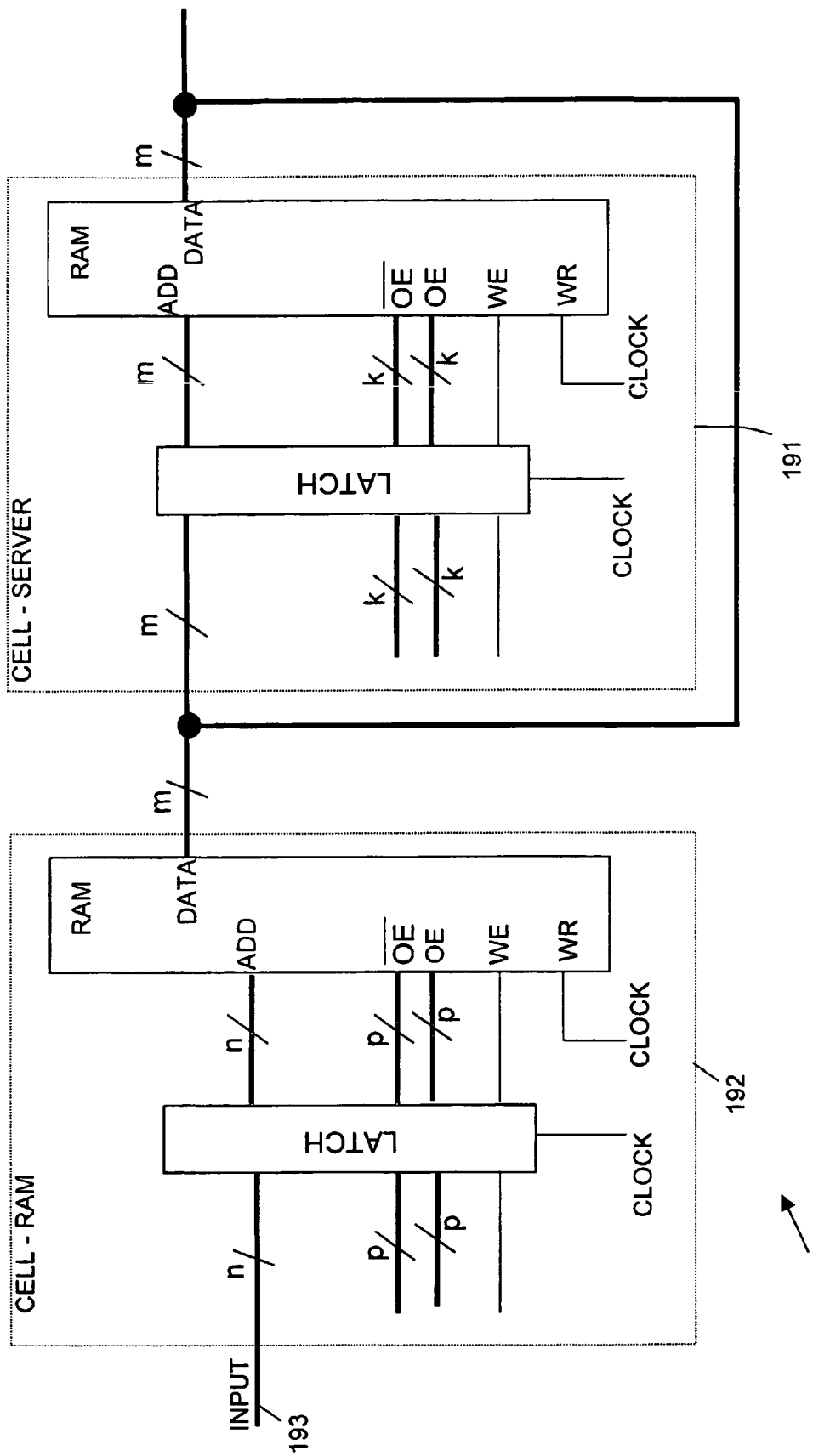
FIG. 15 shows schematically a RAM-server according to a first embodiment using two cells of the type shown in FIG. 5.

FIG. 15 shows a "RAM-Server" combination 190 including a Server 191 and a RAM 192 exploiting the write ability described above with reference to FIG. 14. The Server 191 is a cell that carries out a function while the RAM 192 stores results of the Server to be used in subsequent Server operations. The required connectivity between the Server 191 and the RAM 192 is effected by the matrix, which for clarity is not shown in the figure.

An example of the use of the RAM-server combination 190 is as follows. The RAM-server 191 receives an input stream of bytes and has to count how many times each byte (of a possible 256 different bytes) appears in a period. (This example is a part of the Huffman Code application). The input stream is routed to an input 193 of the "RAM-Server" combination 190 which operates as follows. The RAM 192 stores the results per byte and the Server 191 increments the old result by one. By such means, the RAM 192 receives a series of 8-bit numbers (between 0 to 255) and the RAM-Server 190 compiles and stores in the RAM 192*a* histogram showing the frequency of occurrence of each 8-bit number.

The following operations occur:
(a) The current byte is sampled into the input cell-RAM and the number stored in the RAM is ready.
(b) This number is latched into the Cell-Server. The Server is programmed to increase the number (similar to the counter shown in FIG. 10);
(c) The increased data is stored in the Cell-RAM.

Figure 16:
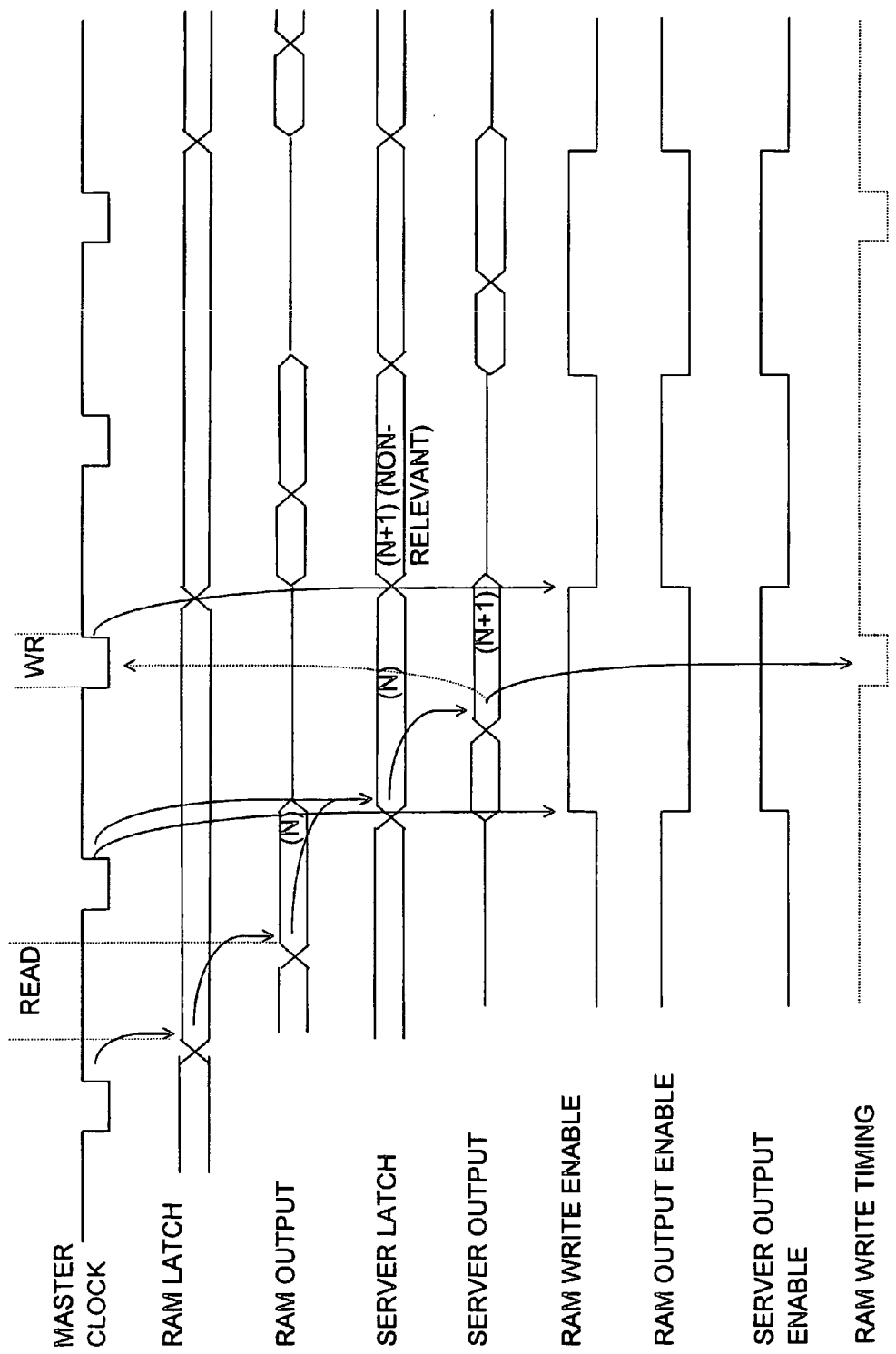
FIG. 16 shows a possible timing diagram for the RAM-server shown in FIG. 15.

FIG. 16 shows a possible timing diagram for the above implementation, showing that the operation can be done in two cycles only, as the "write" cycle can be done in the same cycle a new byte is latched. Although there is a waste of real-time in this timing solution as the master clock should be slightly greater to enable the write operation in two cycles, this may nevertheless be justified since a "RAM-Server" combination may sometimes simplify the implementation of an application. All the required signals shown in FIG. 16 can be generated by other cells configured to perform pattern generation as explained above, and fed via the matrix.

If the device is designed with a clock cycle that is too short to allow the above implementation, a three-clock cycle RAM-server combination may be used as is now described with reference to FIG. 17 and the corresponding timing diagram shown in FIG. 18. Thus, referring to FIG. 17, there is shown a RAM-server combination 200 that carries out the same application as that described above with reference to FIG. 15 and includes a Cell-Server 201 coupled to a cell RAM 202 identical to the cell in FIG. 5. In this case, on the third clock cycle the data must be held invariant for the write operation so as to remain at the same value as output of the Cell-Server 201 during the previous clock cycle. Otherwise, since the output data of the RAM of the Cell-Server 201 is fed back to the address bus of the Cell-Server 201, it would be incremented again by the counter therein. Therefore, in this case, on the third cycle the clock signal is disabled. However, in this case, the clock enable signal is dispensed with and instead an extra address bit shown as "Add One" in FIG. 17 is fed to the input of the Cell-Server 201 so as command no change in the third cycle.

A third timing scheme may be based on the fact that the coding of the RAM address is ready before the write operation, such that the write period is expected to be shorter then the read period. Therefore, the two cycles operation is preferred. However, a three cycles operation can be implemented as illustrated in FIG. 18. The clock "low-to-high" transition can be "moved" to be after the end of the read operation, creating faster clock cycle. As noted above, the input signals can be generated by other cells and connected by the matrix.

It transpires from what has been explained above with reference to FIG. 17, that the clock enable is not essential for the RAM-Server 201, and therefore even if no clock enable is provided in the device, the RAM-Server 201 can still be implemented. The decision as to whether or not to provide clock enable depends not so much on the need to add one more logical AND gate to each cell for the clock enable, but rather on the need to increase the size of the programmable matrix.

Figure 17:
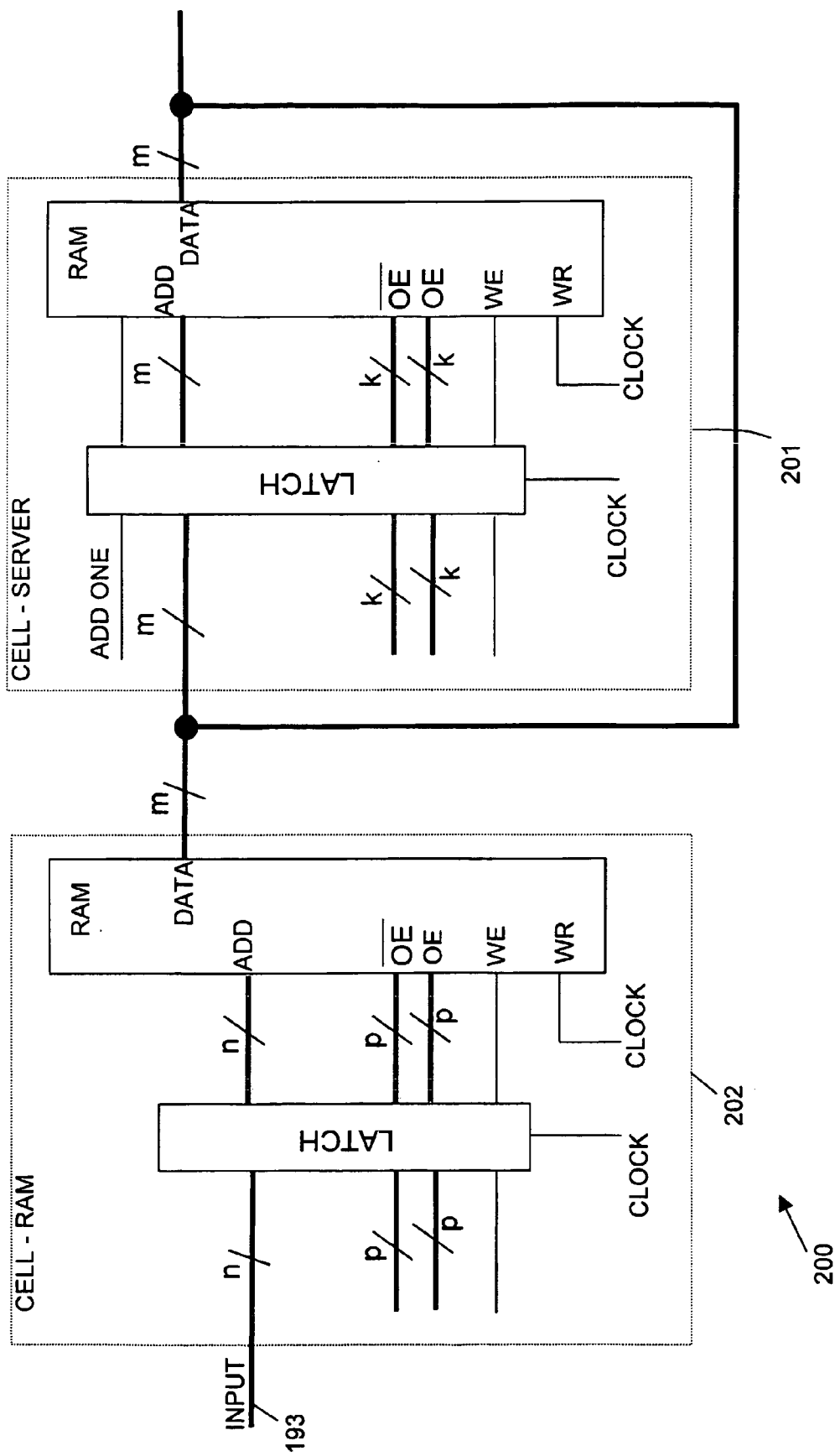
FIG. 17 shows schematically a RAM-server to a second embodiment using two cells of the type shown in FIG. 5.
Figure 18:
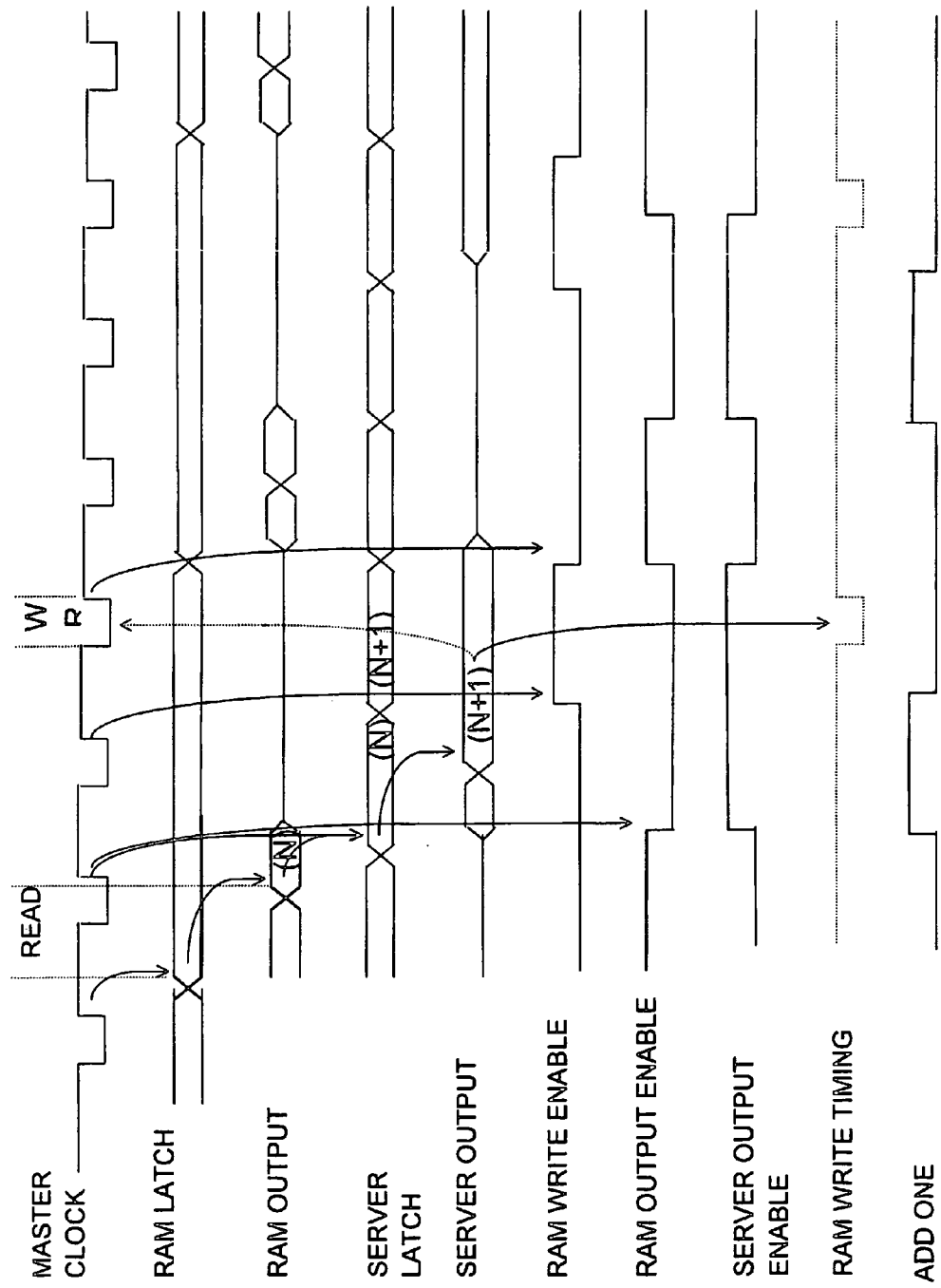
FIG. 18 shows a possible timing diagram for the RAM-server shown in FIG. 17.

Creating faster clock cycle may cause some applications to be executed faster, but if this is the case in the "RAM-Server" application shown in FIG. 17, the input has to be synchronized to the 3-cycle clock, so it may be expected to execute slower.

EXAMPLE 9

Time Sharing

To implement an application, normally several cells are needed. In time-sharing, the same operation is done for several independent inputs that are routed into the implementation sequentially on the same input port. In order to implement a time-sharing application easily, the "RAM-Server" combination as described above with reference to FIG. 15 or FIG. 17 should replace any single cell performing logic where the "Server" is used as the cell performing logic and the RAM is used to store each slot's state. The input of each RAM is connected to one global counter that counts the slots/channels of the application administering time-sharing. The counter can be one of the cells or a special purpose counter routed via the programmable matrix to all the RAMs of the "RAM-Sever" combinations executing the timed-shared implementation. In the preferred architecture, there is no special purpose counter, so if time-sharing is needed, a counter application (one cell or a few cells) should be implemented.

Figure 19:
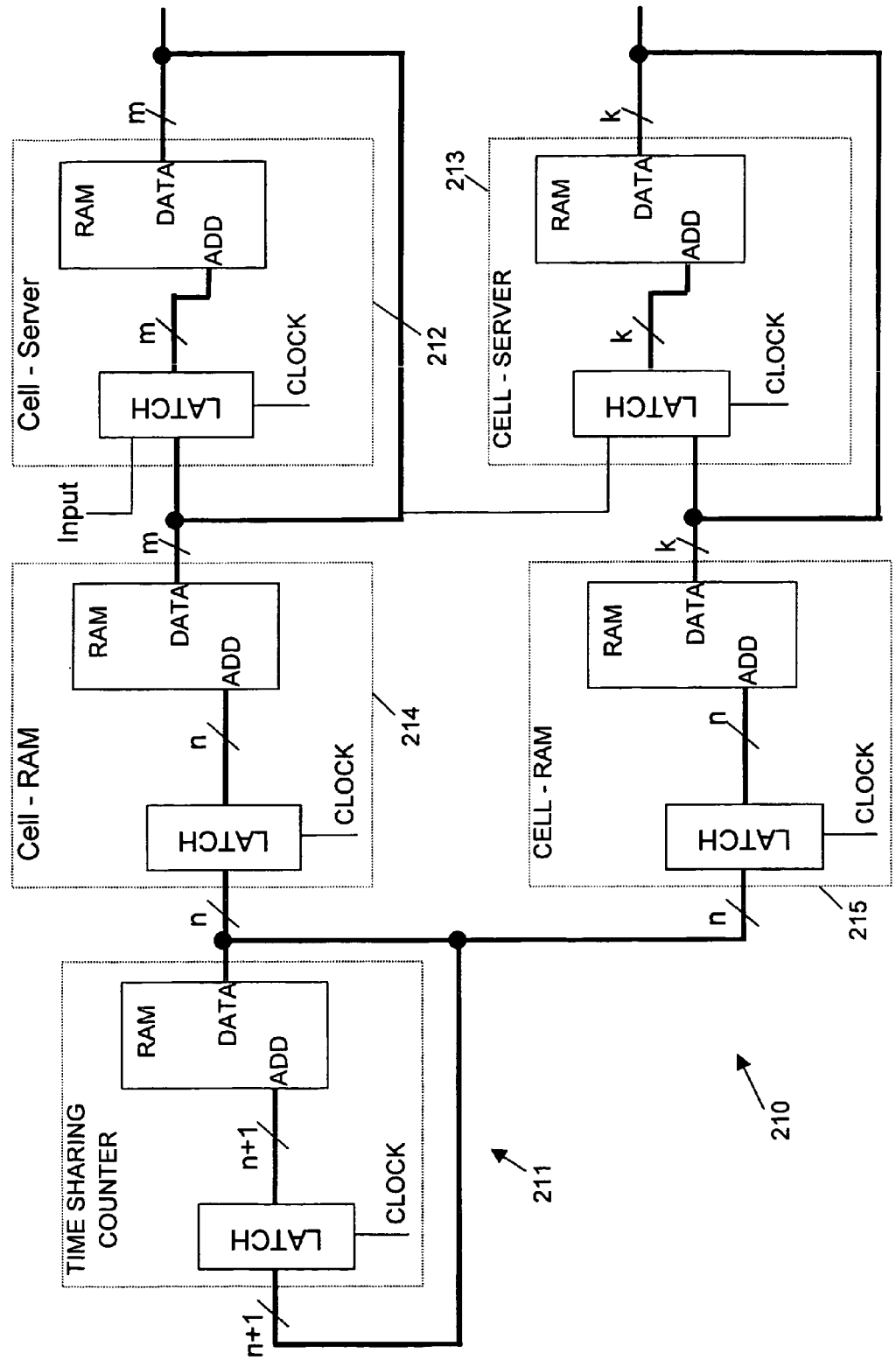
FIG. 19 shows schematically a shift register operating in time-sharing application mode.

FIG. 19 is an example for a shift register 210 operating in time-sharing mode utilizing a time-sharing counter 211. The shift register 210 comprises two RAM-Servers 212, 214 and 213, 215, which perform the low and high parts, respectively, of the combined shift operation in a similar manner to that described above with reference to FIG. 12, the MSB of the RAM 214 being fed to the input of the Server 213. Respective time-sharing cells 214 and 215 are connected to the Servers 212 and 213 for storing the low and high parts, respectively, in respect of each slot of the shift register samples. The RAM-Servers 212, 214 and 213, 215 act as explained above with reference to FIG. 15 or FIG. 17 and their respective timing diagrams FIG. 16 and FIG. 18. The time-sharing counter 211 is connected to the latches in the cells 214 and 215 in a manner similar to the connection of the input byte of the RAM Servers 190 and 200 shown in FIG. 15 and FIG. 17, respectively. The whole operation has two cycles only if the preferred "two cycle" operation is chosen as illustrated above with reference to FIG. 16 and as further demonstrated below with reference to FIG. 20.

Operation of the application is as follows. The two "Server" cells 212 and 213 implement the shift register implementation as explained above. The time-sharing counter 211 acts as a global counter counting the time-sharing slots/channels.

Figure 20:
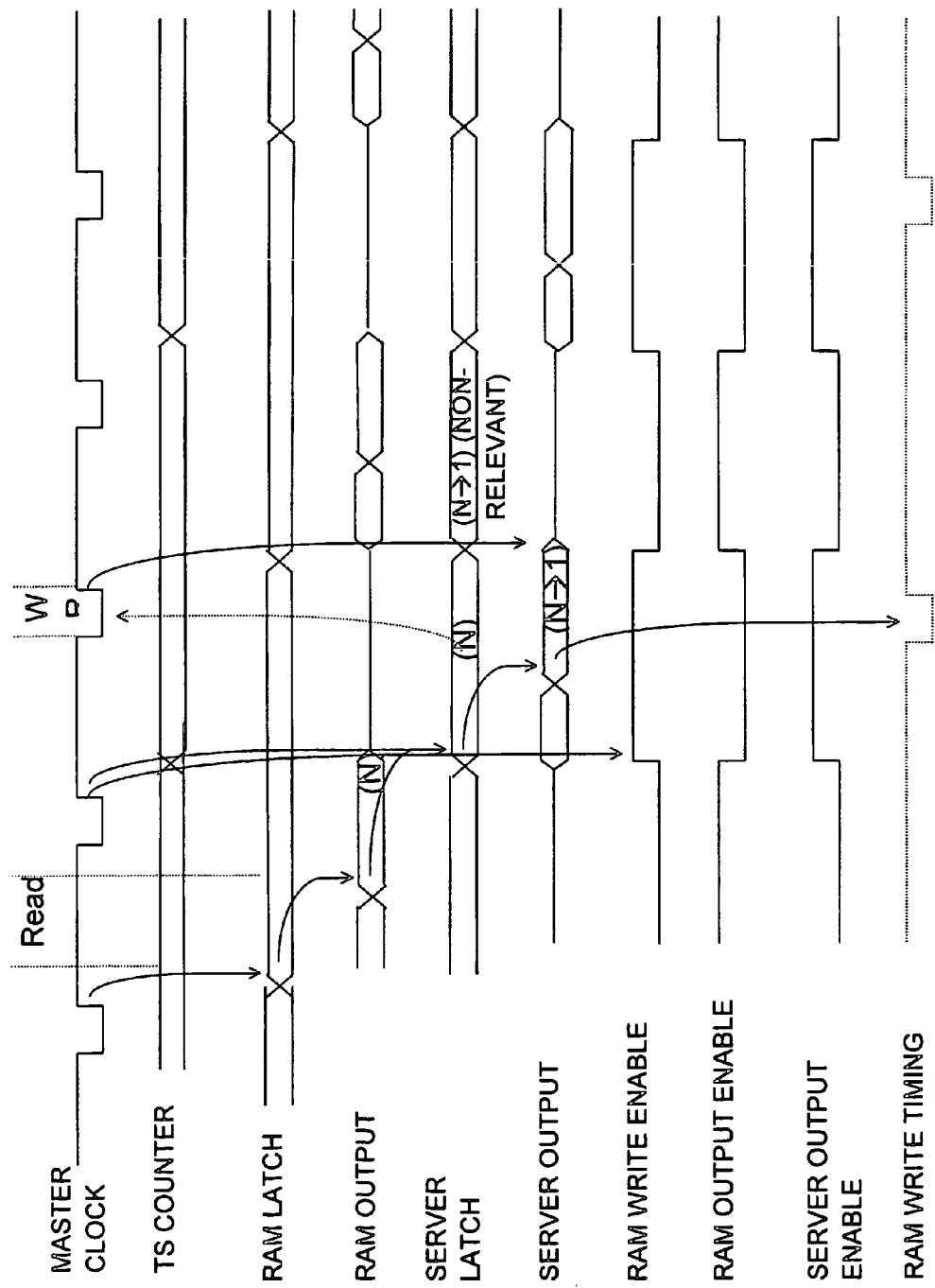
FIG. 20 is a timing diagram showing the timing operation for the shift register shown in FIG. 19.

FIG. 20 is a timing diagram showing the timing operation, where "N→1" symbolizes "shift by 1", showing that the following operations occur:

(a) As the same clock is used for the global counter and for providing the master clock signal for the rest of the implementation, the global counter should not route its LSB bit to the time-sharing cells 214 and 215. Thus, the 'n' most significant lines on the global counter represent a two-cycle counter. The LSB can be used to control the 'OE' of the time-sharing cells 214 and 215 and the RAM-Servers 212 and 213.

(b) With reference to FIG. 10, more than one cell can be used for implementing the counter (if the number of data bits is less than the number of the 'n+1' bits needed).

(c) On the first cycle, when the old data is to be read, the outputs of the time-sharing cells 214 and 215 are enabled and the outputs of the RAM-Servers 212 and 213 are disabled.

(d) On the next cycle, the outputs of the time-sharing cells 214 and 215 are disabled whilst their write enables are enabled and the outputs of the RAM-Servers 212 and 213 are enabled. As a result, the data corresponding to the current status of the respective RAM-Servers 212 and 213 are now written to the time-sharing cells 214 and 215 at the memory locations thereof addressed by the value of the time-sharing counter 211.

(e) The time-sharing counter 211 serving as the global counter is enabled in both cycles.

EXAMPLE 10

"RAM-Server" in Time-Sharing Environment

Figure 21:
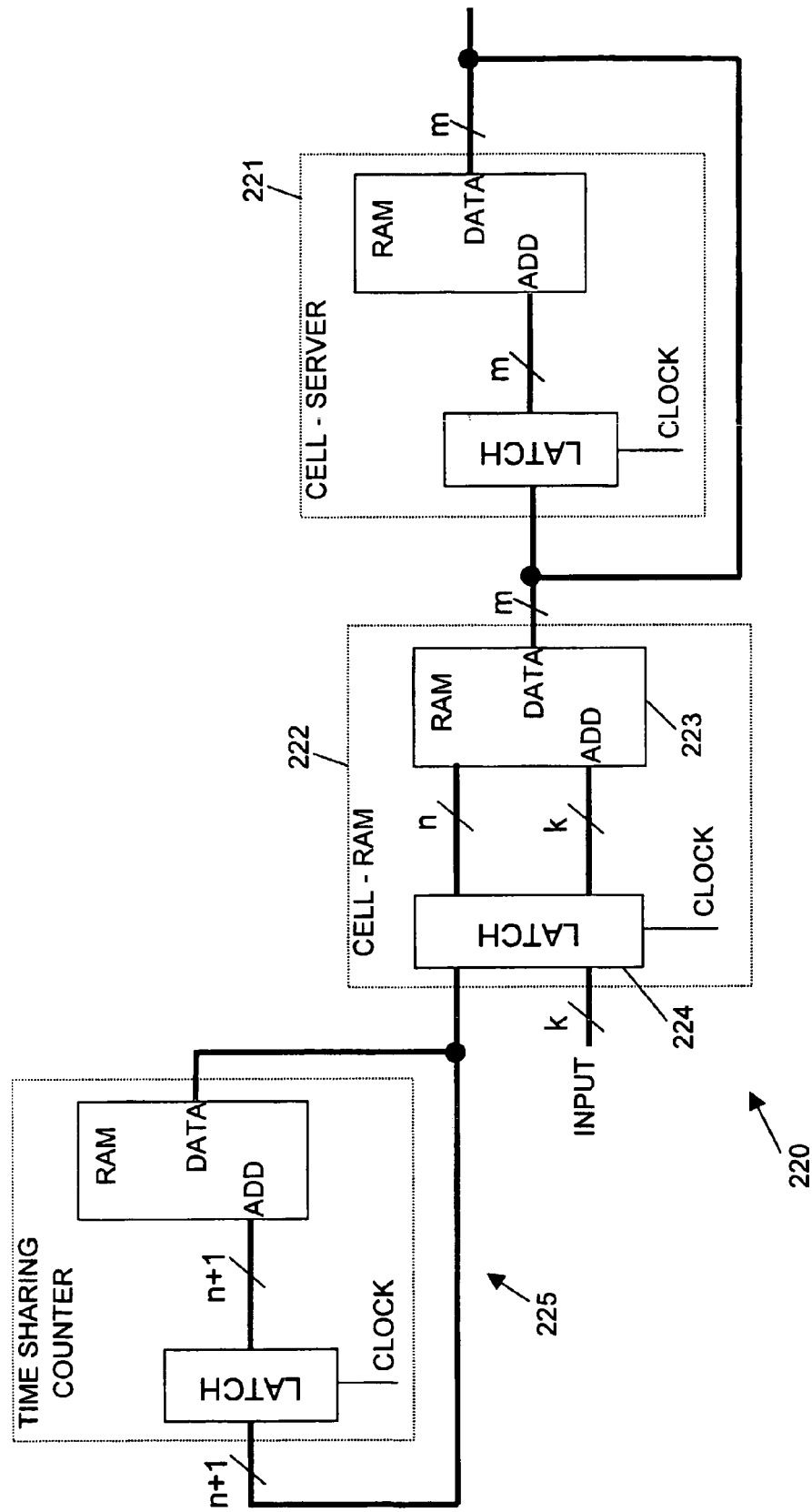
FIG. 21 shows schematically a RAM-Server combination operating in a time-sharing application environment.

FIG. 21 shows a "RAM-Server" combination 220 operating in a time-sharing environment to implement the example described above with reference to FIG. 15. The RAM-Server combination 220 comprises a Cell-Server 221 and a Cell-RAM 222 having a RAM 223 and a latch 224, which function as explained above with reference to FIG. 15 of the drawings. A global time-sharing counter 225 is routed to the Cell-RAM only. As an example, time-sharing is added to the RAM-Server 190 described above with reference to FIG. 15 of the drawings to allow separate areas of the RAM in the Cell-RAM 222 to be dedicated to respective time-sharing slots.

The following operations occur:

(a) The global counter 225 is incremented, its 'n' MSBs defining the current slot, which defines the area (i.e. the 'n' most significant bits of the address) within the RAM 223 from which data is to be read.

(b) The number stored in the RAM 223 at the memory location within the defined area pointed to by the 'k' least significant bits of the address fed by the latch 224 to the RAM 223. The "Server" 221 is programmed to increment the number.

(c) The incremented number is stored in the Cell-RAM 222 at the memory location thereof addressed by the value of the time-sharing counter and the latch input.

This repetitive operation can be done in two cycles as the write can be done in the same cycle as a new byte and the time-sharing counter are latched.

EXAMPLE 11

Creating Cells with a Larger Amount of Data Bits

Figure 22:
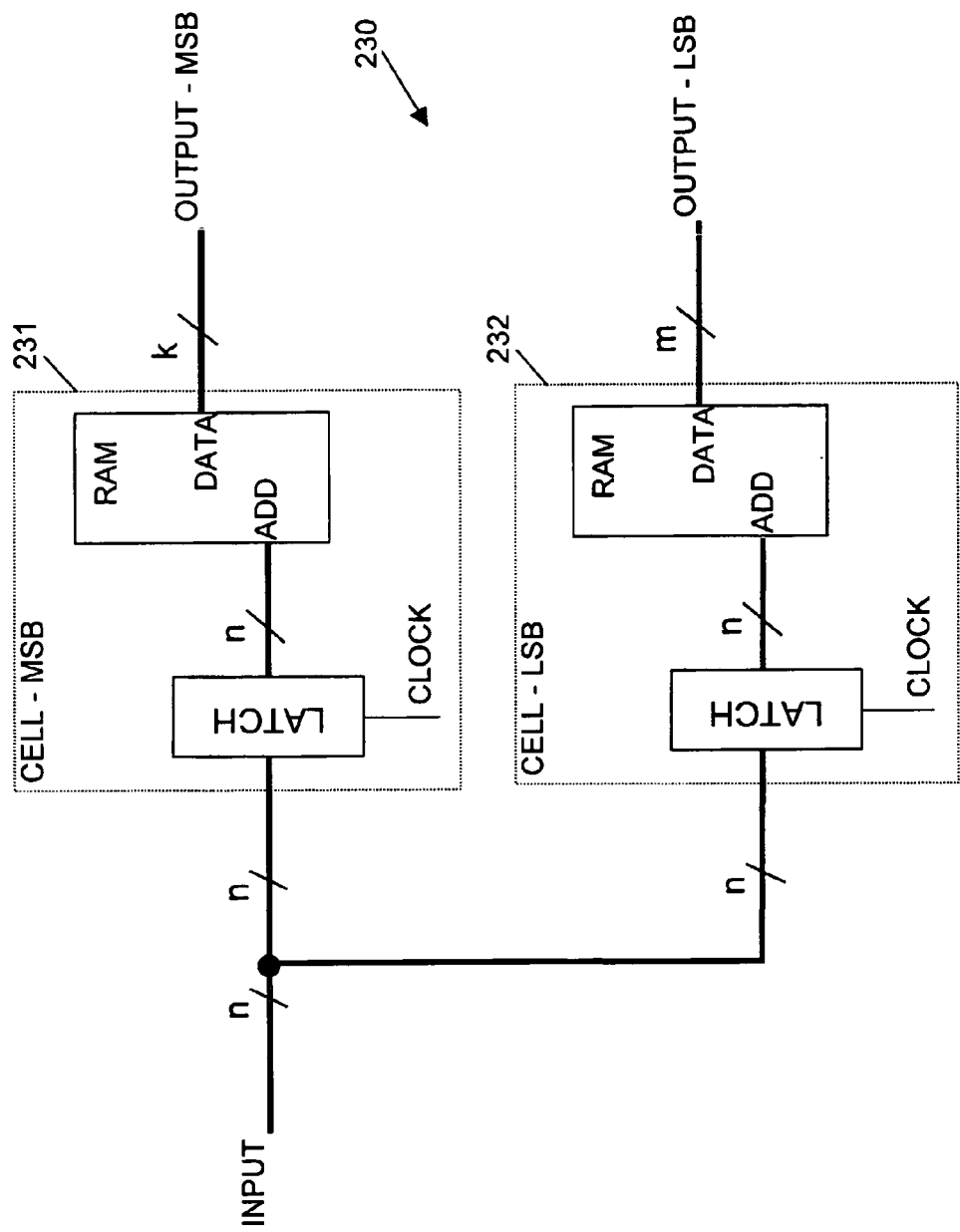
FIG. 22 shows schematically the connectivity required to create a cell formed from two cells so as to have a larger data bus.

It has been explained above with reference to FIG. 6 how a cell can be formed from two cells in order to increase the size of the cell's address bus. FIG. 22 shows how a cell 230 can be formed from two cells 231 and 232 in order to increase the size of the cell's data bus. The address buses of the two cells 231 and 232 are connected in parallel, whereby the address of both cells 231 and 232 is identical. Both cells 231 and 232 are programmed so that the result of a desired function is divided between the two cells. If necessary, the address buses of more than two cells can be connected in parallel, each being programmed to handle different portions of the function output. All the connections are made utilizing the programmable matrix. Note that if the matrix shown in FIG. 9 is used, there are many ways to create the required connections utilizing the matrix. If the cells to be linked are connected to the same saturated matrix in the 'X' column, the connection can be made directly in that matrix, saving matrix resources by not using switches from the 'Z' or 'Y' switches. The connection could also be made in the 'Z' column, saving again, or the connection could be made in the 'Y' column.

Strictly, it may be argued that adding data bits to a cell all of whose data bits are already being used cannot be achieved by increasing the cell size since the data is actually split between more than one cell. However, no distinction is made between the constituent cells of a composite cell and an equivalent larger cell.

The Load Operation

There are several ways to load the code into the cells. For example, the matrix may be programmed in such a way that the whole device is configured as one RAM. Data may then be loaded into this RAM by a host computer or other electronic implementation the same way any memory is to be written into, whereafter the matrix may be programmed again to effect the required connectivity.

Figure 23:
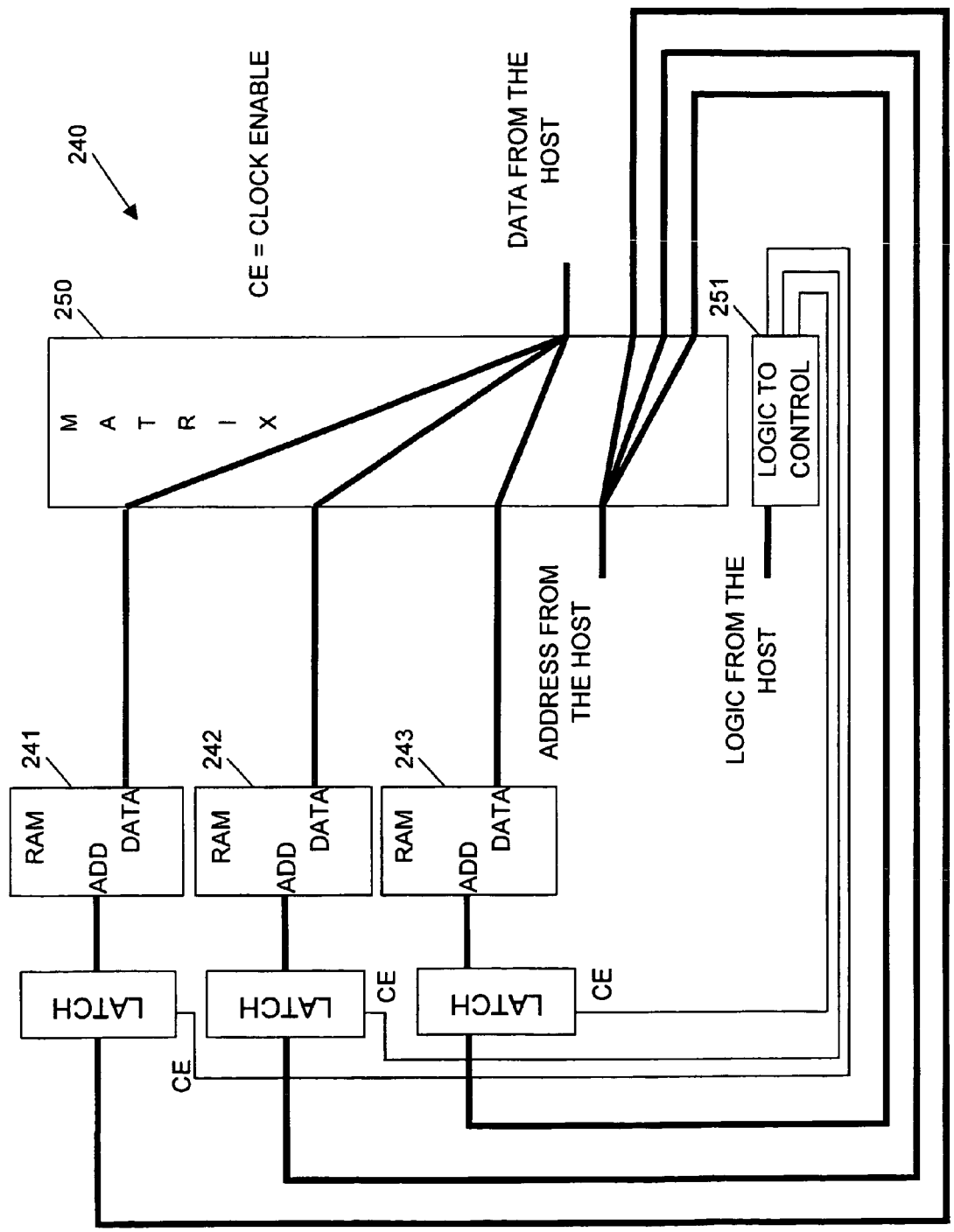
FIG. 23 shows schematically the connectivity required during loading of the cells with data.

FIG. 23 shows schematically a device 240 configured for having data loaded therein in the case where the host computer (not shown) is unable to map all the address space of the RAM or for debugging purposes. To this end, the device is broken down into several RAMs of which three are shown denoted 241, 242 and 243 and respective latches 244, 245 and 246 and which are connected to the host computer via a programmable matrix 250. Auxiliary circuitry 251 is connected to the latches 244, 245 and 246 and is responsive to logic signals fed thereto by the host computer for feeding clock-enable (CE) signals to the latches.

The address and data bits of the matrix control memory (not shown) are connected to the pin-out of the device 240. This connection enables the host computer to program (control) the matrix 250, such that the host computer maps the memory of the matrix control memory into its memory range, and downloads the programmed connectivity data thereto, while the CE signals are used to "page" between the RAMs.

The pins that are used for the load can be the same pins used for I/O, for applications that do not involve switch changes. This is because when there is no write pulse to the matrix control memory, no change will be made to the switches' state. In such a case, the I/O pins must be disconnected during the load (i.e. switched out).

The auxiliary circuitry 251 is used to enable or disable the clock of the latches when debugging. If the Clock Enable (CE) signal is connected to the matrix 250, the auxiliary circuitry 251 is not needed as the Clock Enable (CE) signal can be routed via the matrix, allowing each cell to be clocked separately and the desirable state to be loaded.

There is no real-time consideration for this logic, as it is not typically designed to work in real-time. But if a real-time "Clock Enable" signal is needed, it is recommended integrating this into the "level 1 matrix".

Considerations for Choosing a Preferred Architecture

The size of the die is the critical parameter. The smaller the cells and the larger the block, the greater the flexibility, the better the usage and the better the performance, but the bigger is the matrix. To reduce the size of the matrix, levels are added. As noted above, a cell can be made out of other cells of lower level, although it should be noted that not all the cells in a level need to have this ability.

A first example of a possible architecture for 0.25-micron technology is 300 Cells of 4096 bytes (12 bits address, 8 bits data) in level one, and 64 cells of 512 bytes (9 bits address, 8 bits data) in each block of level 2. A second example is to form level 2 blocks also from 64 cells of 2048 bytes to 128 cells of 512 bytes. No more than 10 blocks are implemented in level 2. In level 0, all the cells are converted into one cell (one memory or one look-up table)

A third example of a possible architecture is based on 20 Cells of 64 KBytes in one level only. Again, since in level 0 all the cells are converted into one cell, in this example, the matrix is small and can therefore be saturated. These three examples demonstrate some differences between possible architectures. In these three examples the size of the die is about the same. In the first two architectures proposed the level 1 can be about 18 memories of 64 K byte cells only, but as there are a lot of smaller cells, the usage is better and the overall result is expected to be better for most applications.

Real Time Calculations Utilizing an Example for Cell Connection

In 0.25 micron technology, the cycle time of one cell is expected to be typically less than 10 nSec, which is thus taken as an example in the following calculation. All the cells are synchronized and work in parallel. Therefore, in 10 nSec each of the cells in the device performs one command. This means that if all of the parallel commands performed by the cells are considered as one instruction, the processing speed is 100 MIPS (100 Million Instructions Per Second).

Figure 24:
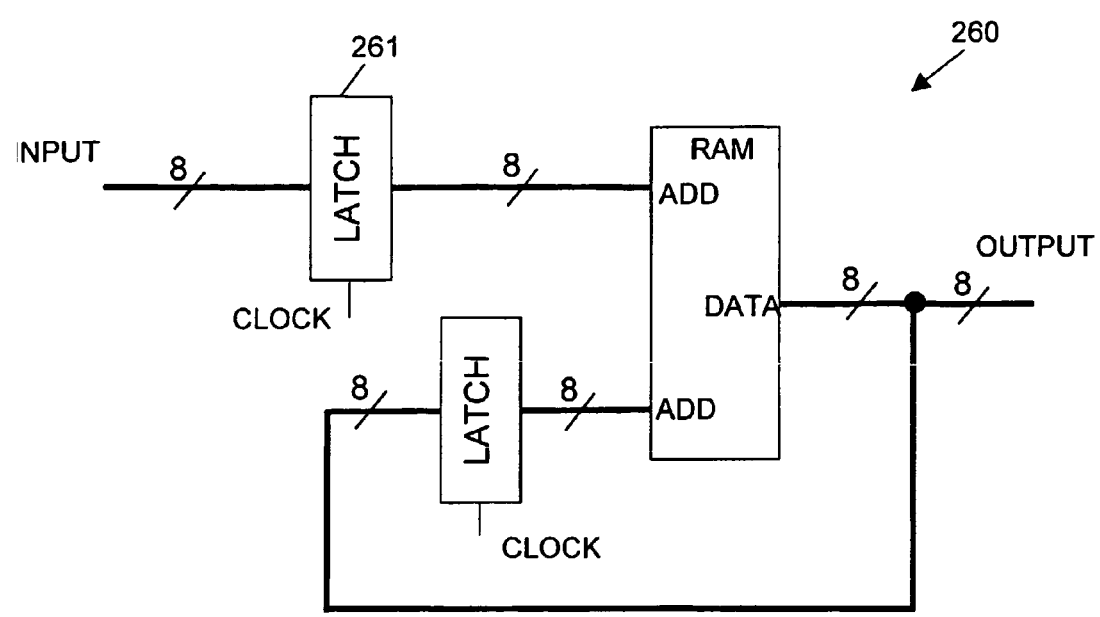
FIG. 24 shows schematically a device configured to perform an 8-bit command.

FIG. 24 shows schematically a device 260 that operates to perform an 8-bit command and serves to provide a better reference to the actual processing power based on commonly used calculations. In this configuration, the device 260 can perform an 8-bit command, input to a latch 261 and can relate to an 8-bit result of a previous command.

Assuming that in a 64 Kbyte architecture, 300 cells of size 4 Kbyte are converted to cells having a 16-bit (i.e. 64K) address bus and an 8-bit data bus, there will be 18 such cells leaving other spare cells that could be used for time-sharing and other small tasks. Assuming that each of the 18 cells can perform an 8-bit command, the complete device 260 can perform 1800 MIPS, where each instruction is of 8-bits. In practice, not all the cells are generally so large as 64 K×8, and there will be a larger number of smaller cells also performing commands in parallel, thus increasing still further the effective number of MIPS.

It should be noted that the higher the rate of operation (MIPS), the larger the delay may be owing to the larger number of cells. As an example, consider the noise generator described above with reference to the shift register shown FIG. 12. Only after 3n−1 cycles (i.e. if n=8, after 23 cycles) is the shift register full of the input bits, such that its output may be used as the required noise signal. Thus, assuming that each cycle is of 10 ns duration, the total delay is 230 ns. Thereafter, every 10 nSec there will be output a new noise sample. This kind of delay is normal in hardware and DSP implementations; for example, in an implementation of a filter.

Different Cell Configurations

In the foregoing description of the device, all the cells have included both a RAM and a Latch. Nevertheless, the device architecture may be implemented using cells of different construction to those described above. For example, if no feedback is needed, an application running on the device 100 (shown in FIG. 2) will run faster on the same device without the latches.

EXAMPLE 12

Standalone RAM Cell

Figure 25:
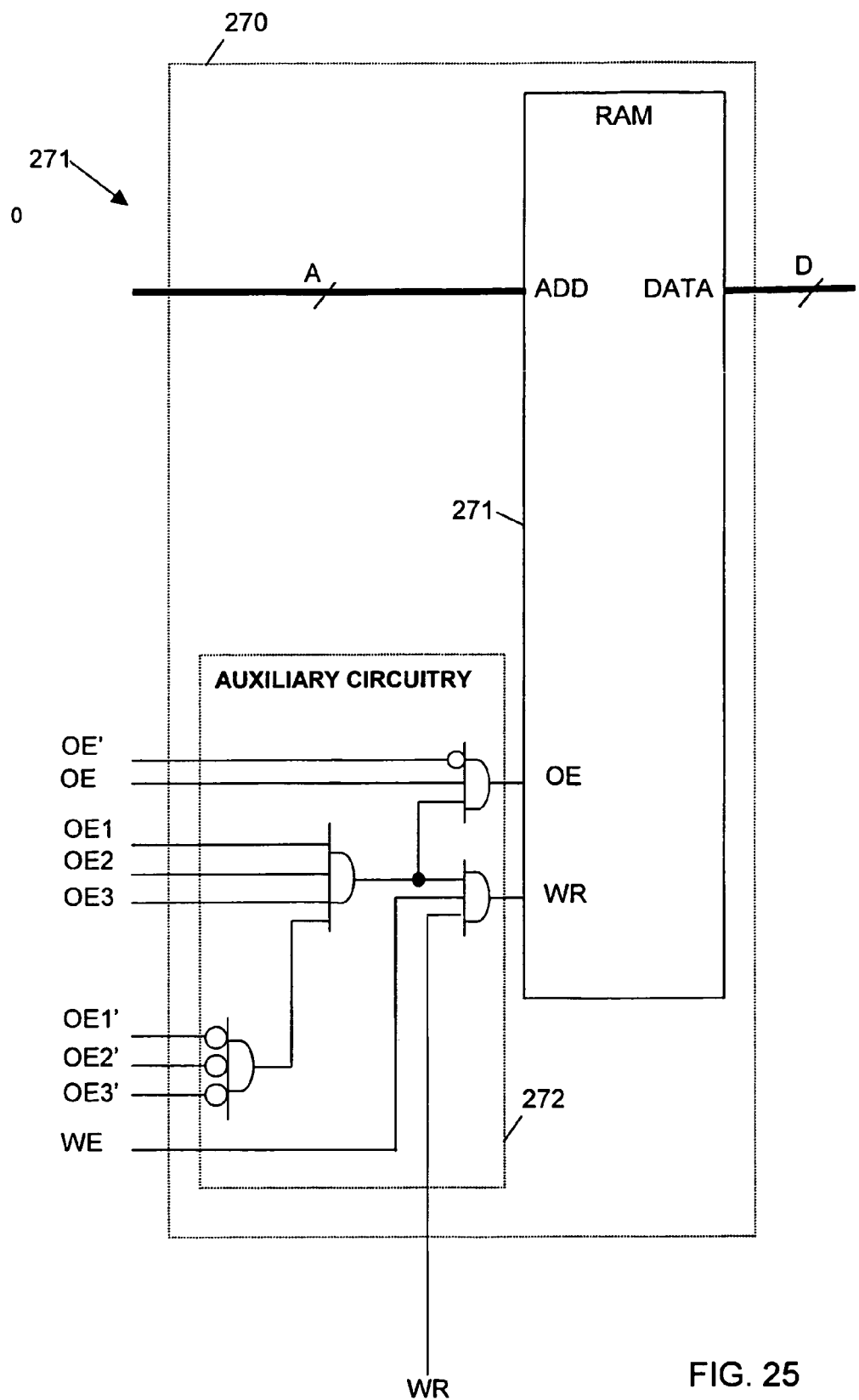
FIG. 25 shows a standalone RAM cell without a latch.
Figure 26:
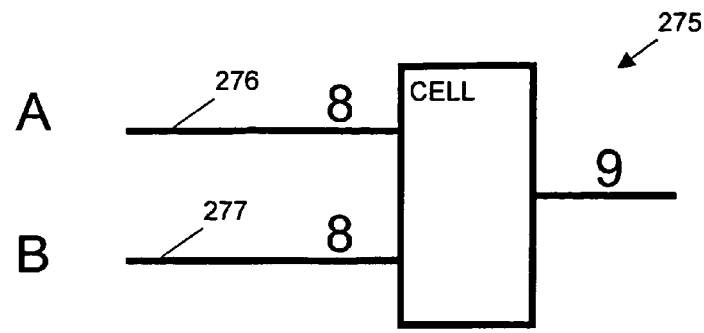
FIG. 26 shows schematically a non-optimized adder using the cell shown in FIG. 25.

FIG. 25 shows a cell 27u comprising only a RAM 71 and associated auxiliary circuitry 272 as described above with reference to FIG. 5. FIG. 26 shows an 8-bit adder 275 using such a cell and having a pair of 8-bit input data buses 276 and 277 for adding two operands A and B and a 9-bit output data bus carrying the result of the addition. In such an application, no timing is required since the output simply reflects the state of the two inputs A and B and therefore no latch is required.

The 8-bit adder 275 shown in FIG. 26 illustrates a basic solution, where the 9-bit sum of two 8-bit inputs are programmed into only a single RAM of the required size configured by the matrix. The application in such a configuration uses the equivalent of 64K of 9-Bit words of RAM. The solution can be optimized to reduce the amount of RAM used.

Figure 27:
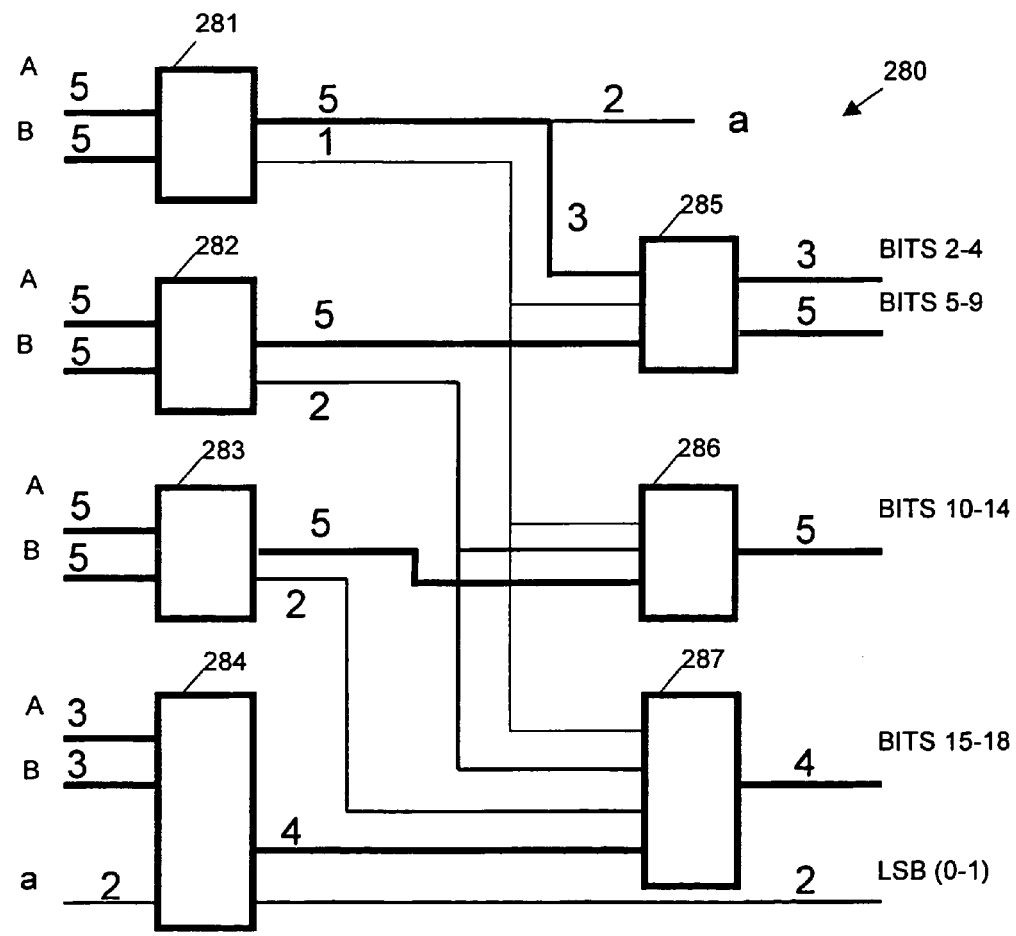
FIG. 27 shows schematically an improved adder using the cell shown in FIG. 25.

FIG. 27 illustrates a better-optimized adder 280 that adds two inputs each of 18 bits, and produces at its output a 19-bit sum. Instead of using a single RAM as shown in FIG. 26, a plurality of first-stage cells 281, 282, 283 and 284 are programmed to add the 18-bit inputs which, as is seen, are split into 5-bit and 3-bit component operands, and to generate one or two carry-out bits. The carries and the appropriate first stage outputs are then summed using appropriate second stage cells 285, 286 and 287. In such an arrangement, there is a two-stage delay between feeding the input operands and outputting the result, owing to the two stages used to effect the addition. However, LSB is fed directly via the first stage adder 281 and is not subject to additional delay. If it be required that it be subject to the same two-stage delay as the remaining bits, then it can be fed directly through the first stage adder 284 in order to subject it to one additional delay, and thereby match the delay of the remaining output bits.

Such a solution is suitable for both the devices described above with reference to FIG. 5 and FIG. 25. When the 18-bit adder is configured as shown in FIG. 27, the application uses the equivalent of less then 7 K bytes RAM, i.e. significantly less then the non-optimized 8-bit adder shown in FIG. 26, albeit that there is one more delay than in the non-optimized solution for the reasons explained above.

EXAMPLE 13

Device Formed of Constituent Components

In the previous examples of the delay or the shift register shown in FIG. 12, only the latch within the cell is utilized, there being no need for the RAM. In contrast to this, as explained above with reference to FIG. 25, there exist applications that require RAMs but not Latches. Therefore, some of the cells may be broken into their components so that each component may be used separately. The original cell construction can still be realized by combining the components using the matrix. If desired, a cell can include additional constituent components.

Figure 28:
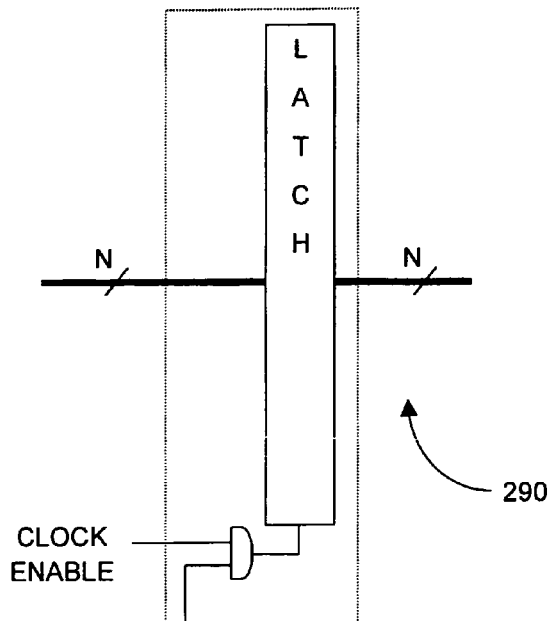
FIG. 28 shows schematically a latch that may be used independently of the RAM shown in FIG. 25.

FIG. 28 shows an example of a latch 290 that may be used independently of the RAM 270 shown in FIG. 25 but may be combined therewith, if required, to realize the cell shown in FIG. 5.

EXAMPLE 14

Device Having Independent Clocks

As explained above, a block may be considered as a device. Therefore, it is not essential to have one clock for the complete device, and each block may have its own independent clock. As also explained previously, the block may be converted into a cell, so that each cell may have its own independent clock.

If two blocks of different types are combined in one device, a clock may be provided for one block but not for the other. Therefore a number of clock inputs may be routed from the input of the device to any block or cell via the matrix to provide the full variety of clock responses needed.

EXAMPLE 15

Single Step Operation

The need for single step operation is for debugging purposes, allowing the state of the implementation to be traced for any step of operation. Such a feature allows a hardware application using the device according to the invention to be debugged in a manner analogous to the way software programs are debugged using debuggers. In the same way that a software program can be arrested whenever required, its variables traced and changed, and then restarted either from where it was arrested or from any other point in the program, the invention provides tools for debugging the hardware device in an analogous manner.

If a device is of the type that does not have a clock as in the adder shown in FIG. 27, for example, and the implementation does not have feedback, single step operation is achieved by single stepping the input. If the implementation does have feedback, only the steady states can be traced without using additional tools. Another possibility might be to use an address bit to direct the cells to another area of memory wherein the current status may be maintained.

If a device has a clock, and a single clock operation is needed, synchronization between the slow input control and the fast hardware response must be achieved. One possibility is to use a slower external clock as the clock for the device.

Figure 29:
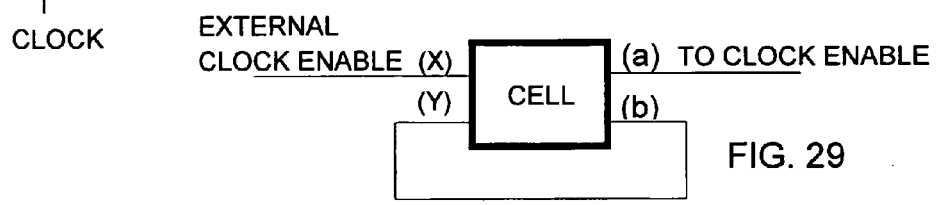
FIG. 29 shows schematically a device where a clock enable signal is used to adjust the effective clock rate.

FIG. 29 shows another solution where the clock cannot be fed externally, and the clock enable signal (CE) is used to adjust the effective clock rate. The cell is programmed to have the following states:

in the input (xy): x is the external CE signal, y is the feedback in the Output (ab): a is the internal CE signal, b=y is the feedback.

| Input<br>x y | Output<br>a b | |
|---|---|---|
| 0 0 | 0 0 | no external clock enable, causing no internal clock enable |
| 0 1 | 0 0 | no external clock enable, causing no internal clock enable |
| 1 0 | 1 1 | start external clock enable, causing internal clock enable. |
| 1 1 | 0 1 | continue external clock enable, causing no internal clock enable |

This will ensure that for each long pulse of an external clock enable, only one pulse equivalent for a single clock pulse will be generated.

EXAMPLE 16

Double Buffer Memory

Most of the real-time applications described above are based on a fixed matrix cross-connect. The time to change the routing is too great for the continuous operation in real-time of typical device targets. However, new kinds of applications can be achieved by utilizing more than one device connected to a host. Consider, for example, a situation where there are connected to a host three devices each of which is to be programmed to carry out a required operation. The host computer has a memory, which stores the code that must be loaded into each device so as to allow it to operate. While one device is executing the application, a second is connected to the host as normal memory allowing previous results to be read therefrom or for new code to be loaded thereto, and at the same time the code for effecting the required connections and loading the required data may be loaded into the third device. Upon completion of an application by the currently running device, the states of each device changes, and the host is connected to the device that has just finished its task for reading the result and loading a new implementation. By such means, each implementation may be effected in hardware which is much faster than can be done in a normal CPU using software, whilst the downloading of new data to the devices, which is time-consuming, is done in parallel with the operation of a different device and so represents a transparent operation not demanding any overhead in real-time.

Although several devices are used in the above implementation, the implementation could also be done using a few groups of cells inside the same device. If only two device groups are active, from the perspective of the host, which "sees" only memory, it is like a double-buffer hardware implementation.

This technique can be useful if very fast real-time computing is needed (as in configurable computers). The host computer will change the task to be implemented as needed on one device, while in the other device it fetches the result of the previous instruction.

A practical implementation of such an application includes at least one device each having an active and an inactive state. The host is coupled to each device and has a memory, which stores therein respective formatted data that must be loaded into each of the devices so as to allow the respective device to carry out a required operation when in the active state or to allow the host to load the respective device when in the inactive state. This allows a configurable computer to be implemented using at least two devices wherein the host is adapted to manage at least one task by activating as many of the devices as required for carrying out each task

EXAMPLE 17

Multiple "MCM" Architecture

Figure 30:
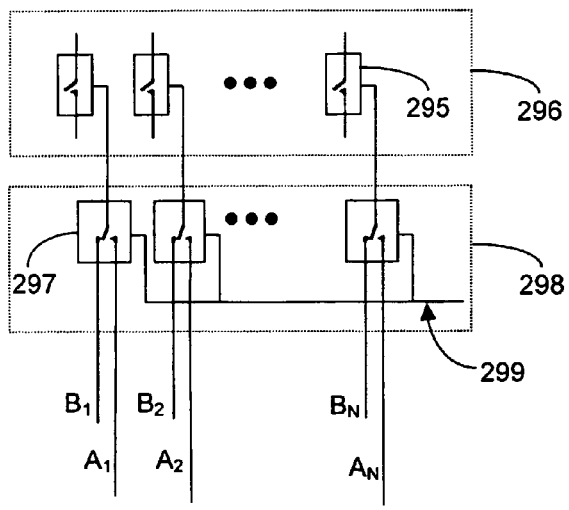
FIG. 30 shows schematically a multiple MCM architecture allowing fast switching between different states of the programmable matrix.

In the non-saturated matrix described above with reference to FIG. 9 and the example discussed above under the heading "Considerations for choosing a preferred architecture", there are about 1M switches. This means that the matrix occupies about 10% of the overall die area. FIG. 30 shows schematically a multiple MCM architecture that is constructed by providing an additional matrix control memory so that each switch 295 in the matrix 296 is opened or closed via a respective pair of switches in the MCM denoted as $A_1$, $B_1$, $A_2$, $B_2$ up to $A_N$, $B_N$, which are selected by a respective two-way switches 297 in a switch module 298 all operated by a single control 299 for multiplexing between each of the bits $A_1$, $B_1$, $A_2$, $B_2$ ... $A_N$, $B_N$ of the two matrix control memories. Each of the MCM's is loaded with data so as to define a respective connectivity, whereby different pre-configured connectivities can be implemented substantially instantaneously simply by operating the control so as to select a desired MCM, thus enabling faster real-time operation. This architecture also enables the reuse of the same cells in a device, so that they may be used to implement an application and as a memory of the computer. Timing or host computer instructions or application instructions (e.g. when the task has finished) may switch between respective periods when the cells serve the application ("working period") or serve the host as its memory. After each "working period", the host receives permission to access its memory.

This architecture will increase the collective size of the matrix and the matrix control components by a factor of about 4. Assuming that 0.25 Micron technology is employed, and there are 0.18 and 0.13 micron geometries currently available, this example is a feasible design.

This architecture can achieve the same usage as the double buffer memory described above in Example 16. Although in both Examples 16 and 17 described above, use of a host computer is described, a module utilizing the device can realize the same functionality.

Debugging Port

A port that is connected to the programmable matrix can view any cell output by routing the cell output via the matrix to the port. To view a cell input, a small free cell can be used (or a dedicated latch that acts as a cell). The data at that cell is set to transfer the input to the output as explained in the shift register of FIG. 12, and the output of the cell is then routed to the port.

This port can be set to view, in real-time operation, any input or output of the entire device.

Notes:
1. In most cases there is no need to view the input of the cell as if this input is connected to any output, the output can be routed to the port. If the port is connected to the I/O pins of the device—it can be routed to the port by the matrix.
2. For lower levels: only the "Ports" of the lower levels can be view in real time at the I/O pins.

Single Step

To stop the device from running, all that is needed is to stop the clock to the cells. If any of the logic manipulation is captured, and the user sets this logic to stop the operation of the hardware in the In Circuit Emulation mode, the application stops. If the user wants, the matrix control memory can be changed to force the matrix to route any cell into the I/O pins. It also can be converted into memory and be read as a normal memory. In this way, any single logic bit in the whole device can be viewed. After the test, the matrix control memory can be set back to its original state and the operation may continue from the same point it stopped.

Notes:

When the simulation stops, any single logic bit in the whole device can be viewed, including those in lower levels, as if that level is converted into memory, all the output cells are connected to the port of the level. The bits to be viewed are chosen by the address of the newly created memory.

Technology Adaptation

The semiconductor industry's ability to integrate more and more functions on one chip increases all the time. The technology of the device is based on cells and the more cells that are used, the greater is the application's capability. As the architecture is such that cells may be combined to form bigger cells, the following methods assure that any implementation will automatically work on new technology when greater die utilization is available:
1. Do not decrease the number of cells.
2. Do not increase the cross connection limitation of the matrix (i.e. in the above example shown in FIG. 9—do not reduce Z).
3. Small cell size may be replaced with bigger cell size.
4. Lower levels may be added (add levels for smaller cells). It should be noted that cells in the lower levels can be converted back to higher cells.
5. Do not increase the clock cycle period.
6. Blocks of cells may be moved from lower levels to higher levels, thus requiring that the matrix size be increased.
7. Do not decrease the number of input pins.
8. Do not decrease the number of output pins.

In fact, it transpires from the foregoing that if the technology improves, no device capability should be reduced. Keeping this in mind ensures that any application can automatically be compatible with the new technology. It should also be noted that since, in the simulation the functions are divided into cells, the simulation itself does not change. However, the loaded program has to be changed as both the memory structure (of the matrix control memory) and the "memory image" of the whole device changes. In other words, all that is required is that the data that is loaded into the cells must be reformatted.

Testing the Hardware.

The implementation does not need to be tested in order to make sure that the hardware will work properly. To test all the RAMs, the entire device is converted into one RAM, and all its locations are checked using read/write operations as is done in conventional memory. For example: "00", "AA", "55", "FF", "Address in data" etc. The matrix connections are now checked by connecting signals via all the possible connections. In the same manner, all the I/O pins are checked.

The above is an illustration of the ability to test all of the hardware without the application. There are other ways to do this. For example, the signals could be generated internally using the pattern generator and tested by the device itself.

Standalone Card

When a standalone card is needed, for example, if no host is available, the same solutions that are common in the DSP field are good here. For example:

Erasable Programmable Read Only Memory (EPROM)
1. An EPROM with the data for the matrix control memory and for the cells is installed on the card. Once the power is turned on, the device copies the matrix control data from the EPROM to the matrix control memory. The electronic circuitry implementation to copy from memory to memory is known in the art.
2. Once the last bit has been copied to the matrix control memory, the device looks like a single memory. The electronic circuitry now copies from the EPROM to the newly created memory. The cells are thus loaded with their data.
3. Finally, the electronic circuitry copies from the EPROM again to the matrix control memory to set the cross-connects needed for the application.

If the device architecture used is the same as discussed in the above examples under the heading "Considerations for choosing a preferred architecture", the EPROM size is about 10 M bits.

Other Solutions

The same way the EPROM is used, other solutions known in the art for example an EEPROM or a RAM with a back-up battery can be used. Integrating the EPROM into the device is not recommended as it considerably increases the device manufacturing cost.

Battery backup, directly for the device can be useful if it is to make sure that the battery is active only when the device is not active. Otherwise, the power dissipation is high.

Self-Perpetuating Application Development

As the hardware applications can be stored and reused as software code, each task that can be reused can be stored and be called when needed. For example, if a filter has been implemented and debugged, a program could ask for the filter parameters and generate the device code automatically. This means that the more the device technology is used, the larger will be the number of "off-the-shelf" task implementations available to work-groups and the shorter the time to market will be. Furthermore, the library of applications can still be used when the chip manufacturing technology improves as explained above.

Supplementary Components of the Device

Supplementary components that are not directly related to the device architecture may be provided on the device in order to:
1. Generate an internal clock for the synchronized clock and timings,
2. Enable the use of an external clock,
3. Create the timing for the "write cycle". This is a fixed timing as the write operation is enabled or disabled by the "Write Enable" coming from the matrix and the utilization of the Output Enable of the cell. Therefore, it can be driven from the master clock.
4. Buffer the I/O signals.

It is known in the art how to realize these functions.

Other Ways to Implement the Device

Some of the benefits of the device architecture are related to the fact that the cell input signals and the cell output signals such as shown in FIG. 5 are synchronized. However, some non-synchronized operations can be implemented. For example: consider that small cells are so fast that their cycle period is half of the normal cell cycle period. These faster cells could be connected in smaller blocks with a faster clock. As their cycle period is half of the normal cell cycle period, the output of these blocks can easily be synchronized to the remaining blocks.

Faster cells can be implemented on smaller cells at a higher level. Therefore, this kind of connection can fit into the overall architecture. In fact, in parts where no feedback is implemented, the latches of the cells are redundant. Only the last latch at the end of the non-fed-back cells is needed.

Likewise, there may exist applications where multiple latches can be used in cascade to provide a specified delay. Therefore, the cell may be realized in part by RAMs without associated latches and/or latches without associated RAMs. Where it is nevertheless required to associate a latch directly with a RAM, this can be done using the matrix as explained above. Although it is more complicated to use, and it may waste engineering time for the average engineer, it may be valuable if an expert group working on this kind of architecture is working to make new libraries for the benefit of all.

Simplicity

As the application is broken into small parts, it directs the application engineer to a simple solution, which is also simple to implement.

Parallel Exploitation of Human Resources

When one system engineer develops the outline of the solution, he or she can declare the functions that have to be made inside the function cells. Then each cell implementation can be coded independently. This means that if time to market is critical, then each cell implementation's code can be developed by a different engineer.

Flow Diagrams

Figure 31:
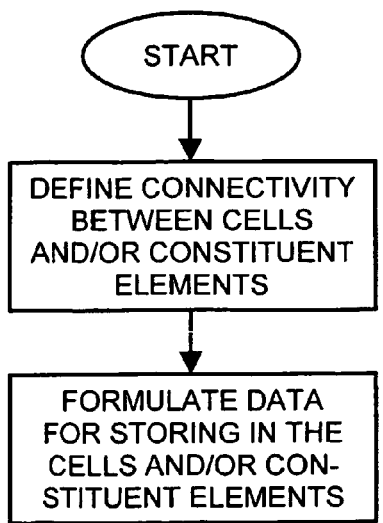
FIG. 31 is a flow diagram showing the principal operating steps used by a first method for deriving construction data for implementing the device according to the invention.

FIG. 31 is a flow diagram showing the principal operating steps associated with a first method for obtaining construction data define a functionality of a hardware application using the device according to the invention. By "construction data" is meant that data which represents a topology defining a connectivity between cells and/or constituent elements and including data for storage therein. As seen a topology is selected for implementing the desired application, after which data is formulated for storing in the cells and/or constituent elements defined by the selected topology.

Figure 32:
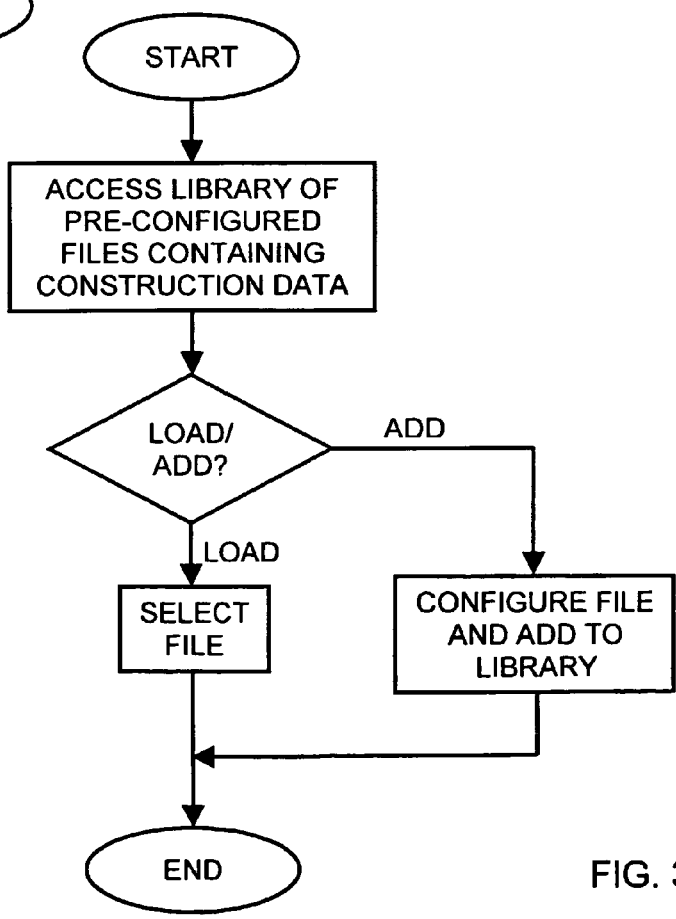
FIG. 32 is a flow diagram showing the principal operating steps used by a second method for using a library to extract and store construction data.

FIG. 32 shows an alternative approach for obtaining construction data that defines at least partial functionality of a desired hardware application, using the device according to the invention. A library is accessed storing pre-configured files each containing construction data relating to a respective functionality, and one or more files are selected from the library for realizing one or more functionalities of the application. Optionally, construction data obtained previously may be saved in the library either adding functionalities not included in the library or replacing existing construction data therein. The construction data thus stored in the library in conjunction with the device defines a device architecture that realizes a desired functionality or partial functionality of the application. For example, a 12-bit adder might be constructed from a 10-bit adder whose construction data is stored in the library in combination with the necessary additional construction data. If required, the construction data of the resulting 12-bit adder may then be saved in the library so as subsequently to be available as a standard feature. This allows a library of pre-designed construction data to be re-used thus obviating the need to create the same construction data repeatedly for each application. Thus in the above example, the construction data for the 12-bit adder having been created once may be stored, thus obviating the need for the designer to re-design this functionality each time a 12-bit adder is required. This not only saves considerable design time, but also, no less importantly, allows expert designers to design optimized solutions and to make these solutions available to a community of designers. This facility is also of use to work-groups allowing members to swap designs, through the Internet for example.

Figure 33:
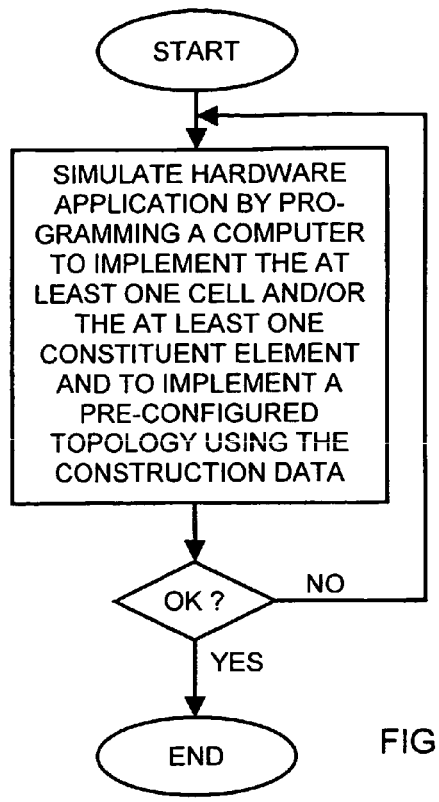
FIG. 33 is a flow diagram showing the principal operating steps used by a third method for deriving construction data for implementing the device according to the invention.

FIG. 33 shows yet another method for obtaining construction data, where a computer simulation of the hardware application is run by programming a computer to implement the at least one cell and/or the at least one constituent element and to implement a pre-configured topology using the construction data. The construction data may be changed, as necessary, and the simulation repeated until the computer simulation is satisfactory. The hardware application may then be implemented by downloading to the device data derived from the simulation construction data. As noted above, the computer may be programmed using a high-level programming language, thus making skills that are conventionally the province of expert design engineers now available to programmers. Moreover, the program merely serves to define the construction data: once a functional implementation of the application is available, and the data downloaded to the cells thereof, the manner in which the data was defined is no longer of relevance. This means, that an operational device will function with equal efficiency regardless of whether the program code used to construct and download the data thereto were optimized or not.

When programming the computer to run the simulation, the simulation construction data may be derived in two ways. According to one approach, instantaneous samples of at least part of the simulation construction data are continuously calculated on the fly by the computer. However, according to a different approach, at least part of the simulation construction data is pre-configured and stored and instantaneous samples thereof are fetched as required by the computer. Such an approach avoids the need to calculate the simulation construction data in real time, since the data is predetermined and fetched thus significantly reducing the number of computer opcodes required to derive the construction data.

Figure 34:
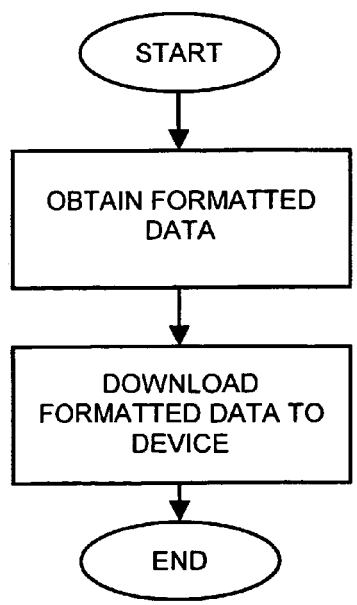
FIG. 34 is a flow diagram showing the principal operating steps used by a method for implementing the device according to the invention.

FIG. 34 is a flow diagram showing the principal operating steps associated with a method for implementing a hardware application using the device of according to the invention. At its most basic, formatted data is obtained and is downloaded to the device. The formatted data may be derived from predetermined construction data and then formatted for downloading to the device. The construction data itself may be obtained using either of the approaches described above with reference to FIG. 31, 32 or 33.

The Simulator and Tools

The following examples deal with each synchronized plurality of cells as standalone entities. The integration of these entities is achieved as is known in the art.

The Simulator

In a normal implementation, signals are input into the application, the signals are manipulated and, as a result, signals are output from the application. In a simulation, "virtual" signals are input into a computer program that simulates the function of the implementation, and generates "virtual" output signals. It is quite complex to simulate complicated implementations. The difficult part is to simulate the delay between the signals as the resolution of the computer "time" is fixed. The better the resolution of the simulator, the slower the simulation.

Since all the cells are synchronized, there is no problem simulating the exact function of the hardware the same way it operates in reality. Each cell in an application constructed using the device according to the invention performs a task. The task can be implemented as a conversion table (look up table). The task represented by the table data can be written in a high level programming language. The collection of all the data stored in the different tables is called the device code.

EXAMPLES

There now follow several examples using the "C" language as pseudo code, it being understood that any other programming language could be used.

An example for any task implementation would be:

```
// Table generation:
.
.
.
#define CELL1_SIZE     256    //(Any available cell size)
int iCell1(int iAddress);
.
.
.
int iTableOfCell1[CELL1_SIZE], iAddress;
.
.
.
for (iAddress=0; iAddress<CELL1_SIZE; iAddress++)
{
    iTableOfCell1[iAddress] = iCell1(iAddress);
}
// At this point iTableOfCell1[] holds the code for the cell being the data
    // stored in the respective storage elements thereof
    .
    .
    .
    The data of the cell is implemented separately by the function
int iCell1(int iAddress). For example, the data for the counter described
above with reference to FIG. 10 could be implemented in "C" as follows:
    // Cell code generation:
    #define MODULO       123
    .
    .
    .
    int iCell1(int iAddressForCell1)
    {
        int iDataOfCell1;
        iDataOfCell1 = iAddressForCell1+1;
        if(iDataOfCell1 >= MODULO)
        {
            iDataOfCell1=0;
        }
        return iDataOfCell1;
    }
```

As the tasks are performed using software, the same code implementing cell functionalities can be used in the simulator and in the generation of the data to be downloaded to the device. Since in each cycle of the hardware implementation only one operation is done in a cell, the operation can be "one to one" simulated on the computer. In order to simulate the operations, all the operations should be included in a loop that simulates one hardware cycle.

For example, the code for the simulator could be:

```
// Simulation:
.
.
.
#define CELL1_SIZE    256
int iDataOfCell1, iAddressForCell1;
BOOL bRunning;
iAddressForCell1=0;                       // Initialization
bRunning=TRUE;
while(bRunning)
{
    iDataOfCell1 = iCell1(iAddressForCell1);
    // View point. The data is ready and can be manipulated and shown
    // on the screen
    iAddressForCell1 = iDataForCell1         // Matrix operation
    .
    .
    .
}
.
.
```

The following differences between this code and the previous code should be noted:

1. The matrix operation has been added; instead of incrementing the "Address", the "Address" gets the new value from the data.
2. The data is not collected into a table element. The data only reflects the single operation, which is done in a cycle.
3. A few cells could be implemented in the same way, and in the same loop. In this example, the matrix operation for all the cells should be moved to the end of the loop.

Therefore, it is quite easy to automate the process and make the simulator generate the loadable data called for by the device code "on the fly". When the simulation works in this manner, it is said to operate in "Compiled Mode".

It is important to note that all the code that has to be changed by the user, i.e. the code for the cells and for the matrix, is the same for the simulator and the loaded data. Consequently, not only can the simulator perform a "one to one" simulation of the application, but moreover, if the simulation works properly, it is an automatic procedure to create the loaded data without additional human error.

The device code is a table of Address-Data relations. In order to make the simulator run faster, the device code as represented by the tables, can be pre-calculated and used as conversion tables by the simulator, thus obviating the need for the simulator to calculate the table value "on the fly" and saving opcodes. When the simulation works in this manner, it is said to operate in "Real Mode". In this case, the code would be generated like this:

```
// Simulation:
.
.
.
int iCell1(int iAddressForCell1);
.
.
.
#define CELL1_SIZE   256
int iDataOfCell1, iAddressForCell1;
int iTableOfCell1[CELL1_SIZE];
// Create the cell1 table before the simulation starts
```

```
for (iAddressForCell1=0; iAddressForCell1<CELL1_SIZE;
iAddressForCell1++)
{
    iTableOfCell1[iAddressForCell1] = iCell1(iAddressForCell1);
}
.
.
.
// The simulation
iAddressForCell1=0;                    // Initialization
while( bRunning)
{
    iDataOfCell1 = iTableOfCell1[iAddressForCell1]; // A table instead
    of function
    // View point
    iAddressForCell1 = iDataOfCell1        // Matrix operation
    .
    .
    .
}
.
.
.
```

The two simulation approaches may be used in combination. Thus, one cell can be simulated by calculating the cell data "on the fly", while another cell can fetch pre-calculated data. It is easier to debug in the "Compiled Mode" but it is faster in "Real Mode".

By way of example, the Cell code generation might appear as follows:

```
// Cell Size Declaration, file name: "CellSize.C":
.
.
#define CELL1_SIZE    256    // (Any available cell size)
#define CELL2_SIZE    16384  // (Any available cell size)
.

#define CELLn_SIZE    4096   // (Any available cell size)
.
.
// Cell code generation for iCell1, file name: "Cell1Generation.C":
.
.
int iCell1(int iAddressForCell1);
.
.
#include "Cellsize.C"
.
.
int iTableOfCell1[CELL1_SIZE], iAddressForCell1;
.
.
for (iAddressForCell1=0; iAddressForCell1<CELL1_SIZE;
iAddressForCell1++)
    {
        iTableOfCell1[iAddressForCell1] = iCell1(iAddressForCell1);
    }
.
.
// Cell code generation for iCell2, file name: "Cell2Generation.C":
.
.
int iCell2(int iAddressForCell2);
.
.
#include "Cellsize.C"
.
.
int iTableOfCell2[CELL2_SIZE], iAddressForCell2;
.
```

```
        for (iAddressForCell2=0; iAddressForCell2<CELL2_SIZE;
iAddressForCell2++)
        {
            iTableOfCell2[iAddressForCell2] = iCell2(iAddressForCell2);
        }
    .
    .
    .
    This code should be implemented for each cell, while the function code
(Cell1(int), Cell2(int) . . . Celln(int)) is implemented separately.
    By way of example, the simulator code generation might appear as
follows:
    // Simulation:
    .
    .
    .
    // Create the cell1 table before the simulation starts:
    // Cell code generation:
    #include "Cell1Generation.C"
    #include "Cell2Generation.C"
    .
    .
    .
    #include "CellnGeneration.C"
    .
    .
    .
    int iDataOfCell1, iAddressForCell1;
    int iDataOfCell2, iAddressForCell2;
    .
    .
    .
    int iDataOfCelln, iAddressForCelln;
    .
    .
    .
    BOOL bRunning=TRUE;
    .
    .
    .
    // The simulation
        iAddressForCell1=0;                       // Initialization
        iAddressForCell2=0;                       // Initialization
    .
    .
    .
    iAddressForCelln=0;                           // Initialization
    while(bRunning)
    {
        iDataOfCell1 = iTableOfCell1[iAddressForCell1];    // REAL mode
        iDataOfCell2 = iTableOfCell2[iAddressForCell2];    // REAL mode
        iDataOfCell3 = iCell3(iAddressForCell2);           // Complied mode
    .
    .
    .
        iDataOfCelln = iTableOfCelln(iAddressForCelln);    // REAL mode
    // View point
        iAddressForCell1 = iDataForCellk                   // Matrix operation
        (see note)
        iAddressForCell2 = iDataForCellm                   // Matrix operation
        (see note)
    .
    .
    .
        iAddressForCelln = iDataForCellp                   // Matrix operation
        (see note)
    .
    .
    .
    }
    .
    .
    .
```

Note:

The iAddressForCelln may be only part of the actual address of the cell. The matrix may connect part of the data to part of the address (per bit connection). It is obvious that these matrix lines can be separated to a different included file, subroutine, or class, to be used by the host converting this matrix operation into the "Matrix Control Memory" data.

The Simulation Speed

The following discussion relates to the comparison between the speed of the device and the speed of the simulation implementing the same functionality. To remove the speed factor of the computer running the simulator from the speed estimation, the following discussion will consider that the computer operates at the same speed as the device.

Compiled Simulator Mode

To simulate the application, each of the cells dedicated to implementing a specified function should be simulated for implementing a required algorithm. In the following, the 300 Cells are selected according to the architecture described above under the section heading "Considerations for choosing a preferred architecture". Therefore, as the device cells are working in parallel and the simulator is working step-by-step, the simulator works at least 300 times slower than the device hardware. In the "Compiled Mode" as defined above, the cell data is calculated by implementing the specified function while the simulator is running. Even a simple function is implemented using typically at least 30 opcodes, thus slowing the simulation by a factor of at least 9000 relative to the hardware. Now, add the generation time for the input signal and the manipulation time of the input and the output viewed signals, and the factor will be higher. This means that any technique that can increase the simulation speed is important.

In practice, the simulation would run a lot slower, as the computer would be slower than the hardware and the subroutines called for in the cell functions would be a lot bigger.

Nevertheless, as there is limited number of operations to simulate (in the preferred architecture referred to above accommodating 300 cells), the simulator is expected to run a lot faster than hitherto-proposed simulators.

Real Mode

In "Real Mode" the data to be stored in the cell is calculated prior to running the simulation and during the simulation is used to carry out the desired algorithm to be implemented by the cell. By such means, the number of opcodes required to effect the simulation may be greatly reduced and the simulator runs much faster. For this reason, running the simulator in "Real Mode" is a lot faster than the basic factor of 30, since:

1. The bigger the subroutine for the cell function, the greater the speed saving.
2. The bigger the cell, the greater the savings. The reason is that bigger cells combine a number of cells and reduce the total number of cells to be simulated. It takes the same time to simulate a big cell or a small cell in "Real Mode".
3. Although a smaller number of cells increases the simulator speed in compiled mode too, since in most cases bigger cells utilize more code than smaller cells, this benefit may be lost.

In conclusion, the "Real Mode" may be expected to work dozens to several hundreds times faster than "Compiled Mode" in the high-end applications expected to be run on the device. This number is calculated by the average number of opcodes in a task of a cell multiplied by the average number of smaller cells used to create bigger cells in the application.

Emulator Mode

In emulator mode the simulation runs at the clock speed derived by "virtual signals" generation. The application could run in real time, but the "virtual signals" generated by the simulator set the maximum speed.

In Circuit Emulator (ICE) Mode

In the In-Circuit Emulation mode the simulator works in real-time.

Simulator Input and Output Signals

Signals are generated by cells in the device as explained above in Example 6 describing pattern generation. Equivalent signals can equally well be generated and manipulated by the computer and there is no difference between the manner in the signals may be generated or used in either case. Nevertheless, the computerized signals will be referred to as "virtual" signals and thus can be viewed on a display monitor coupled to the computer.

There are some advantages the user can achieve viewing the "virtual" signals:

1. Show the signals as they are (logic analyzer style).
2. Show the list of the data (list mode).
3. Convert the signals before viewing. For example, in Pulse Code Modulation (PCM), "A Law" (one of the PCM conventions) signal is such that each second bit is inverted. The user can invert the inverted bits before viewing, so it is easier to understand the result. The user may convert the PCM code into linear code, thereby rendering it even easier to understand.
4. The user can convert bytes or words into their "analog" shape and show them on the screen (scope mode).

The output signals are generated by the application. They can be manipulated the same way as the input signals.

Figure 35:
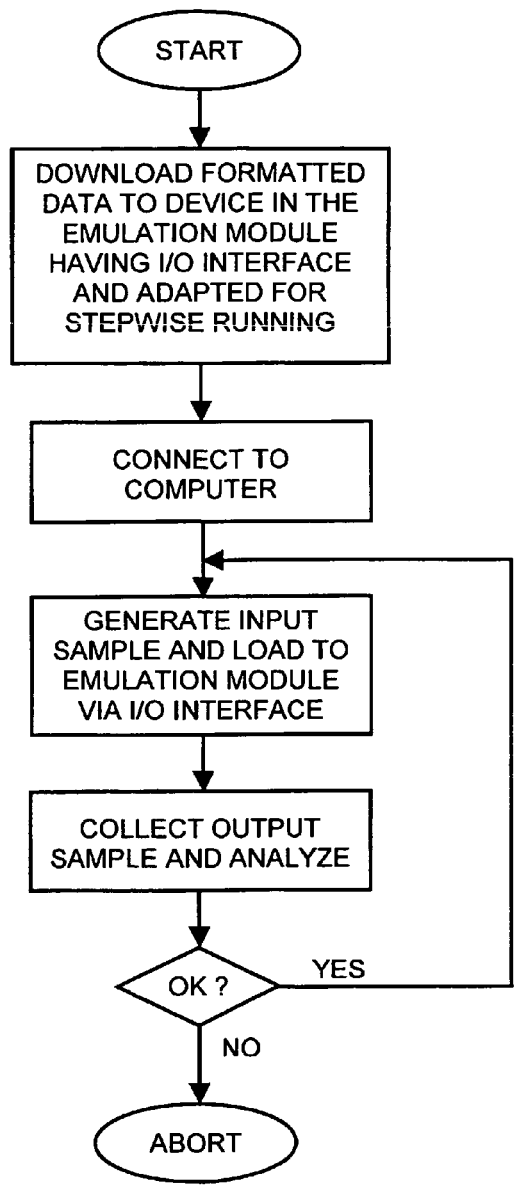
FIG. 35 is a flow diagram showing the principal operating steps used by a method for simulating an application using the device according to the invention.

FIG. 35 is a flow diagram summarizing the principal operating steps associated with a method for simulating a hardware device according to the invention. An emulation module that is adapted for stepwise running is constructed including the device and an I/O interface. Formatted data is downloaded to the device within the emulation module in order to create a desired hardware application, and the I/O interface is connected to a computer, which constitutes a control device and also participates in the emulation. An input sample is generated by the computer and loaded via the I/O interface to the emulation module. An output sample is collected for analysis from the emulation module via the I/O interface. In accordance with one approach, since the emulation module is setup for stepwise running, it awaits a subsequent input sample, which is authorized by the computer after the previous output sample has been analyzed and found correct. In accordance with another approach, the device in the emulation module will use some unused cells (possibly in another device dedicated to this purpose) to analyze the output sample in a manner identical to that for in-circuit emulation as is described below with reference to FIG. 36 of the drawings. The whole process is repeated as required, sample by sample. In an alternative configuration, a logic analyzer can replace the computer and a signal generator can generate the input sample.

Stepwise running of the emulation is required in order that the computer or other logic analyzer may have time to analyze the current output sample, and possibly abort further operation in the event of a fault, before the subsequent input sample is applied. The desired stepwise running can be achieved by externally feeding a clock enable signal so as to feed the clock signal to the application, and internally disabling the clock enable signal so as to prevent feeding of the clock signal pending override by the application.

The Emulators

A general-purpose emulator PC card with one or more universal hardware device(s) is implemented. The code is loaded into the device. The "virtual" input signals generated by the computer are transferred via the PC Bus (e.g. PCI Bus) to the card's inputs. A free part of the device or another device is programmed to capture a desired Logic State; being the same logic as for the logic analyzer, but as flexible as the user wants. The output is sampled back via the PC Bus and viewed on the user screen. The clock of the emulation card can be manipulated, slowed down, stopped or single stepped, if needed, to view the signal on the screen. The clock signal can be injected from the PC controlled by the software into the device external clock signal to have maximum speed and flexibility.

If long duration real signals that can last hours or more need to be input, then In Circuit Emulator should be used. The same general-purpose emulator PC card is used, but a port for the PC card should be implemented on the user card. This port will transmit the I/O signals into the emulator card. The emulator will store the input signals and perform logic manipulations on the output and input signals. Once the results of this logic manipulation is captured, the process stops (by disabling the clock) and the user can inject the stored signals into the simulator/emulator in order to debug the application.

Figure 36:
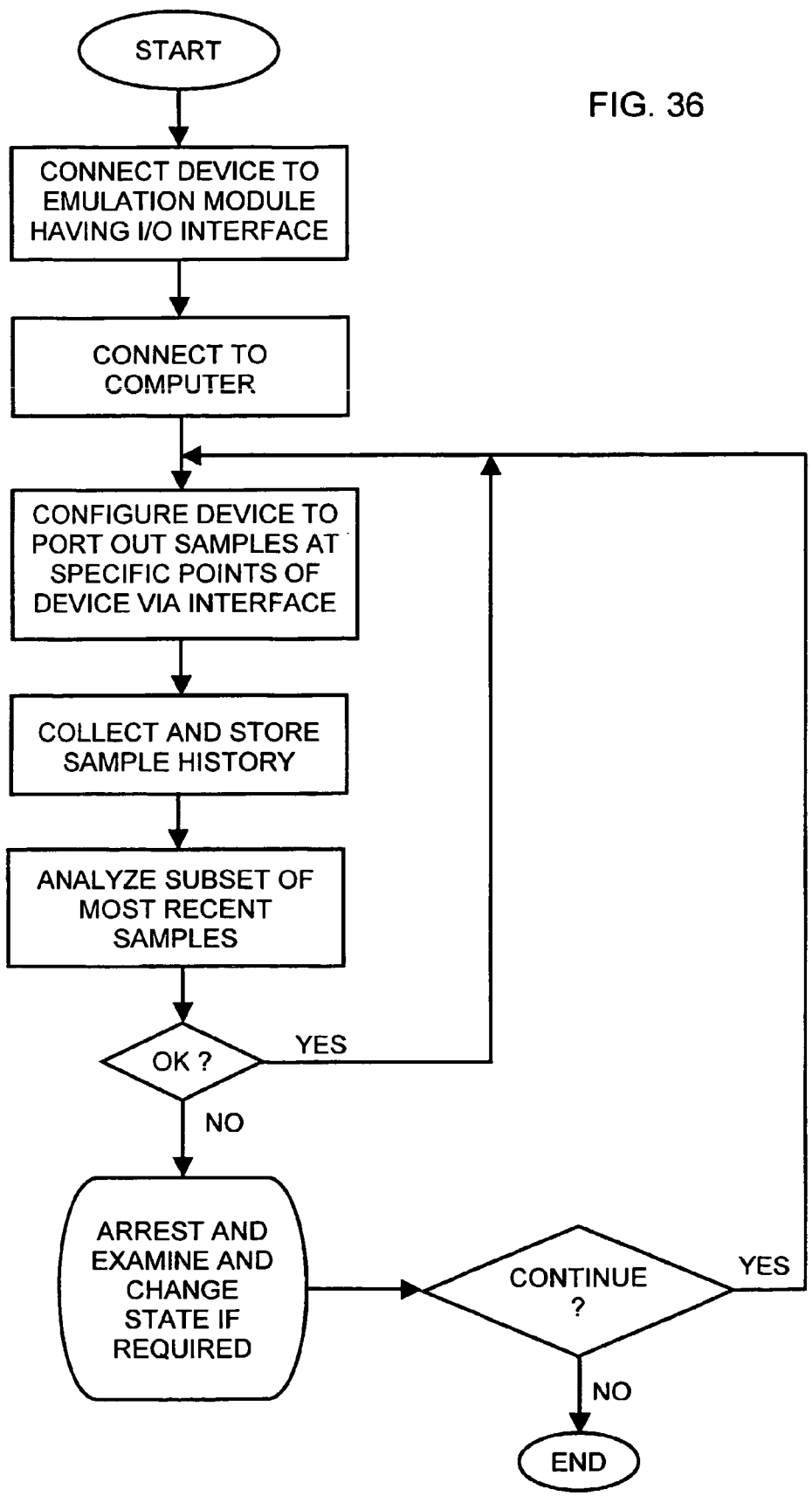
FIG. 36 is a flow diagram showing the principal operating steps used by a method for emulating an application using the device according to the invention.

FIG. 36 is a flow diagram summarizing the principal operating steps associated with an in-circuit emulation method for testing the device in the emulation module during real-time operation of the device. At least one of the I/O interfaces of the module under test is connected to a control unit, and the device is configured to port out samples at specific points of the device via at least one of the interfaces. The samples are sampled in the control unit so as to obtain in real time a history of samples of the device, and the control unit is used to analyze at least a subset of most recent samples. If necessary, operation of the device under test is arrested so as to allow any or all of the following:
 (i) examination of the history of samples of the device,
 (ii) examination of an instantaneous current state of the arrested device,
 (iii) download of a different state to the arrested device,
 (iv) continuation of the real time operation of the device, and
 (v) restarting real time operation of the device.

A Single Development Environment

The same development environment is used from the beginning of the process to the manufacturing stage. The development environment can replace expensive test equipment, as it is very easy to manipulate "virtual" signals in the PC software environment as explained under the heading "Simulation". It can be used as the simulator, emulator, and in-circuit emulator and it can be used as the program that checks the card in the manufacturing department.

Quality of the Customer's Code

The application engineer defines the solution, namely: what is to be programmed in each cell, and what should be the connectivity between the cells. Then, the code for the cells is written. The quality of the code, in matter of real-time, is not important to the quality of the "code" loaded into the device. For example, suppose the counter implementation shown in FIG. 10 uses the following code:

```
int iCell1( int iAddress )
{
    int iData;
    iData = iAddress+1;
    if (iData >= MODULO)
    {
        iData=0;
    }
    return iData;
}
and is changed to:
int iCell1( int iAddress )
{
    int iData;
    if(iData != iAddress+1)    // ?? Inefficient!!
    {
    }
        iData = iAddress++;
    }
    if (iData >= MODULO)
    {
        if (iData != 0)        // ?? Inefficient!!
        {
            iData=0;
        }
    }
    return iData;
}
```

Although the code in the second implementation is much slower, identical data would be loaded into the device. Thus, the product released to the end-customer is not influenced by a novice programmer.

The above feature may serve to increase the availability of designers since both software engineers and hardware engineers can perform the implementations. The systems engineer—the one who develops the solution—can be checked easily by using the simulation.

It should be noted that although the simulator would work more slowly in "compiled mode" with poorer code, the difference would not be noticed in combined mode as there is no difference in that part of the device utilizing the "real mode" (since the time to produce the tables is negligible).

Figure 37:
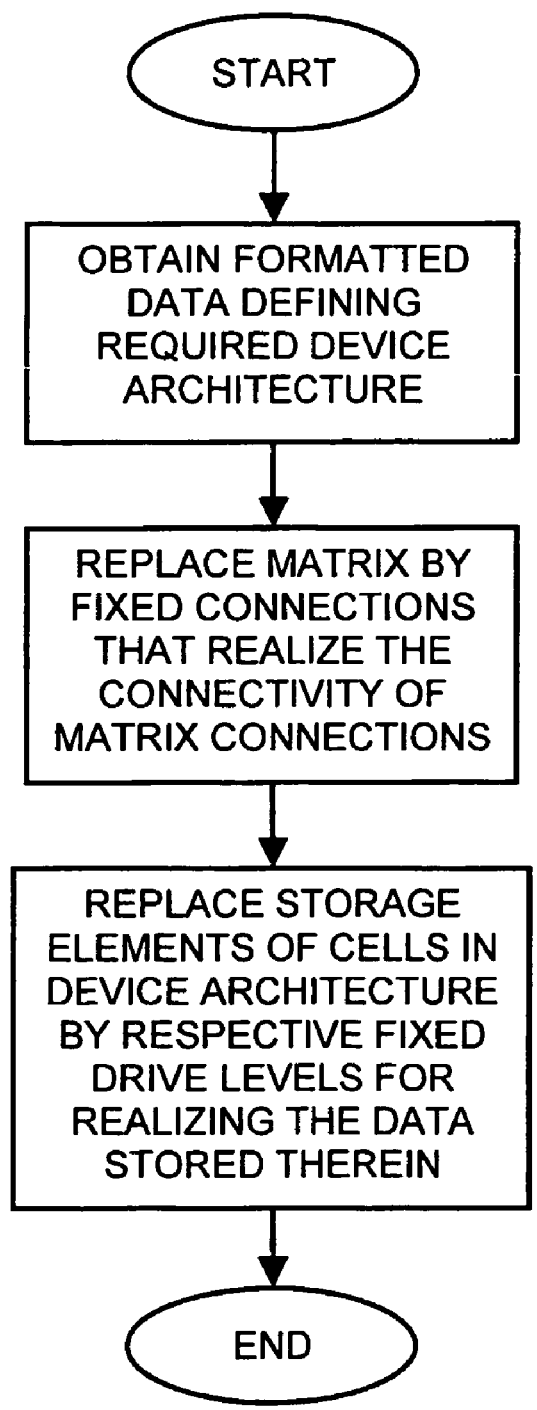
FIG. 37 is a flow diagram showing the principal operating steps used by a method for using the device according to the invention to facilitate ASIC design.

FIG. 37 is a flow diagram showing the principal operating steps associated with a method for designing an application-specific hardware device having a desired functionality. Formatted data is obtained, which in conjunction with the device according to the invention, defines a device architecture that realizes the desired functionality. The programmable matrix or matrices of the device architecture are replaced by fixed connections that realize the connectivity of the programmable matrix or matrices, and the storage elements in at least some of the cells in the device architecture are replaced by respective fixed drive levels for realizing the data stored therein. By such means, the architecture is rendered suitable for direct implementation of the application-specific hardware device.

Such an approach allows fast development of application-specific integrated circuits (ASICs), which may be preferred to the programmable device in order to reduce chip area for hardware applications that intended to be mass-manufactured. On the other hand, the device according to the invention is used only as an agent for designing the ASIC and obtaining the required formatted data, which is then modified. The ASIC is not itself a universal hardware device and is not programmable.

Thus, in ASIC conversion, each bit in each RAM that is used as application RAM is replaced with a "1" or a "0" driver. This will reduce the size of the RAM and convert the RAM to a non-programmable table. Any RAM that is used for storage is left intact. Although more savings can be achieved, it is usually recommended to do only as above, as the extra savings will increase the "time to ASIC" and will be more expensive. The above may be implemented as an automatic tool.

The following gives an example of the extra savings that can be achieved by using as ASIC to implement part of an application's functionality. An 8-bit Up-Down counter can be implemented using conventional methods with eight flip-flops and some logic. The same 8-bit counter Up-Down according to the invention is implemented in a 9-bit address and an 8-bit data cell requires 4096 bits of RAM. Notwithstanding the fact that superficially it may appear from this example that the invention is highly wasteful of memory, in fact, in a complicated application, the overall implementation achieved by the invention is a "die saver"; a counter conversion may save about 0.3 percent of the overall ASIC die size. As an example, it is estimated that the "Huffman Code" can be implemented for a full E1 communication line implementing the TX and the RX algorithm for each one of the 32 channels holding the adaptive tables per channel. This application may be implemented on about a 250 mm$^2$ die in 0.25 micron technology. Another example is an 8-bit, 8-tap FIR filter consuming less than 3 percent of the complete device. It should further be noted that the method of ASIC conversion according to the invention may be extended to allow some basic functionalities of the ASIC, such as the counter mentioned above, to be made available using conventional methods in the form of a library. In such case, by using pre-converted functionalities, the user can implement a better conversion without wasting the ASIC non-recoverable expense (NRE) time.

It may be desired to combine the flexibility of the universal hardware device with the advantages of ASICs, when an ASIC is to be mounted on a series of different circuit boards each having a different functionality. In this case, only part of the programmable matrix or matrices of the device architecture is replaced by fixed connections that realize the connectivity of the replaced connections, and the storage elements in only some of the cells in the device architecture are replaced by respective fixed drive levels for realizing the data stored therein.

Such a technique may be desirable for designing critical parts or for accommodating differences between implementations. For example, if telephony signaling is implemented—there are small differences between different countries.

Utilization of Faulty Chips

As the price of the chip is related to the size of the die, and about 250 mm$^2$ is considered quite large, the following method can reduce the chip price. As the device is cell-based and it is not relevant to the application which cell is being chosen to implement any given task, a device test will be performed. If a cell is found to be faulty the cell can be marked as faulty so as not to be used.

Then the matrix is tested. If a link is found to be faulty, that link should not be used. It should be noted that sometimes a faulty connection path will cause the loss of a cell, and sometimes the link can be spared.

As there are only a few hundred cells, and the switches of the matrix are sorted in the "matrix control memory order", it is quite simple to generate a short piece of code to mark the faulty part. This code is made out of the matrix control memory faulty address and data, and the faulty cell number.

If the timing is faulty then the entire device is faulty. Although the I/O could be checked in the same way, it is not recommended to use the device if the I/O is faulty.

Utilization to Achieve Higher Reliability

The idea is to have a spare cell or a few spare cells in the device and to use them instead of a faulty cell. The matrix already has "spare links". For example:

If there is a host connected to the device, the above-described method can be used in an application:
1. One or several spare cells are be left out.
2. A Built-In Test program checks those free cells via a port (similar to a RAM check).
3. That cell is loaded with the task of another cell capable of assuming the same connectivity as the free cell.
4. The input of the cell is routed to the same input of the other cell.
5. The output of the cell is routed to the same output of the other cell. Now both cells are working in parallel so no collision will occur (if there is no error).
6. The other cell is routed to be a spare cell.

A matrix error may "look like" a cell error. To test it, another link path may be used. If there is no other such link, the cell is marked as "faulty". A "Cell-RAM" in time-sharing configuration can be switched off only after a full cycle.

Figure 38:
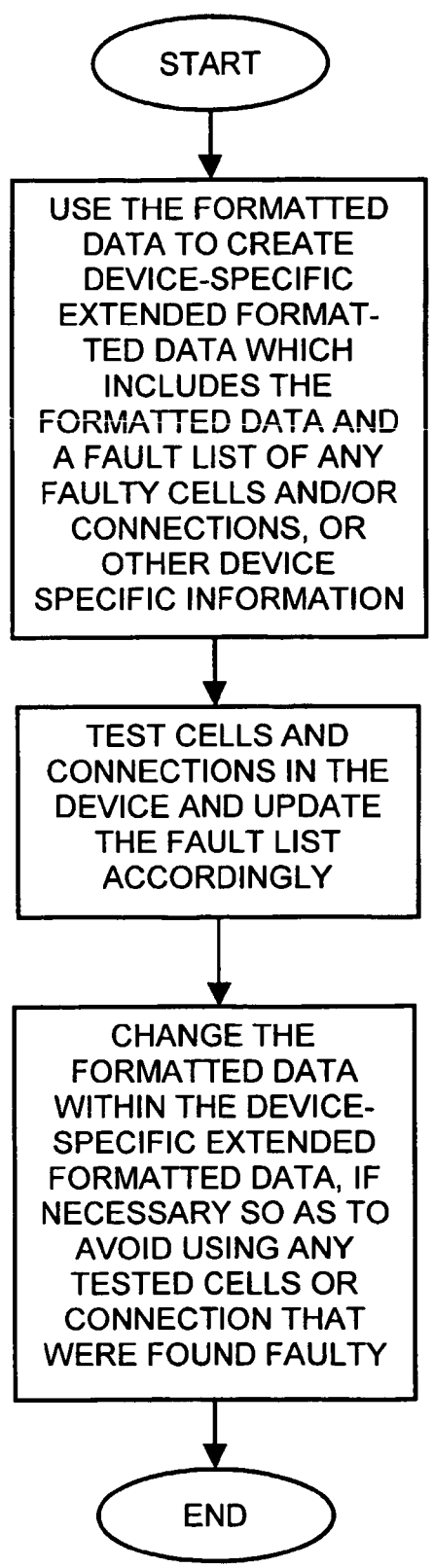
FIG. 38 is a flow diagram showing the principal operating steps used by a method for avoiding use of faulty cells in the device during implementation of an application using the device.

FIG. 38 is a flow diagram summarizing the principal operating steps associated with the above method when implementing a hardware application using the device according to the invention. Prior to downloading the formatted data to the device, the formatted data is used to create device-specific extended formatted data, which includes the formatted data and a fault list of any faulty cells and/or connections. Prior to testing, the fault list is empty. Thus, an empty fault list may indicate the absence of fault cells or connections, but may mean simply that the device has not yet been tested. The device-specific extended formatted data may include other device specific information, if required. Cells and connections in the device are tested and the fault list updated accordingly, and the formatted data within the device-specific extended formatted data is changed, if necessary, so as to avoid using any tested cells or connection that were found faulty.

Figure 39:
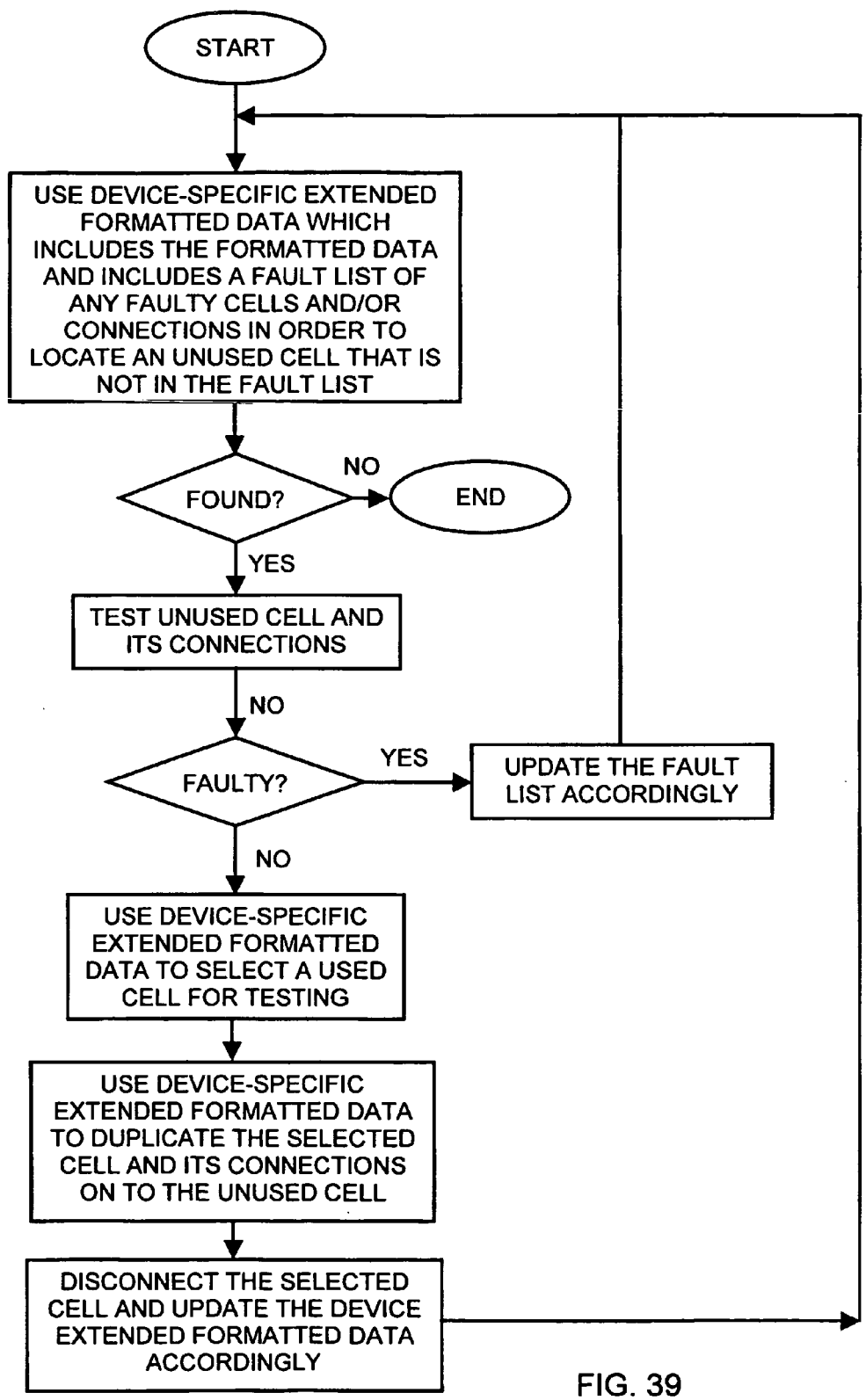
FIG. 39 is a flow diagram showing the principal operating steps used by a method for fault correction of faulty cells in the device during real-time operation of an application using the device.

FIG. 39 is a flow diagram showing the principal operating steps associated with a method for real time automatic fault detection and correction of a device according to the invention. Device-specific extended formatted data, as explained above with reference to FIG. 38, is used in order to locate an unused cell that is not in the fault list. If such an unused cell is located, then the unused cell and its connections are tested and, if the unused cell and/or any of its connections are faulty, the device-specific extended formatted data is updated and a further unused cell that is not faulty is located. When a free cell is located that is tested and found to be operational, the device-specific extended formatted data is used to select a used cell for testing, capable of assuming the same connectivity as the unused cell. The device-specific extended formatted data is used to duplicate the selected cell and its connections on to the operational free cell. The selected cell is now disconnected and the device extended formatted data is updated accordingly. By such means, the definition of the used cell to be tested is copied to a free cell that has been established as operational. As a result, the free cell now operates as the original used cell, which is now disconnected. Prior to the disconnection, both cells work in parallel but the time during which this allowed to occur is negligible. If the original cell or any of its connections were faulty, the act of copying their functionality to the free cell, will correct the fault since the free cell is known to be operational. The whole cycle may be repeated as required.

Figure 40:
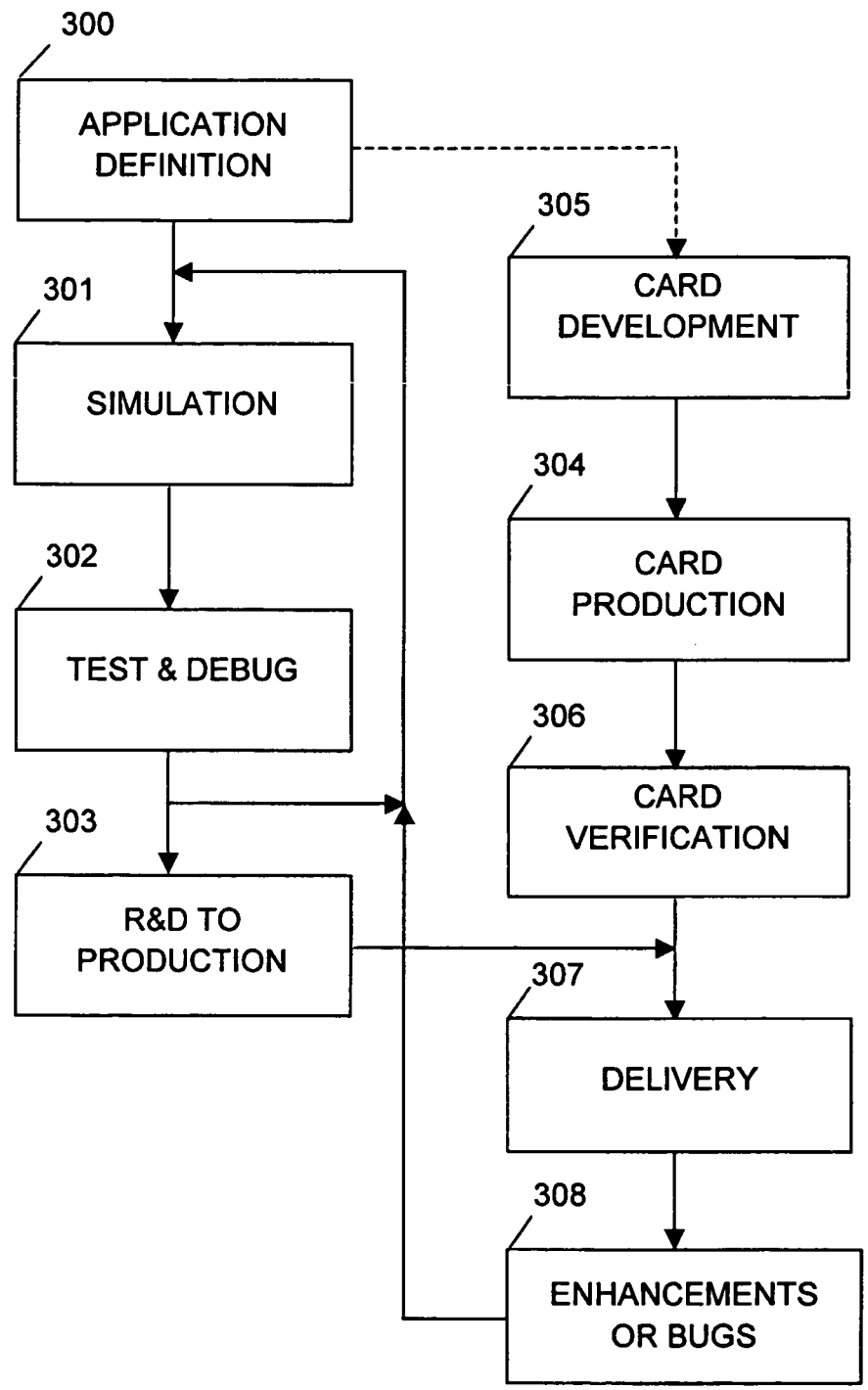
FIGS. 40 and 41 are flow diagrams showing processes according to the invention for hardware implementation of IC chips on electronic cards.

FIG. 40 is a flow diagram that summarizes the process for first time production of a circuit card bearing a hardware device according to the invention, in the absence of an available pre-designed card or when a new interface is needed. The application definition (which also is part of the card development process) will rarely influence the design since once the interface is ready, the resulting card can be used for many different applications.

Thus, application definition 300 defines the application in general terms and is followed by simulation 301. The simulation process requires the application simulation to be generated as described in detail above with reference to FIG. 33. The purpose of the simulation is to make sure the idea is feasible and to generate the code for running on the device. For example, if a device must be designed to compress voice over communication links, the compression algorithm will be written using a high level language such as "C++" or using tools supplied for this purpose as described above. If desired, these tools can be used in combination with known tools such as "Matlab" referred to above. Once the simulation is satisfactory, the code for the device is ready. The simulation is a "one-to-one" simulation, by which is meant that besides the ability to simulate the function, it simulates the exact way the code runs on the device. Therefore, if the application works on the simulator, the application will work on the board; if the application does not work on the simulator, it will not work on the board.

The "one-to-one" simulation capability derives from the device architecture that enables the creation of an exact virtual copy of the device in the computer performing the simulation. Therefore, "synthetic" or recorded "virtual" signals that enter the input of the copy of the device in the compute will generate the exact "virtual" output signals as would be produced by the device. These "virtual" signals can be manipulated and tested.

The simulator can be operated in the following modes:

Compiled mode, whereby the simulation is executed utilizing subroutines that are written in high-level language for carrying out the desired algorithm to be implemented by the cell.

Real mode, whereby the data to be stored in the cell is calculated prior to running the simulation and during the simulation is used to carry out the desired algorithm to be implemented by the cell. By such means, the number of opcodes required to effect the simulation may be greatly reduced and the simulator runs much faster.

A combination of the above. The part of the application that is under test will run in the high-level language compiled mode, while the rest is in real mode. This mode is intended to achieve the maximum speed for debugging.

Emulation mode: the simulator is accelerated by the hardware device. In the emulation mode, the simulator uses cells in the device and has abilities similar to a logic analyzer. In other words, the emulation can stop on any logic pattern or sequence and show the result of each connection inside the device on the screen. It can work in a single step as well. This is a hardware analog to the ability to trace through a software program using a debugger.

Using "In Circuit Emulation" (ICE) Mode, the emulation is combined with abilities to sample input signals. The card works in real time using the processing power of its in-circuit device.

As the simulator implements a "one-to-one" simulation, most of the test and debugging is performed in the simulation stage. Test and Debug 302 is required to test real long duration signals that may last hours or days, therefore requiring that the ICE mode be used. This impacts on the simulation speed, as explained above.

Debugging is carried out as follows part of the device is programmed to capture any logic state, typically indicative of an error whose cause is to be analyzed and corrected. At the same time, another part of the device captures successive samples of the input into a circular buffer. When an error is found, the emulation stops, and the recorded input signals that caused the error can be injected into the simulator in order to solve the problem. More than one cell may be needed to capture the input signal: at least one for the counter of the circular buffer and others for the buffer.

According to another debugging method, the virtual device on the computer generates any desired state, which is loaded into the device and the test continued from this point forward in emulation or ICE mode.

Once testing and debugging is complete, the R&D to Production stage 303 may commence. In the case of application generation processes using pre-designed, multi-purpose device-based cards, the R&D to Production process requires nothing more than delivering the device code, generated by the simulator 301, from R&D to the Production department.

Figure 41:
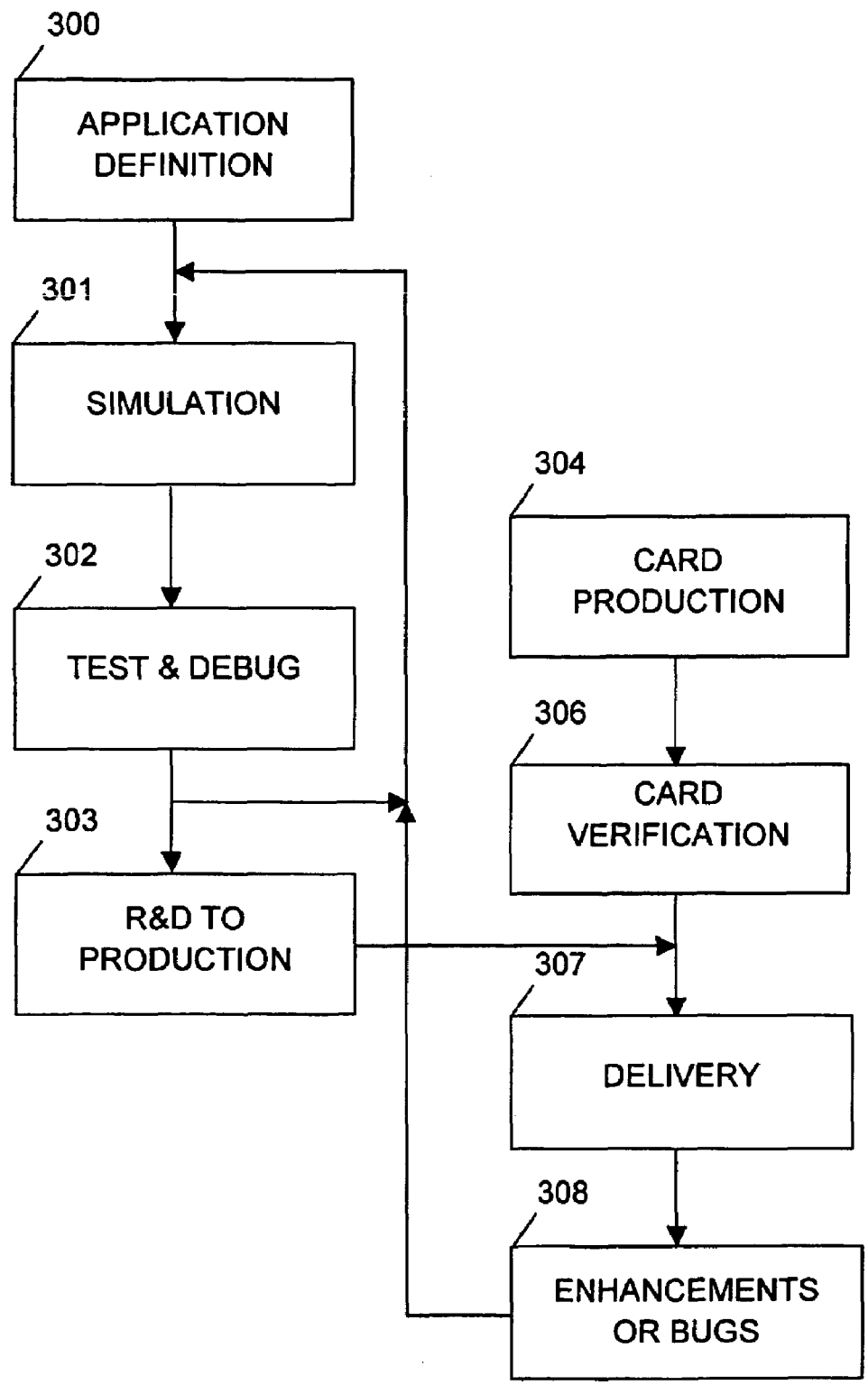

Card Production 304 follows. In the case of application generation processes using pre-designed, multi-purpose device-based cards, card production is an independent process that can start before the application is finished. This is shown schematically in FIG. 41, which is otherwise identical to FIG. 40 except for the absence in FIG. 41 of the card development process 305. Following card production 304, a verification process 306 is performed. Card verification is the process of testing the card with the electronics. The new device architecture is such that the card can be tested to assure that the application can run on it without the application code. Therefore, there is no link between the termination of the work in the R&D group and the beginning/termination of the card verification process in the Production department.

Card delivery 307 to the client can be carried out before the application is ready. At a later stage, when the application is ready, device code in the form of suitably formatted data can be sent to the customer for downloading to the device.

Any errors found after the delivery stage can be fixed using the simulation and debugging tools described above, and new code can be delivered to the customer. The Enhancements or Bugs stage 308 is shown in FIG. 40 as part of the development process, indicating that the developer can decide at which stage the product should be delivered, taking into account that changes may be made after delivery.

The development process according to the invention is a so-called "spiral" development process models as opposed to the more common "waterfall" process currently employed. The spiral model and its advantages are described for example in the web site http://www.cstp.umkc.edu/personal/cjweber/spiral.html.

Figure 1:
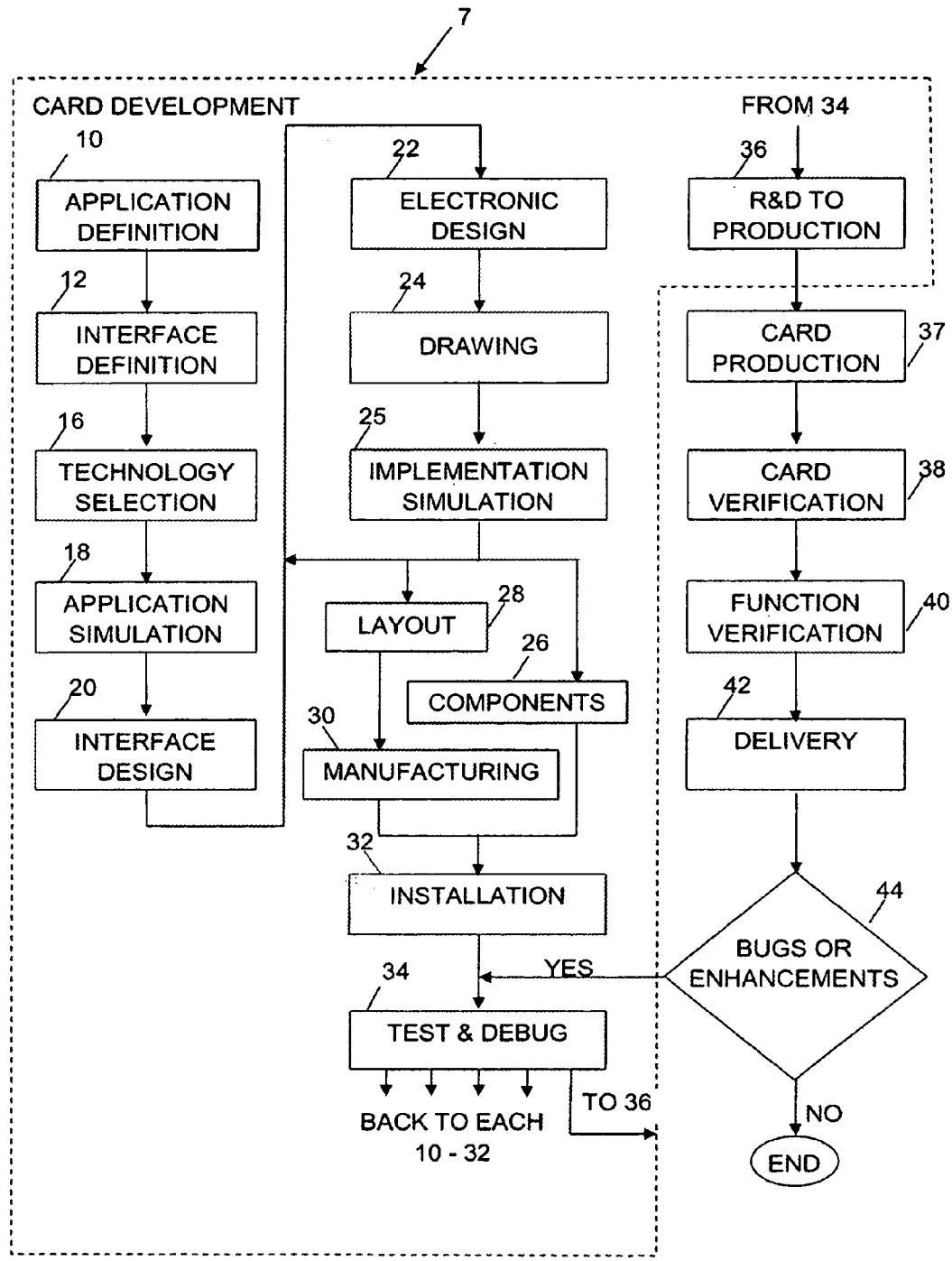
FIG. 1 is a flow diagram showing a conventional process for hardware implementation of IC chips on electronic cards.

The "card development" stage 305 shown in FIG. 40 similar to that described above with reference to FIG. 1. The only difference is that there is no application to be implemented, so the implementation is easier and takes less time. Therefore only the interface needs to be designed, and the pin-out of the device(s). In most cases, the card creation process should not influence the time to market for the following reasons:

The implementation is simple, as only the interface needs to be designed (if non-standard), the number of devices (usually one) and the pin-out. In other words Once a card is ready and the interface is fixed, a ready-made card (or ready-made card design) can be used for the new applications.

Nevertheless, if a new application is to be made with a non-standard unique interface, it is to be expected that the card manufacturing process will take longer than the implementation process, and the time-to-market saving will be reduced. Therefore, an effort should be made to prepare universal multi-purpose, off-the-shelf, ready-made cards for the known interfaces, to be ready for different applications.

The invention thus provides a highly flexible re-programmable device architecture, amenable to implementation of a vast number of different applications and allowing easy expansion and mixed architectures. Reliability and simplicity of design is assured by "one-to-one" simulation whereby identical data is used during computer simulation of an application as is downloaded to the device to implement the application. Simulation and emulation may be carried out using a common personal computer using well-known high-level programming techniques, obviating the need for expensive, special purpose workstations. As a result of the unique device architecture, the hardware design and application can be sub-divided for parallel operation as described and lends itself to a modular work-group approach. Such flexibility is enhanced by the ability to access libraries of pre-constructed construction and formatted data.

Whilst various embodiments have been described, it will be apparent to those skilled in the art that a particularly advantageous feature of the invention resides in its flexibility and method of use. Thus, the examples are illustrative only and the scope of the invention is intended to encompass all variations, which fall within the scope of the claims.

Likewise, while the invention has been described with particular regard to the design of digital electronic circuits, it will be appreciated by persons skilled in the art that the invention may also find application to create biological hardware, pneumatic hardware, mechanical hardware in which the basic components of the invention, the cells and the programmable matrices, are implemented using the appropriate technology. Therefore, in the claims, the term "hardware" is used to include electronic hardware, biological hardware, pneumatic hardware, mechanical hardware and any other hardware in which cells having data storage capability can be implemented and in which programmable matrices can be implemented.

It will also be understood that the system according to the invention may be a suitably programmed computer. Likewise, the invention contemplates a computer program being readable by a computer for executing the method of the invention. The invention further contemplates a machine-readable memory tangibly embodying a program of instructions executable by the machine for executing the method of the invention.

In the method claims that follow, alphabetic characters used to designate claim steps are provided for convenience only and do not imply any particular order of performing the steps.

The invention claimed is:

1. A universal hardware device comprising:
a first plurality of cells for storing data; and
a first programmable matrix connected to inputs and outputs of the first plurality of cells, wherein at least one cell in the first plurality of cells comprises:
a second plurality of cells for storing data; and
a second programmable matrix connected to inputs and outputs of the second plurality of cells, whereby each cell of the first plurality of cells and each cell of the second plurality of cells has an architecture similar to the whole universal hardware device, and wherein at least one cell in the second plurality of cells can be directly accessed via a port of the at least one cell in the first plurality of cells and wherein a plurality of hardware applications can be implemented by selectively storing data in the first plurality of cells and the second plurality of cells and by selectively programming the first programmable matrix to connect cells in the first plurality of cells and the second programmable matrix to connect cells in the second plurality of cells.

2. The device according to claim 1, wherein the first programmable matrix and the second programmable matrix are integral.

3. The device according to claim 1, wherein at least some of the stored data is changeable dynamically by one or more of the plurality of hardware applications during execution thereof.

4. The device according to claim 1, further including a memory for storing therein a control setting of at least one of the first programmable matrix and the second programmable matrix.

5. The device according to claim 1, further including
at least two memories, each for storing therein a respective setting of the first programmable matrix and/or the second programmable matrix, and
a controlled multiplexer for selecting between the at least two memories whereby a topology of the universal hardware device can be rapidly changed by a single control.

6. The device of claim 5, wherein at least some of the stored data is changeable dynamically by one or more of the plurality of hardware applications during execution thereof.

7. The device according to claim 1, having at least one input connected to at least one of the first programmable matrix and the second programmable matrix.

8. The device according to claim 1, having at least one output connected to at least one of the first programmable matrix and the second programmable matrix.

9. The device according to claim 1, wherein at least some of the cells in the first plurality of cells and in the second plurality of cells are synchronized by at least one clock signal each of which can be independently enabled or disabled via at least one of the first programmable matrix and the second programmable matrix.

10. The device according to claim 9, wherein the at least one clock signal is connected to at least one of the first programmable matrix and the second programmable matrix.

11. The device according to claim 1, wherein the cells in the first plurality of cells and in the second plurality of cells are connected by a pre-selected topology and are loaded with data to implement a desired hardware application.

12. The device according to claim 1, wherein at least some of the cells in the first plurality of cells and in the second plurality of cells are formed from constituent elements that are interconnected via at least one of the first programmable matrix and the second programmable matrix and which can be used independently.

13. The device of claim 1, wherein at least some of the cells in the first plurality of cells and in the second plurality of cells are synchronized by at least one clock signal each of which can be independently enabled or disabled via the at least one programmable matrix.

14. The device according to claim 1, wherein at least one of the cells in the first plurality of cells and in the second plurality of cells and the constituent elements are connected by a pre-selected topology and are loaded with data to implement a desired hardware application.

15. The device according to claim 1, wherein at least some of the cells in the first plurality of cells and in the second plurality of cells comprise:
   a random access memory (RAM) having an address bus for feeding thereto a required address so as to output on a data bus of the RAM a respective data value stored in a respective memory location of the RAM addressed thereby,
   a respective register coupled to each RAM for latching either the address bus such that an input to the register constitutes an input to the respective cell and an output of the RAM constitutes an output of the respective cell or for latching the data bus of the RAM such that an address to the RAM constitutes an input to the respective cell an output to the register constitutes an output of the respective cell, and
   auxiliary circuitry for modifying an operating characteristic of the RAM and the register;
whereby the at least some of the cells in the first plurality of cells and in the second plurality of cells at least partially operate as a lookup table.

16. The device according to claim 15, wherein at least some of the cells in the first plurality of cells and in the second plurality of cells are used to provide timesharing capability.

17. The device according to claim 16 wherein at least one of the at least some of the cells in the first plurality of cells and in the second plurality of cells are used as a timesharing counter and remaining ones of the at least some of the cells in the first plurality of cells and in the second plurality of cells are used to store an instantaneous state of a respective implementation of the device.

18. An assembly comprising:
   at least one device comprising a first plurality of cells for storing data; and
   a first programmable matrix connected to inputs and outputs of the first plurality of cells, wherein at least one cell in the first plurality of cells comprises:
      a second plurality of cells for storing data; and
      a second programmable matrix connected to inputs and outputs of the second plurality of cells, whereby each cell of the first plurality of cells and each cell of the second plurality of cells has an architecture similar to the whole device, and wherein at least one cell in the second plurality of cells can be directly accessed via a port of the at least one cell in the first plurality of cells and each of the at least one devices having an active and an inactive state, and wherein a host is coupled to the at least one device and has a memory which stores therein respective formatted data that must be loaded into each of the at least one device so as to allow the respective device to carry out a required operation when in the active state or to allow the host to load the respective device when in the inactive state and wherein a plurality of hardware applications can be implemented by selectively storing data in the first plurality of cells and the second plurality of cells and by selectively programming the first programmable matrix to connect cells in the first plurality of cells and the second programmable matrix to connect cells in the second plurality of cells.

19. The assembly according to claim 18, wherein the host comprises:
   a first plurality of cells for storing data; and
   a first programmable matrix connected to inputs and outputs of the first plurality of cells wherein at least one cell in the first plurality of cells comprises:
      a second plurality of cells for storing data; and
      a second programmable matrix connected to inputs and outputs of the second plurality of cells, whereby each cell of the first plurality of cells and of the second plurality of cells has an architecture similar to the whole universal hardware device, and wherein at least one cell in the second plurality of cells can be directly accessed via a port of the at least one cell in the first plurality of cells.

20. The assembly according to claim 18, including at least two devices wherein the host is adapted to manage at least one task by activating as many of the devices as required for carrying out the at least one task.

21. A module including at least one hardware device comprising
   a first plurality of cells for storing data; and
   a first programmable matrix connected to inputs and outputs of the first plurality of cells, wherein at least one cell in the first plurality comprises:
      a second plurality of cells for storing data; and
      a second programmable matrix connected to inputs and outputs of the second plurality of cells, whereby each cell of the first plurality of cells and of the second plurality of cells has an architecture similar to the whole hardware device, and wherein at least one cell of the second plurality of cells can be directly accessed via a port of the at least one cell in the first plurality wherein at least one of the cells in the first plurality of cells and in the second plurality of cells and constituent elements thereof are connected by a pre-selected topology and are loaded with data to implement a desired hardware application and at least one I/O interface and wherein a plurality of hardware applications can be implemented by selectively storing data in the first plurality of cells and the second plurality of cells and by selectively programming the first programmable matrix to connect cells in the first plurality of cells and the second programmable matrix to connect cells in the second plurality of cells.

22. A method for designing a hardware application for a universal hardware device comprising:
   a first plurality of cells for storing data; and
   a first programmable matrix connected to inputs and outputs of the first plurality of cells, wherein at least one cell in the first plurality of cells comprises:
      a second plurality of cells for storing data; and
      a second programmable matrix connected to inputs and outputs of the second plurality of cells, whereby each cell of the first plurality of cells and each of the second plurality of cells has an architecture similar to the whole universal hardware device, and in that at least one cell in the second plurality of cells can be directly accessed via a port of the at least one cell in the first plurality of cells and wherein a plurality of hardware applications can be implemented by selectively storing data in the first plurality of cells and the second plurality of cells cells and by selectively programming the first programmable matrix to connect in the first plurality of cells and the second programmable matrix to connect cells in the second plurality of cells, the method comprising:

(a) obtaining construction data representing a topology defining a connectivity between at least one of cells and constituent elements thereof and including data for storage therein so as to define a functionality of one or more of the plurality of hardware applications and (b) deriving formatted data from the construction data being formatted for downloading to the device.

23. The method according to claim 22, wherein step (a) includes:
(i) selecting topology, and
(ii) formulating data for storing in at least one of the cells in the first plurality of cells and in the second plurality of cells and constituent elements defined by the topology.

24. The method according to claim 22, wherein step (a) includes:
(i) accessing a library of pre-configured files each containing construction data relating to a respective functionality, and
(ii) selecting one or more of the files for realizing one or more functionalities of the application.

25. The method according to claim 22, wherein step (a) includes:
(i) running a computer simulation of one or more of the plurality of hardware applications by programming a computer to implement at least one of the at least one cell and the at least one constituent element and to implement a preconfigured topology using the construction data, and
(ii) changing the construction data and repeating step (i) as necessary until the computer simulation is satisfactory.

26. A method for obtaining construction data for a universal hardware device comprising:
a first plurality of cells for storing data; and
a first programmable matrix connected to inputs and outputs of the first plurality of cells, wherein at least one cell in the first plurality of cells comprises:
a second plurality of cells for storing data; and
a second programmable matrix connected to inputs and outputs of the second plurality of cells, whereby each cell of the first plurality of cells and of the second plurality of cells has an architecture similar to the whole universal hardware device, and in that at least one cell of the second plurality of cells can be directly accessed via a port of the at least one cell in the first plurality and wherein a plurality of hardware applications can be implemented by selectively storing data in the first plurality of cells and the second plurality of cells and by selectively programming the first programmable matrix to connect cells in the first plurality of cells and the second programmable matrix to connect cells in the second plurality of cells and representing a topology defining a connectivity between at least one of cells and constituent elements thereof and including data for storage therein so as to define a functionality of a hardware application, the method comprising:
(a) selecting the topology, and
(b) formulating data for storing in the at least one of cells and constituent elements defined by the topology.

27. The method according to claim 26, further including:
(c) adding the constructed data to a library of pre-configured files each containing construction data relating to a respective functionality.

28. The method of claim 26, further including:
(a) running a computer simulation of one or more of the plurality of hardware applications by programming a computer to implement at least one of the at least one cell and the at least one constituent element and to implement a pre-configured topology using the construction data, and
(b) changing the construction data and repeating step (a) as necessary until the computer simulation is satisfactory.

29. A method for obtaining construction data for a universal hardware device comprising:
a first plurality of cells for storing data; and
a first programmable matrix connected to inputs and outputs of the first plurality of cells, wherein at least one cell in the first plurality of cells comprises:
a second plurality of cells for storing data; and
a second programmable matrix connected to inputs and outputs of the second plurality of cells, whereby each cell of the first plurality of cells and of the second plurality of cells has an architecture similar to the whole universal hardware device, and in that at least one cell of the second plurality of cells can be directly accessed via a port of the at least one cell in the first plurality and wherein a plurality of hardware applications can be implemented by selectively storing data in the first plurality of cells and the second plurality of cells and by selectively programming the first programmable matrix to connect cells in the first plurality of cells and the second programmable matrix to connect cells in the second plurality of cells and representing a topology defining a connectivity between at least one of the cells in the first plurality of cells and in the second plurality of cells and at least one of constituent elements thereof and including data for storage therein so as to define a functionality of a hardware application, the method comprising:
(a) accessing a library of pre-configured files each containing construction data relating to a respective functionality, and
(b) selecting one or more of the files for realizing at least partial functionality of the application.

30. The method according to claim 29, further including:
(c) adding the constructed data to a library of pre-configured files each containing construction data relating to a respective functionality.

31. The method according to claim 30, wherein the library is stored remotely and the step of accessing the library is effected via a communication channel.

32. The method according to claim 30, wherein steps (b) and (c) include programming the computer using a high-level programming language.

33. The method of claim 30, wherein the library is stored remotely and the step of accessing the library is effected via a communication channel.

34. The method according to claim 29, further including:
(d) running a computer simulation of one or more of the plurality of hardware applications by programming a computer to implement at least one of the at least one cell and the at least one constituent element and to implement a pre-configured topology using the construction data, and
(e) changing the construction data and repeating step (d) as necessary until the computer simulation is satisfactory.

35. The method according to claim 34, wherein instantaneous samples of part of the simulation construction data are continuously calculated on the fly by the computer.

36. The method according to claim 34, wherein at least part of the simulation construction data is pre-configured and stored and instantaneous samples thereof are fetched as required by the computer.

37. The method of claim 34, wherein instantaneous samples of part of the simulation construction data are continuously calculated on the fly by the computer.

38. The method according to claim 29, wherein step (b) includes programming the computer using a high-level programming language.

39. The method according to claim 29, wherein at least part of the simulation construction data is pre-configured and recalled from storage.

40. The method of claim 29, wherein the library is stored remotely and the step of accessing the library is effected via a communication channel.

41. A method for implementing a hardware application, the method comprising:
(a) using a universal hardware device comprising:
a first plurality of cells for storing data; and
a first programmable matrix connected to inputs and outputs of the first plurality of cells, wherein at least one cell in the first plurality of cells comprises:
a second plurality of cells for storing data; and
a second programmable matrix connected to inputs and outputs of the second plurality of cells, whereby each cell of the first plurality of cells and of the second plurality of cells has an architecture similar to the whole universal hardware device, and in that at least one cell of the second plurality of cells can be directly accessed via a port of the at least one cell in the first plurality and wherein a plurality of hardware applications can be implemented by selectively storing data in the first plurality of cells and the second plurality of cells and by selectively programming the first programmable matrix to connect cells in the first plurality of cells and the second programmable matrix to connect cells in the second plurality of cells,
(b) obtaining formatted data that is derived from pre-determined simulation construction data and is formatted for downloading to the device, and
(c) downloading the formatted data to the device.

42. The method according to claim 41, wherein prior to performing step (b) there are included the steps of:
(i) designing one or more of the plurality of hardware applications by obtaining construction data representing a topology defining a connectivity between at least one of the cells in the first plurality of cells and in the second plurality of cells and constituent elements and including data for storage therein so as to define a functionality of one or more of the plurality of hardware applications and deriving formatted data from the construction data being formatted for downloading to the device so as to produce the simulation construction data, and
(ii) formatting the simulation construction data so as to produce the formatted data.

43. A method for simulating a hardware application implemented by a universal hardware device comprising:
a first plurality of cells for storing data; and
a first programmable matrix connected to inputs and outputs of the first plurality of cells, wherein at least one cell in the first plurality of cells comprises:
a second plurality of cells for storing data; and
a second programmable matrix connected to inputs and outputs of the second plurality of cells, whereby each cell of the first plurality of cells and of the second plurality of cells has an architecture similar to the whole universal hardware device, and in that at least one cell of the second plurality of cells can be directly accessed via a port of the at least one cell in the first plurality and wherein a plurality of hardware applications can be implemented by selectively storing data in the first plurality of cells and the second plurality of cells and by selectively programming the first programmable matrix to connect cells in the first plurality of cells and the second programmable matrix to connect cells in the second plurality of cells and wherein at least one of the cells in the first plurality of cells and in the second plurality of cells and constituent elements are connected by a pre-selected topology and are loaded with data to implement a desired hardware application and being adapted for stepwise running, the method comprising:
(a) downloading the data into at least one device in an emulation module including at least one hardware device comprising
a first plurality of cells for storing data; and
a first programmable matrix connected to inputs and outputs of the first plurality of cells, wherein at least one cell in the first plurality of cells comprises:
a second plurality of cells for storing data; and
a second programmable matrix connected to inputs and outputs of the second plurality of cells, whereby each cell of the first plurality of cells and of the second plurality of cells has an architecture similar to the whole universal hardware device, and in that at least one cell of the second plurality of cells can be directly accessed via a port of the at least one cell in the first plurality and wherein a plurality of hardware applications can be implemented by selectively storing data in the first plurality of cells and the second plurality of cells and by selectively programming the first programmable matrix to connect cells in the first plurality of cells and the second programmable matrix to connect cells in the second plurality of cells and wherein at least one of the cells in the first plurality of cells and in the second plurality of cells and the constituent elements are connected by a pre-selected topology and are loaded with data to implement a desired hardware application and at least one I/O interface,
(b) routing an input sample generated by a control unit via the at least one I/O interface to the emulation module,
(c) collecting an output sample for analysis from the emulation module via the at least one I/O interface, (d) receiving an authorization signal for authorizing input of a subsequent input sample to the emulation module, and (e) repeating steps (b) to (d), as required.

44. The method according to claim 43, wherein the control unit is a computer.

45. The method according to claim 44, wherein the computer receives the output signal for performing analysis thereof.

46. A method for stepwise running an application with a module including at least one hardware device comprising a first plurality of cells for storing data; and a first programmable matrix connected to inputs and outputs of the first plurality of cells, wherein at least one cell in the first plurality of cells comprises:

a second plurality of cells for storing data; and a second programmable matrix connected to inputs and outputs of the second plurality of cells, whereby each cell of the first plurality of cells and of the second plurality of cells has an architecture similar to the whole hardware device, and in that at least one cell of the second plurality of cells can be directly accessed via a port of the at least one cell in the first plurality and wherein a plurality of hardware applications can be implemented by selectively storing data in the first plurality of cells and the second plurality of cells and by selectively programming the first programmable matrix to connect cells in the first plurality of cells and the second programmable matrix to connect cells in the second plurality of cells and wherein at least one of the cells in the first plurality of cells and in the second plurality of cells and constituent elements are connected by a preselected topology and are loaded with data to implement a desired hardware application and at least one I/O interface, the method comprising:

(a) externally feeding a clock enable signal so as to feed the at least one clock signal to the application, and (b) internally disabling the clock enable signal so as to prevent feeding of the at least one clock signal pending override by the application.

47. A method for testing a device included within a module including at least one hardware device comprising a first plurality of cells for storing data; and a first programmable matrix connected to inputs and outputs of the first plurality of cells, wherein at least one cell in the first plurality of cells comprises:

a second plurality of cells for storing data; and a second programmable matrix connected to inputs and outputs of the second plurality of cells, whereby each cell of the first plurality of cells and of the second plurality of cells has an architecture similar to the whole hardware device, and in that at least one cell of the second plurality of cells can be directly accessed via a port of the at least one cell in the first plurality and wherein a plurality of hardware applications can be implemented by selectively storing data in the first plurality of cells and the second plurality of cells and by selectively programming the first programmable matrix to connect cells in the first plurality of cells and the second programmable matrix to connect cells in the second plurality of cells and wherein at least one of the cells in the first plurality of cells and in the second plurality of cells and constituent elements are connected by a preselected topology and are loaded with data to implement a desired hardware application and at least one I/O interface, the method comprising the steps of:

(a) connecting at least one of the interfaces of the module under test to control unit, (b) configuring the device under test to port out samples at specific points of the device via at least one of the interfaces, (c) storing the samples in the control unit so as to obtain in real time a history of samples of the device, (d) using the control unit to analyze at least a subset of most recent samples, (e) if necessary arresting operation of the device under test so as to allow:

(i) examination of the history of samples of the device, (ii) examination of the instantaneous current state of the arrested device, (iii) download of a different state to the arrested device, (iv) continuation of the real time operation of the device, and (v) restarting real time operation of the device.

48. The method according to claim 47, wherein the control unit is a computer having coupled thereto via the at least one I/O interface.

49. A method for designing an application-specific hardware device comprising:

a first plurality of cells for storing data; and a first programmable matrix connected to inputs and outputs of the first plurality of cells, wherein at least one cell in the first plurality of cells comprises:

a second plurality of cells for storing data; and a second programmable matrix connected to inputs and outputs of the second plurality of cells, whereby each cell of the first plurality of cells and of the second plurality of cells has an architecture similar to the whole hardware device, and in that at least one cell of the second plurality of cells can be directly accessed via a port of the at least one cell in the first plurality and wherein a plurality of hardware applications can be implemented by selectively storing data in the first plurality of cells and the second plurality of cells and by selectively programming the first programmable matrix to connect cells in the first plurality of cells and the second programmable matrix to connect cells in the second plurality of cells and having a desired functionality, the method comprising:

(a) obtaining formatted data which in conjunction with the device defines a device architecture that realizes the desired functionality, (b) replacing at least one of the first programmable matrix and the second programmable matrix of the device architecture by fixed connections that realize the connectivity of at least one of the first programmable matrix and the second programmable matrix, and (c) replacing storage elements in at least some of the cells in the first plurality of cells and in the second plurality of cells in the device architecture by respective fixed drive levels for realizing the data stored therein;

whereby the architecture is rendered suitable for direct implementation of the application-specific hardware device.

50. A method for designing a hardware device comprising:
- a first plurality of cells for storing data; and
- a first programmable matrix connected to inputs and outputs of the first plurality of cells, wherein at least one cell in the first plurality of cells comprises:
- a second plurality of cells for storing data; and
- a second programmable matrix connected to inputs and outputs of the second plurality of cells, whereby each cell of the first plurality of cells and of the second plurality of cells has an architecture similar to the whole hardware device, and in that at least one cell of the second plurality of cells can be directly accessed via a port of the at least one cell in the first plurality and wherein a plurality of hardware applications can be implemented by selectively storing data in the first plurality of cells and the second plurality of cells and by selectively programming the first programmable matrix to connect cells in the first plurality of cells and the second programmable matrix to connect cells in the second plurality of cells and having a desired functionality part of which is fixedly implemented by an application-specific hardware device and part of which is re-programmable, the method comprising:
  - (a) obtaining formatted data which in conjunction with the device defines a device architecture that realizes the desired functionality,
  - (b) replacing a part of at least one of the first programmable matrix and the second programmable matrix of the device architecture by fixed connections that realize the connectivity of part of at least one of the first programmable matrix and the second programmable matrix, and
  - replacing some storage elements in at least some of the cells in the first plurality of cells and in the second plurality of cells in the device architecture by respective fixed drive levels for realizing the data stored therein.

51. The method according to claim 50, wherein prior to downloading the formatted data to a device comprising:
- a first plurality of cells for storing data; and
- a first programmable matrix connected to inputs and outputs of the first plurality of cells, wherein at least one cell in the first plurality of cells comprises:
- a second plurality of cells for storing data; and
- a second programmable matrix connected to inputs and outputs of the second plurality of cells, whereby each cell of the first plurality of cells and of the second plurality of cells has an architecture similar to the whole universal hardware device, and in that at least one cell of the second plurality of cells can be directly accessed via a port of the at least one cell in the first plurality and wherein a plurality of hardware applications can be implemented by selectively storing data in the first plurality of cells and the second plurality of cells and by selectively programming the first programmable matrix to connect cells in the first plurality of cells and the second programmable matrix to connect cells in the second plurality of cells and wherein at least one of the cells in the first plurality of cells and in the second plurality of cells and the constituent elements are connected by a pre-selected topology and are loaded with data to implement a desired hardware application there are further included the steps of:
  - (i) using the formatted data to create device-specific extended formatted data which includes the formatted data and a fault list of any faulty cells or connections,
  - (ii) testing cells and connections in the device and updating the fault list accordingly, and
  - (iii) changing the formatted data within the device-specific extended formatted data, if necessary so as to avoid using any tested cells or connection that were found faulty.

52. A method for real time automatic fault detection and correction of a device comprising:
- a first plurality of cells for storing data; and
- a first programmable matrix connected to inputs and outputs of the first plurality of cells, wherein at least one cell in the first plurality of cells comprises:
- a second plurality of cells for storing data; and
- a second programmable matrix connected to inputs and outputs of the second plurality of cells, whereby each cell of the first plurality of cells and of the second plurality of cells has an architecture similar to the whole device, and in that at least one cell of the second plurality of cells can be directly accessed via a port of the at least one cell in the first plurality and wherein a plurality of hardware applications can be implemented by selectively storing data in the first plurality of cells and the second plurality of cells and by selectively programming the first programmable matrix to connect cells in the first plurality of cells and the second programmable matrix to connect cells in the second plurality of cells and wherein at least one of the cells in the first plurality of cells and in the second plurality of cells and constituent elements are connected by a pre-selected topology and are loaded with data to implement a desired hardware application, the method comprising:
  - (a) using device-specific extended formatted data which includes the formatted data and includes a fault list of any faulty cells or connections in order to locate an unused cell that is not in the fault list, and if such an unused cell is located:
  - (b) testing the unused cell and its connections,
  - (c) if at least one of the unused cell and any of its connections are faulty, updating the device-specific extended formatted data and repeating from step (a) until an unused cell that is not faulty is located,
  - (d) using the device-specific extended formatted data to select a used cell for testing,
  - (e) using the device-specific extended formatted data to duplicate the selected cell and its connections on to the unused cell,
  - (f) disconnecting the selected cell and updating the device extended formatted data accordingly, and
  - (g) repeating from step (a) as required.

53. A program storage device readable by machine, tangibly embodying a program of instructions executable by the machine to perform method steps for designing a hardware application to be implemented using a device or a module including the device and at least one I/O interface, wherein:
the device comprises:
- a first plurality of cells for storing data; and
- a first programmable matrix connected to inputs and outputs of the first plurality of cells;

wherein
at least one cell in the first plurality of cells comprises a second plurality of cells for storing data; and a second programmable matrix connected to inputs and outputs of the second plurality of cells, whereby each cell of the first plurality of cells and of the second plurality of cells has an architecture similar to the whole device, and wherein at least one cell of the second plurality of cells can be directly accessed via a port of the at least one cell in the first plurality of cells and wherein a plurality of hardware applications can be implemented by selectively storing data in the first plurality of cells and the second plurality of cells and by selectively programming the first programmable matrix to connect cells in the first plurality of cells and the second programmable matrix to connect cells in the second plurality of cells; and the method comprises:

(a) obtaining construction data representing a topology defining a connectivity between at least one of the cells in the first plurality of cells and in the second plurality of cells and constituent elements and including data for storage therein so as to define a functionality of the one or more of the plurality of hardware applications and (b) deriving formatted data from the construction data being formatted for downloading to the device.

54. A computer program product comprising a computer useable medium having computer readable program code embodied therein for designing a hardware application to be implemented using a universal hardware device comprising:

a first plurality of cells for storing data; and a first programmable matrix connected to inputs and outputs of the first plurality of cells, wherein at least one cell in the first plurality of cells comprises:

a second plurality of cells for storing data; and a second programmable matrix connected to inputs and outputs of the second plurality of cells, whereby each cell of the first plurality of cells and of the second plurality of cells has an architecture similar to the whole universal hardware device, and in that at least one cell of the second plurality of cells can be directly accessed via a port of the at least one cell in the first plurality and wherein a plurality of hardware applications can be implemented by selectively storing data in the first and second pluralities of cells and by selectively programming the first programmable matrix to connect cells in the first plurality of cells and the second programmable matrix to connect cells in the second plurality of cells and at least one I/O interface, the computer program product comprising:

computer readable program code for causing the computer to obtain construction data representing a topology defining a connectivity between at least one of the cells and constituent elements and including data for storage therein so as to define a functionality of the hardware application, and computer readable program code for causing the computer to derive formatted data from the construction data being formatted for downloading to the device.

* * * * *